United States Patent
Osame et al.

(10) Patent No.: US 7,554,854 B2
(45) Date of Patent: Jun. 30, 2009

(54) METHOD FOR DELETING DATA FROM NAND TYPE NONVOLATILE MEMORY

(75) Inventors: Mitsuaki Osame, Kanagawa (JP); Hiroyuki Miyake, Kanagawa (JP); Aya Miyazaki, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 142 days.

(21) Appl. No.: 11/716,672

(22) Filed: Mar. 12, 2007

(65) Prior Publication Data

US 2007/0230254 A1 Oct. 4, 2007

(30) Foreign Application Priority Data

Mar. 31, 2006 (JP) ............................. 2006-101219

(51) Int. Cl.
*G11C 16/04* (2006.01)
(52) U.S. Cl. ............................. 365/185.29; 365/185.17; 365/185.18
(58) Field of Classification Search ............ 365/185.29, 365/185.17, 185.18, 185.23, 185.27; 257/314–316
See application file for complete search history.

(56) References Cited

U.S. PATENT DOCUMENTS

| | | | |
|---|---|---|---|
| 6,417,538 B1 | 7/2002 | Choi | |
| 6,556,475 B2 | 4/2003 | Yamazaki et al. | |
| 6,768,680 B2 | 7/2004 | Kato | |
| 6,937,513 B1 | 8/2005 | Desai et al. | |
| 6,996,003 B2 | 2/2006 | Li et al. | |
| 6,996,011 B2 | 2/2006 | Yeh et al. | |
| 7,095,656 B2 | 8/2006 | Lee | |
| 7,200,049 B2 * | 4/2007 | Park et al. | 365/185.29 |

FOREIGN PATENT DOCUMENTS

JP  2000-58685  2/2000

* cited by examiner

*Primary Examiner*—David Lam
(74) *Attorney, Agent, or Firm*—Eric J. Robinson; Robinson Intellectual Property Law Office, P.C.

(57) ABSTRACT

To provide a method of releasing charges which have been injected into charge accumulating layers of nonvolatile memory elements without using a substrate terminal such as a p well or an n well, as a method for deleting data from a NAND-type nonvolatile memory. In the method for deleting data from the NAND-type nonvolatile memory, charges stored in a charge accumulating layer of a first nonvolatile memory element are released by applying a first potential to a bit line and a source line, a second potential to a control gate of the first nonvolatile memory element, and a third potential which is different from the second potential to a control gate of a second nonvolatile memory element.

22 Claims, 31 Drawing Sheets

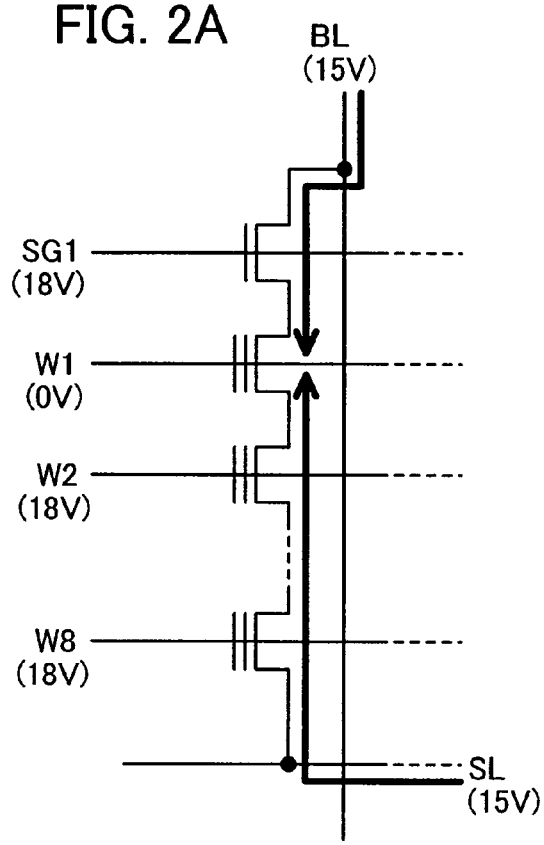
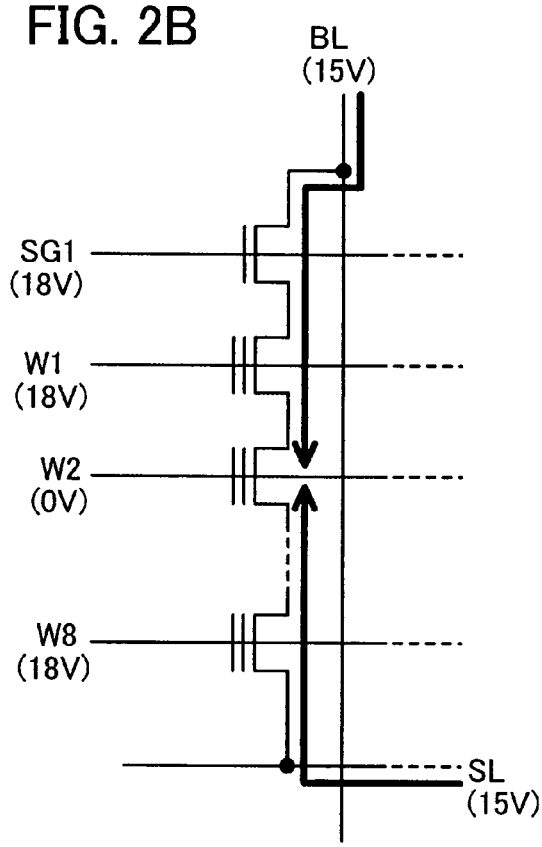
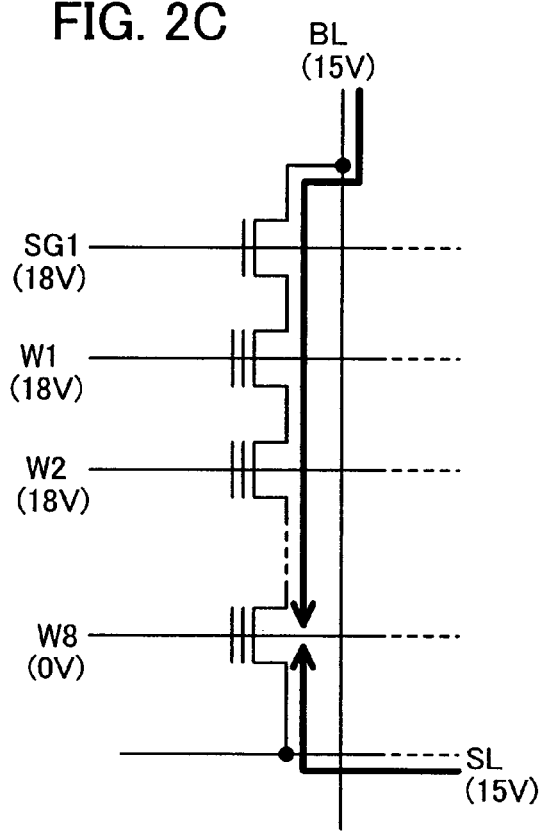

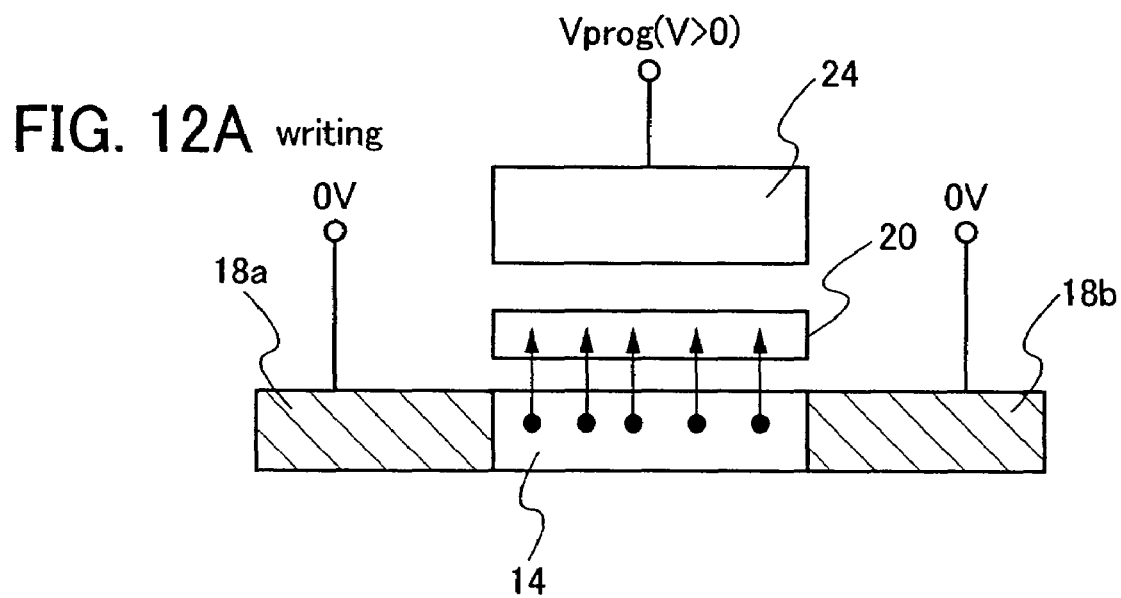
FIG. 12A writing
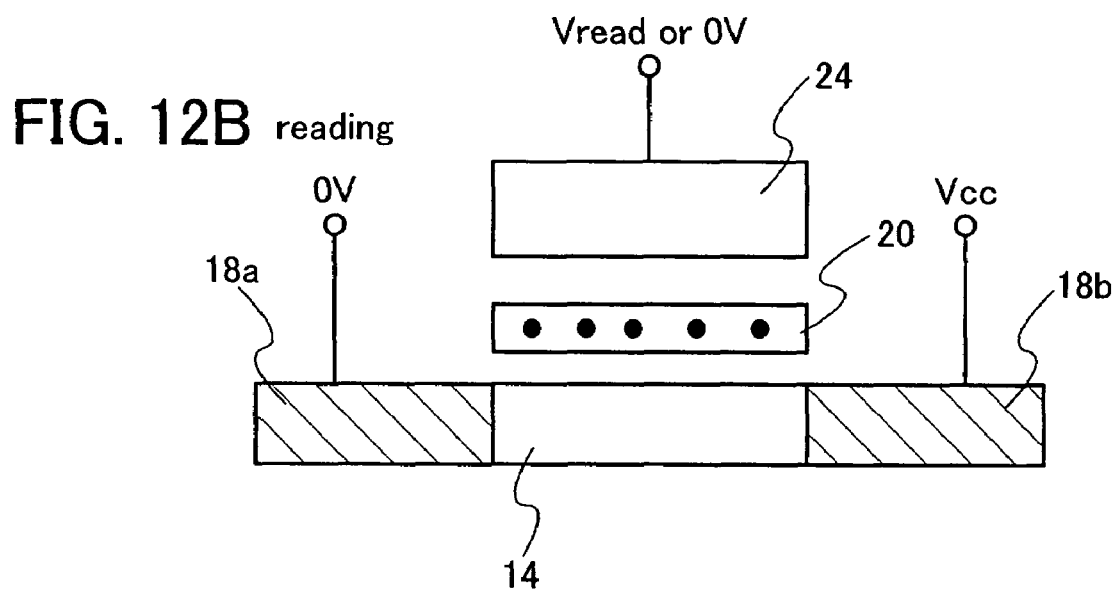
FIG. 12B reading

FIG. 18A "0" writing
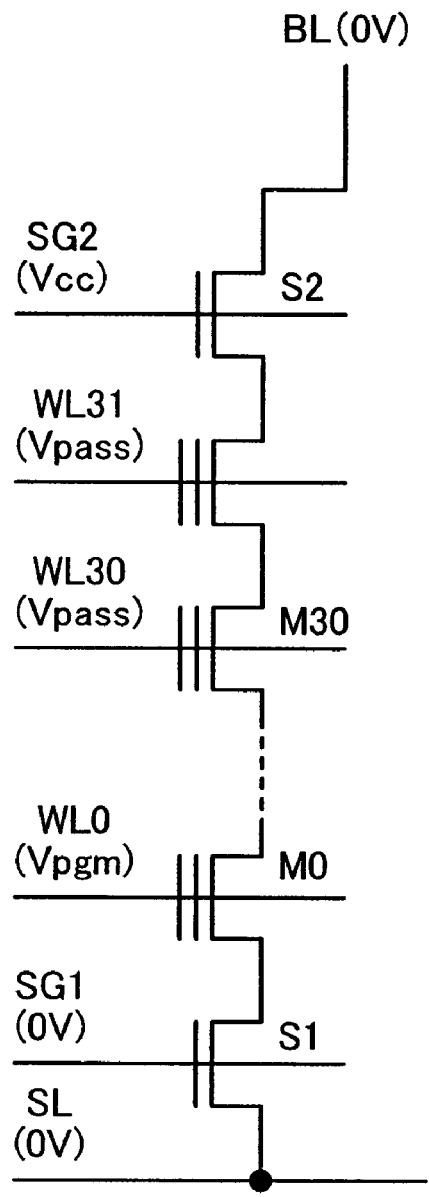
FIG. 18B "1" writing
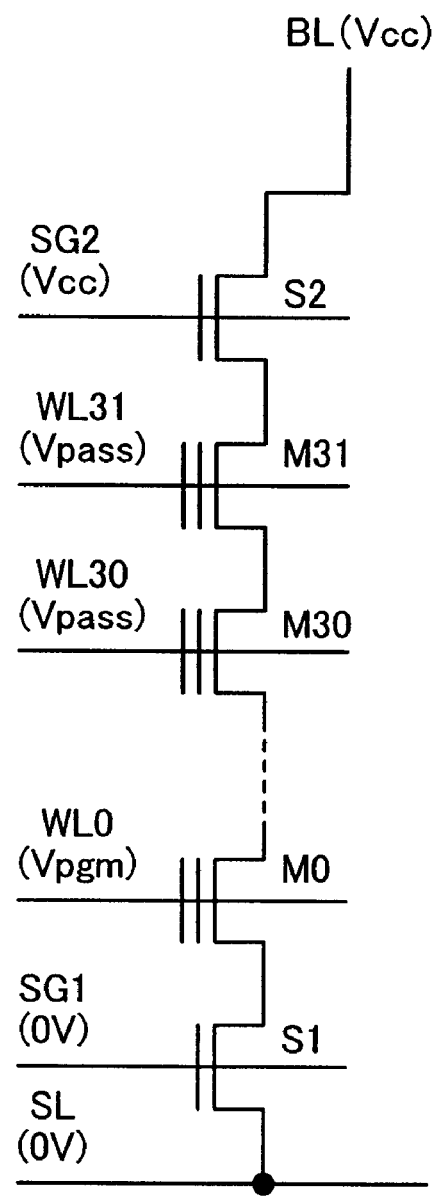

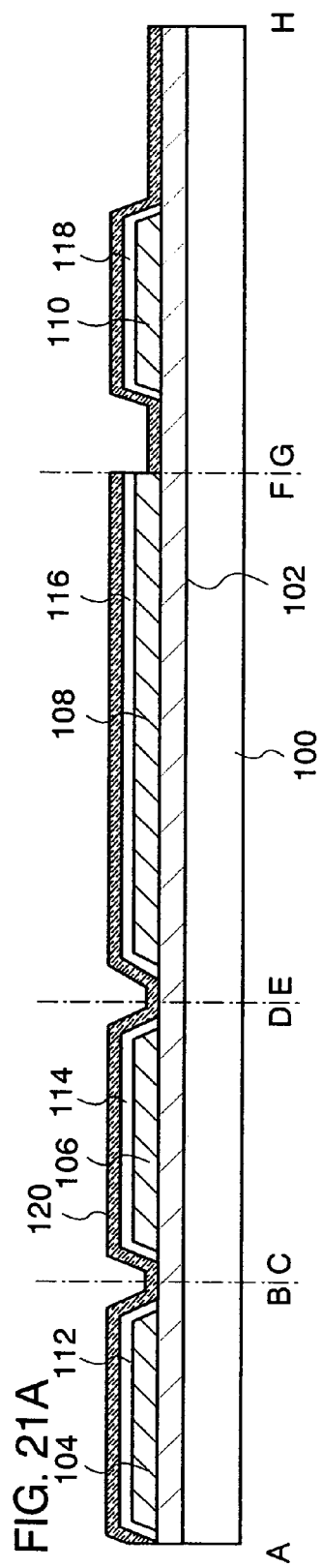
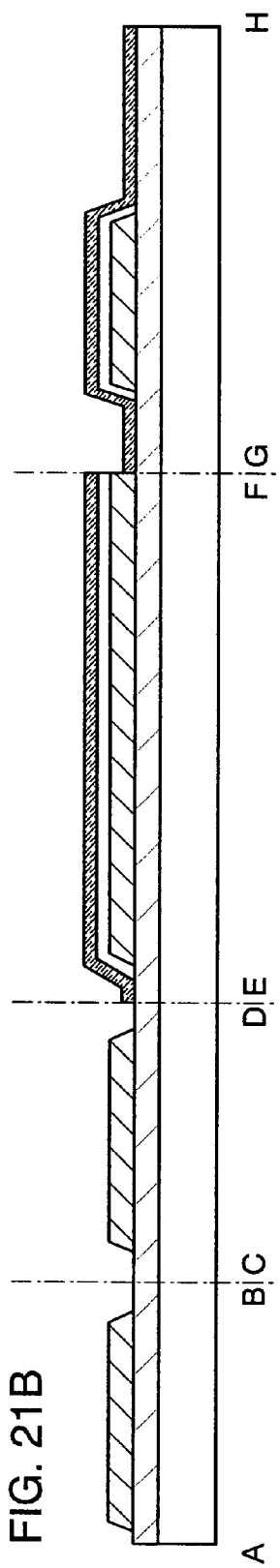
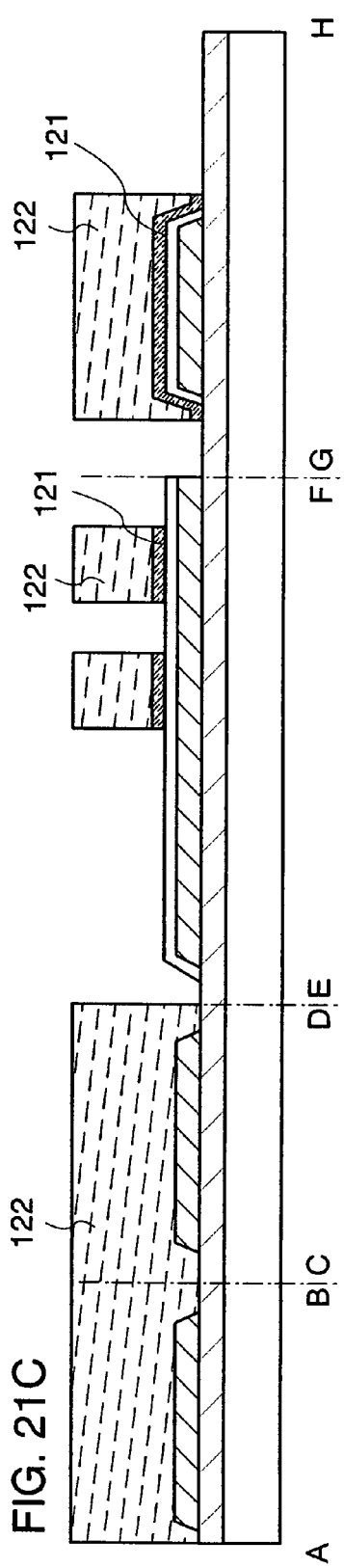

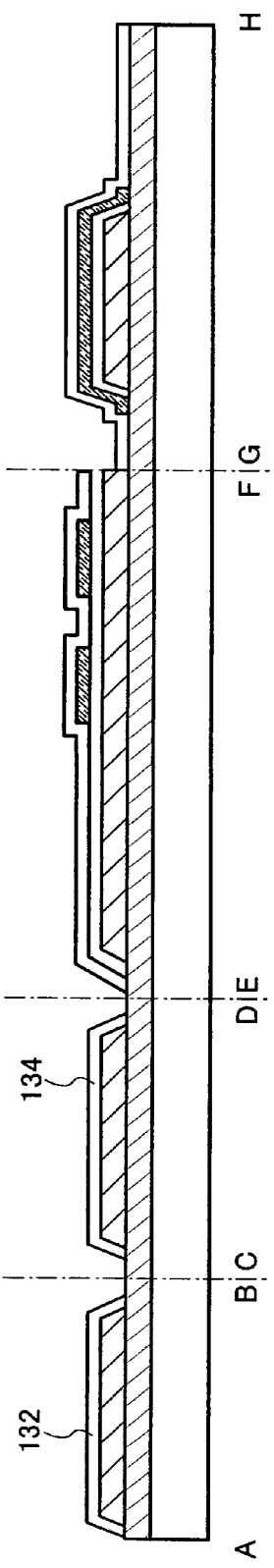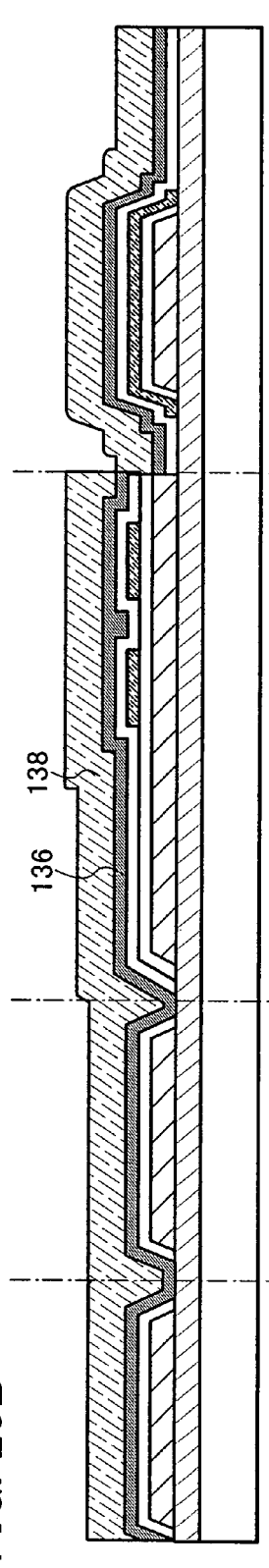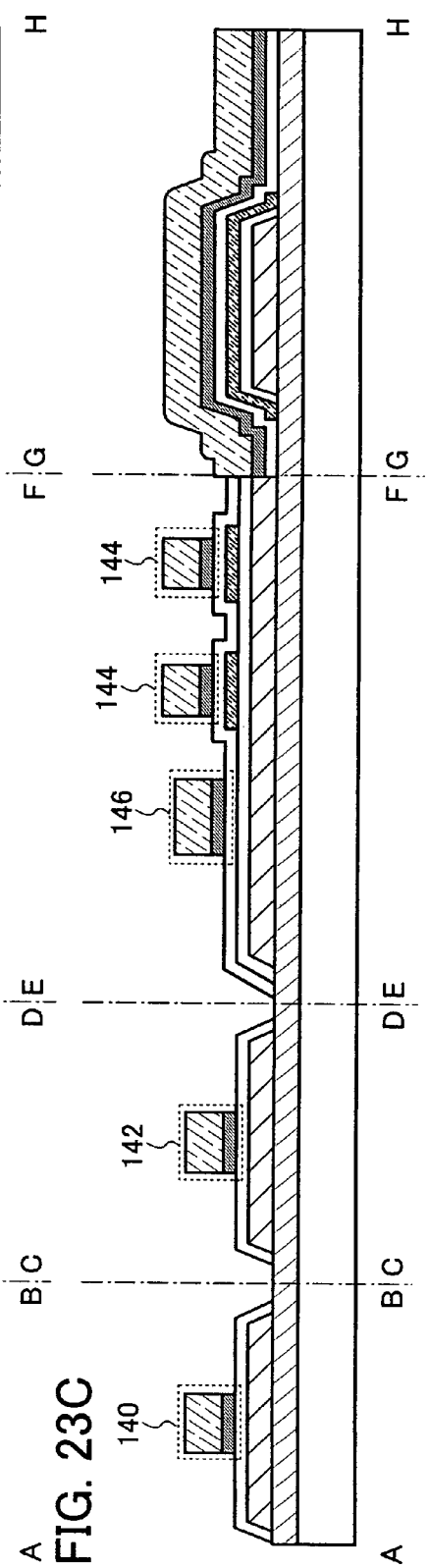

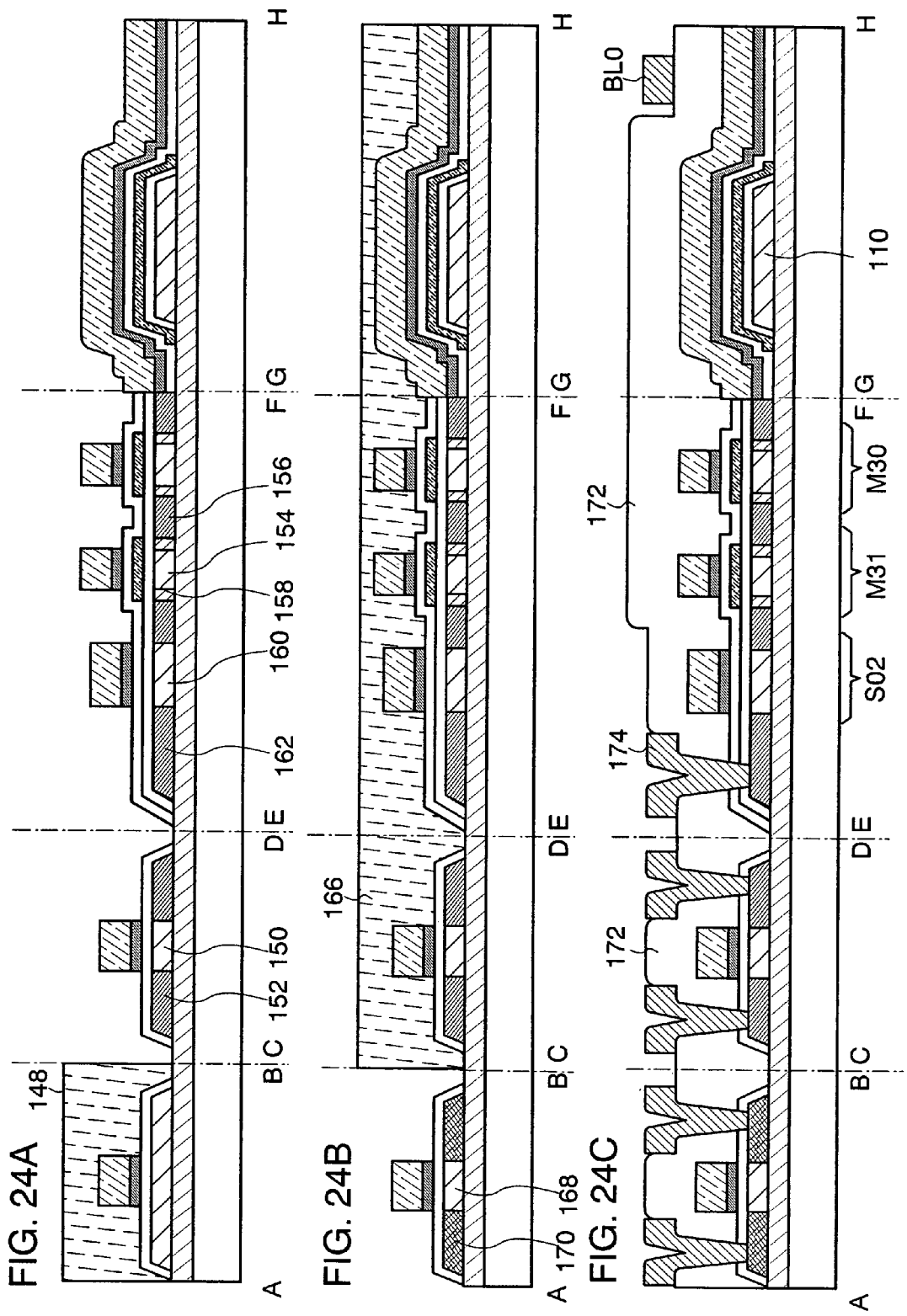

FIG. 25
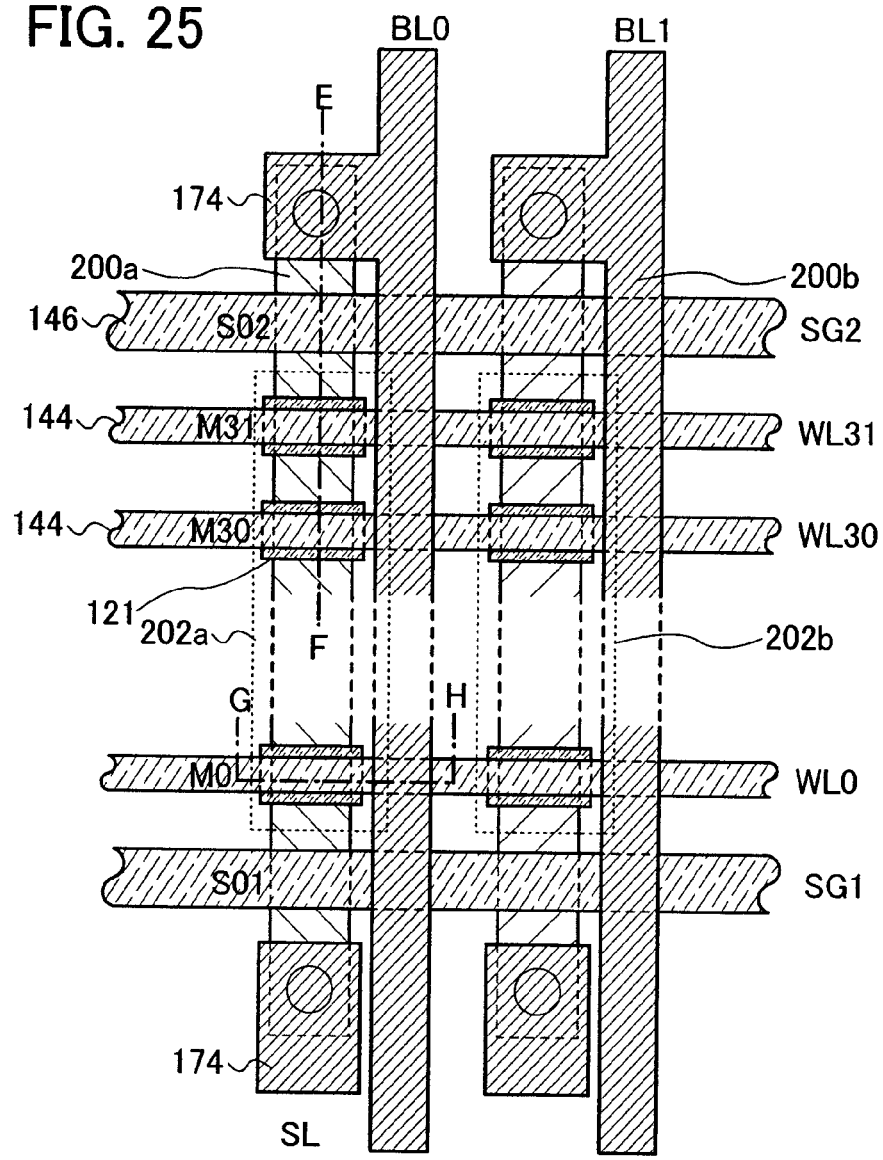
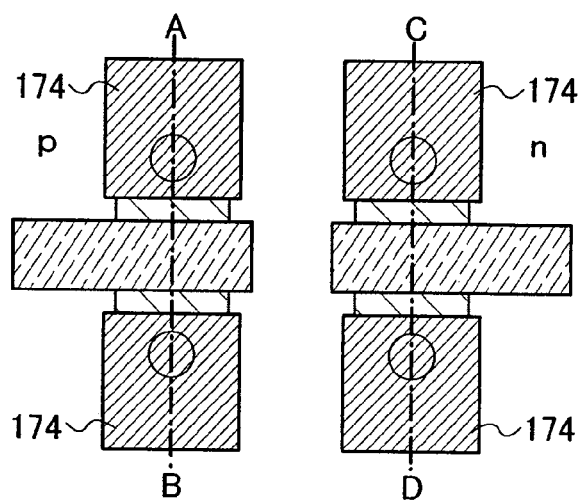

FIG. 26
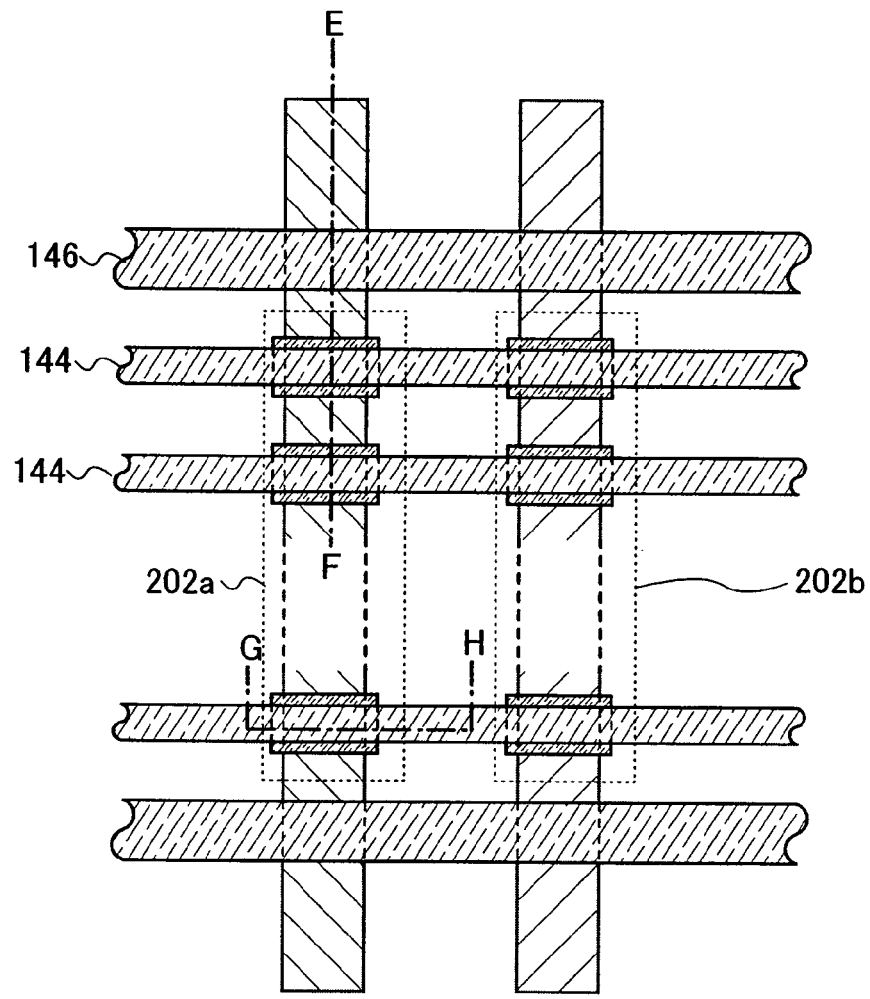
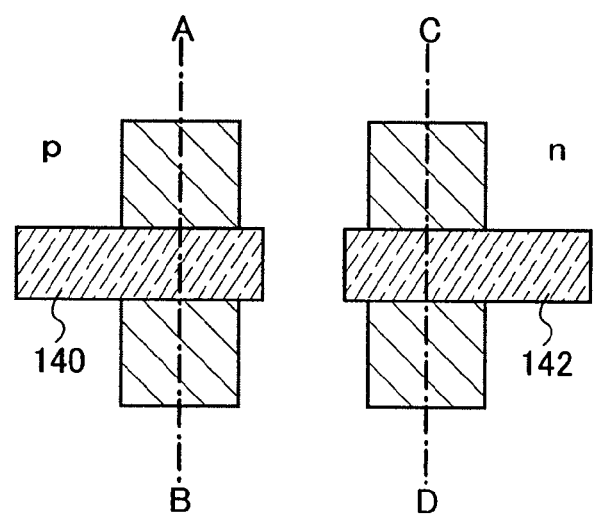

FIG. 27
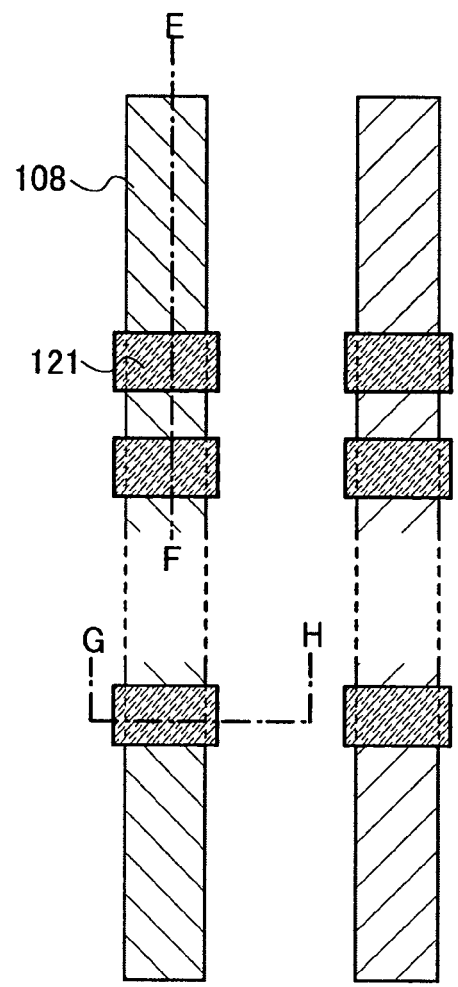
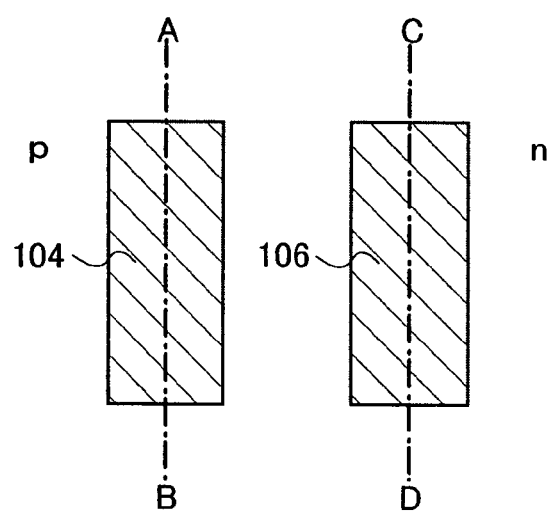

3002 — nonvolatile memory element portion
3001 — logic portion

METHOD FOR DELETING DATA FROM NAND TYPE NONVOLATILE MEMORY

BACKGROUND OF THE INVENTION

1. Field of the Invention

The present invention relates to a method for deleting data from a NAND-type nonvolatile memory in a nonvolatile semiconductor memory device. In particular, the present invention relates to a method for deleting data from a NAND-type nonvolatile memory in a nonvolatile semiconductor memory device, the data of which is electrically rewritable and erasable (a nonvolatile memory or an EEPROM (Electrically Erasable and Programmable Read Only Memory)). The nonvolatile semiconductor memory device includes, for example, EEPROMs, flash memories, and the like, the data of which is electrically erasable per bit.

2. Description of the Related Art

The market of nonvolatile memories, the data of which is electrically rewritable and can be retained even after the power is turned off, has been expanding. A nonvolatile memory is similar in structure to a MOSFET (Metal Oxide Semiconductor Field Effect Transistor), and has a region capable of accumulating electric charges for a long time, over a channel formation region. Since such a charge accumulating region is formed on an insulating layer and electrically insulated from surrounding regions, the charge accumulating region is also called a floating gate. A control gate is provided over the floating gate with an insulating layer interposed therebetween.

In a so-called floating-gate nonvolatile memory having the above structure, charges are accumulated in or released from the floating gate by a voltage applied to the control gate. That is, by injecting or releasing charges into/from the floating gate, data can be stored in or deleted from the memory. Specifically, the injection and releasing of charges into/from the floating gate are conducted by applying a high voltage between the channel formation region of a semiconductor substrate and the control gate. At this time, it is considered that Fowler-Nordheim (F-N) tunnel current or thermoelectrons flow through the insulating layer on the channel formation region. Therefore, the insulating layer is also called a tunnel insulating layer.

The floating-gate nonvolatile memory is required to have a characteristic that the memory can retain charges stored in the floating gate for at least 10 years in order to ensure reliability. Therefore, the tunnel insulating layer is required to have a thickness enough for tunnel current to flow therethrough and also have a high insulating property so that charges will not leak from the layer.

The floating gate which is formed on the tunnel insulating layer is made from silicon, which is the same semiconductor material as that of the semiconductor which forms the channel formation region. For example, a method of forming a floating gate using polysilicon is widely known, and for example, a polysilicon film which is formed to a thickness of 400 nm is known (see Reference 1: Japanese Published Patent Application No. 2000-58685.

A nonvolatile memory having such a floating gate (hereinafter also referred to as a charge accumulating layer in this specification), the data of which is rewritable by injecting or releasing charges into/from the charge accumulating layer, is called an EEPROM. In addition, the operation of releasing charges which have once been injected into the charge accumulating layer of the nonvolatile memory is called an operation of deleting data from the nonvolatile memory. A nonvolatile memory, which employs a bulk deletion method where data is electrically deleted all at once by releasing charges of the charge accumulating layers of all nonvolatile memory elements in one memory cell, is called a flash memory.

Typical cell structures of a nonvolatile memory which is a flash memory are categorized as a NOR-type nonvolatile memory or a NAND-type nonvolatile memory. Both the nonvolatile memories employ the bulk deletion operation. FIG. 30 shows an exemplary structure of a general NAND-type nonvolatile memory. In FIG. 30, an n-type single crystalline silicon substrate is used for the substrate, and a p well 3001 of a peripheral circuit portion (also called a logic portion) and a p well 3002 of a memory cell (also called a nonvolatile memory element portion) are formed separately.

Accordingly, when conducting the bulk deletion operation for the nonvolatile memory, the control gates of all nonvolatile memory elements are set at the same potential, and a positive voltage which is higher than the voltage of the control gates is applied to the p-well terminal of the memory cell until charges of the floating gates are sufficiently released.

SUMMARY OF THE INVENTION

However, when a method of applying a voltage to a p well or an n well of the memory cell is used to release charges of the charge accumulating layers of the nonvolatile memory elements, data deletion can only be conducted per p well or n well. Furthermore, since the potential of the p well or n well is largely changed only when deleting data, there have been problems such as malfunction of a capacitively-coupled portion, fluctuations in the threshold voltage of transistors, fluctuations in the threshold voltage of the nonvolatile memory elements, and the like.

In view of the foregoing, it is an object of the present invention to provide a method of releasing charges which have been injected into charge accumulating layers of nonvolatile memory elements without using a substrate terminal such as a p well or an n well, as a method for deleting data from a high-capacity NAND-type nonvolatile memory.

In order to solve the above problems, the present invention provides a method for deleting data from a NAND-type nonvolatile memory which includes first and second nonvolatile memory elements connected in series, and one of terminals of the nonvolatile memory is connected to a bit line through a selection transistor, while the other terminal thereof is connected to a source line. In the data deletion method, charges stored in a charge accumulating layer of the first nonvolatile memory element are released by applying a first potential to the bit line and the source line, a second potential to a control gate of the first nonvolatile memory element, and third potential which is different from the second potential to a control gate of the second nonvolatile memory element. In addition, charges stored in the charge accumulating layer of the first nonvolatile memory element are released by applying a first potential to a source terminal and a drain terminal of the first nonvolatile memory element, a second potential to the control gate of the first nonvolatile memory element, and a third potential which is different from the second potential to a control gate of the second nonvolatile memory element. Specific structures of the present invention are described below.

One aspect of the present invention is a method for deleting data from a NAND-type nonvolatile memory, which includes a bit line, a source line, a NAND-type cell including first and second nonvolatile memory elements connected in series, and a selection transistor. Each of the first and second nonvolatile memory elements includes a semiconductor film, a charge accumulating layer formed over the semiconductor film with a tunnel insulating film interposed therebetween, and a control gate formed over the charge accumulating layer with an insulating film interposed therebetween. One of terminals of the NAND-type cell is connected to the bit line through the selection transistor, and the other terminal of the NAND-type cell is connected to the source line. The data deletion method includes the step of releasing a charge stored in the charge accumulating layer of the first nonvolatile memory element, by applying a first potential to the bit line and the source line, a second potential to the control gate of the first nonvolatile memory element, and a third potential which is different from the second potential to the control gate of the second nonvolatile memory element.

One aspect of the present invention is a method for deleting data from a NAND-type nonvolatile memory, which includes a bit line, a source line, a NAND-type cell including first and second nonvolatile memory elements connected in series, and a selection transistor. Each of the first and second nonvolatile memory elements includes a semiconductor film, a charge accumulating layer formed over the semiconductor film with a tunnel insulating film interposed therebetween, and a control gate formed over the charge accumulating layer with an insulating film interposed therebetween. One of terminals of the NAND-type cell is connected to the bit line through the selection transistor, and the other terminal of the NAND-type cell is connected to the source line. The data deletion method includes the step of releasing a charge stored in the charge accumulating layer of the first nonvolatile memory element, by applying a first potential to a source terminal and a drain terminal of the first nonvolatile memory element, a second potential to the control gate of the first nonvolatile memory element, and a third potential which is different from the second potential to the control gate of the second nonvolatile memory element.

One aspect of the present invention is a method for deleting data from a NAND-type nonvolatile memory, which includes a bit line, a source line, a first NAND-type cell including first and second nonvolatile memory elements connected in series, a second NAND-type cell including third and fourth nonvolatile memory elements connected in series, a first selection transistor, and a second selection transistor. Each of the first, second, third, and fourth nonvolatile memory elements includes a semiconductor film, a charge accumulating layer formed over the semiconductor film with a tunnel insulating film interposed therebetween, and a control gate formed over the charge accumulating layer with an insulating film interposed therebetween. One of terminals of the first NAND-type cell is connected to the bit line through the first selection transistor, and the other terminal of the first NAND-type cell is connected to the source line. One of terminals of the second NAND-type cell is connected to the bit line through the second selection transistor, and the other terminal of the second NAND-type cell is connected to the source line. The data deletion method includes the step of releasing charges stored in the charge accumulating layers of the first and third nonvolatile memory elements, by applying a first potential to the bit line and the source line, a second potential to the control gates of the first and third nonvolatile memory elements, a third potential which is different from the second potential to the control gates of the second and fourth nonvolatile memory elements.

One aspect of the present invention is a method for deleting data from a NAND-type nonvolatile memory, which includes a bit line, a source line, a first NAND-type cell including first and second nonvolatile memory elements connected in series, a second NAND-type cell including third and fourth nonvolatile memory elements connected in series, a first selection transistor, and a second selection transistor. Each of the first, second, third, and fourth nonvolatile memory elements includes a semiconductor film, a charge accumulating layer formed over the semiconductor film with a tunnel insulating film interposed therebetween, and a control gate formed over the charge accumulating layer with an insulating film interposed therebetween. One of terminals of the first NAND-type cell is connected to the bit line through the first selection transistor, and the other terminal of the first NAND-type cell is connected to the source line. One of terminals of the second NAND-type cell is connected to the bit line through the second selection transistor, and the other terminal of the second NAND-type cell is connected to the source line. The data deletion method includes the step of releasing charges stored in the charge accumulating layers of the first and third nonvolatile memory elements, by applying a first potential to source terminals and drain terminals of the first and third nonvolatile memory elements, a second potential to the control gates of the first and third nonvolatile memory elements, and third potential which is different from the second potential to the control gates of the second and fourth nonvolatile memory elements.

In the present invention, the step of releasing the charges stored in the charge accumulating layers may be conducted by releasing charges stored in the charge accumulating layers of the nonvolatile memory elements included in the first NAND-type cell and the second NAND-type cell, which correspond to the word lines of the same bit.

In the present invention, the charge accumulating layer may be formed from a material containing germanium.

Alternatively, in the present invention, the charge accumulating layer may be formed from a material containing a nitride including silicon and germanium.

By using the method for deleting data from a NAND-type nonvolatile memory of the present invention, it is possible to sequentially delete data from nonvolatile memory elements which are included in a NAND-type cell one by one. Therefore, there is no need to isolate p-well portions (or n-well portions) of a logic portion and a memory cell in order to release charges in the charge accumulating layers of the nonvolatile memory elements which are included in the NAND-type cell. Therefore, cost reduction can be achieved.

In addition, with regard to the operation of releasing charges in the charge accumulating layers of nonvolatile memory elements which are included in a plurality of NAND-type cells, it is possible to concurrently release charges in the charge accumulating layers of the nonvolatile memory elements which are included in the plurality of NAND-type cells, the control gates of which are connected to word lines corresponding to the same bit, by using a signal from a decoder circuit. That is, it is possible to concurrently delete data from the nonvolatile memory elements included in the plurality of NAND-type cells.

BRIEF DESCRIPTION OF THE DRAWINGS

In the accompanying drawings:

FIGS. 2A to 2C are circuit diagrams which illustrate the method for deleting data of the present invention;

FIGS. 12A and 12B illustrate a nonvolatile memory used in the present invention;

FIGS. 18A and 18B are circuit diagrams of a nonvolatile memory used in the present invention;

FIGS. 21A to 21C are cross-sectional views of a nonvolatile memory cell used in the present invention;

FIGS. 23A to 23C are cross-sectional views of a nonvolatile memory cell used in the present invention;

FIGS. 24A to 24C are cross-sectional views of a nonvolatile memory cell used in the present invention;

FIG. 25 is a top view of a nonvolatile memory cell used in the present invention;

FIG. 26 is a top view of a nonvolatile memory cell used in the present invention;

FIG. 27 is a top view of a nonvolatile memory cell used in the present invention;

DETAILED DESCRIPTION OF THE INVENTION

Figure 1:
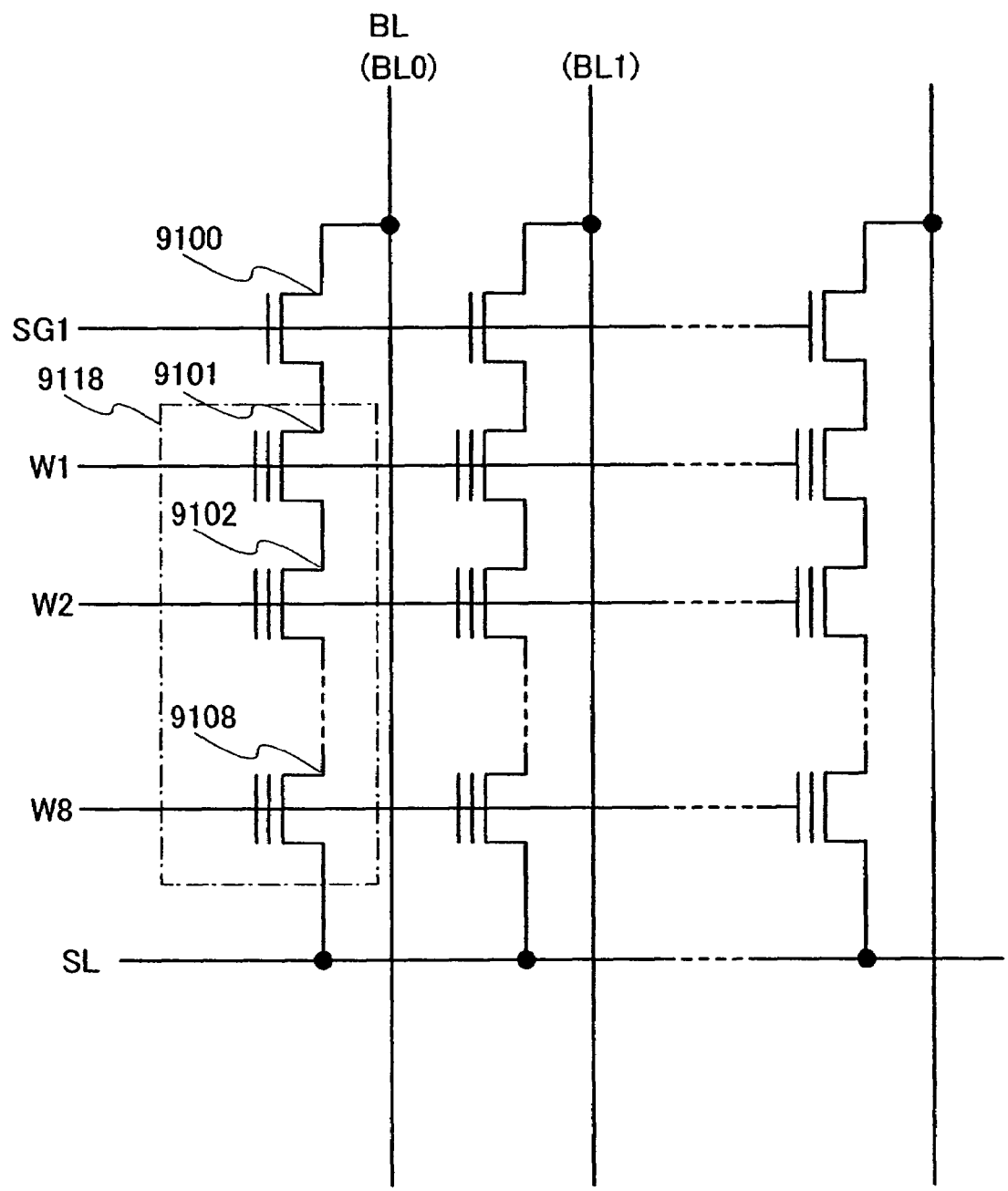
FIG. 1 is a circuit diagram which illustrates the structure of the present invention.

Embodiment modes and embodiments of the present invention will be described in detail below with reference to the accompanying drawings. Note that the present invention can be implemented in various different ways, and it will be easily understood by those skilled in the art that various changes and modifications can be made without departing from the spirit and scope of the present invention. Therefore, the present invention should not be construed as being limited to the description in the embodiment modes and embodiments. Note that like reference numerals are used to designate portions which are identical in different drawings for illustrating the embodiment modes and embodiments. Thus, repetitive description will be omitted.

Embodiment Mode 1

Hereinafter, a method for deleting data from a nonvolatile memory in accordance with the present invention will be described. FIG. 1 shows a part of a cell array of a NAND-type flash memory. This embodiment mode describes the operation of releasing charges in a charge accumulating layer of a nonvolatile memory element, i.e., the operation of deleting data from the nonvolatile memory element, which is the feature of the present invention.

Note that in the NAND-type flash memory, a cell array is connected to a data I/O bit line through a selection transistor, so that a high-capacity memory is realized. In this embodiment mode, description will be made with reference to a NAND-type nonvolatile memory which includes 8-bit nonvolatile memory elements connected in series, and the 8-bit nonvolatile memory elements will be collectively called a NAND-type cell.

As shown in FIG. 1, a NAND-type cell 9118 includes nonvolatile memory elements 9101 to 9108 which are connected in series between a bit line BL and a source line SL. A selection gate line SG1 is connected to the gate of a selection transistor 9100, and word lines W1 to W8 are connected to the control gates of the nonvolatile memory elements 9101 to 9108, respectively. The selection transistor 9100 may also be arranged inside the NAND-type cell 9118 as well.

Note that in this embodiment mode, description will be made on the assumption that the conductivity types of the nonvolatile memory elements included in the NAND-type cell and the selection transistor are all n-channel type. However, the conductivity types of the nonvolatile memory elements included in the NAND-type cell and the selection transistor may be p-channel type.

Next, a method for deleting data from the nonvolatile memory element of the present invention is described with reference to FIGS. 2A to 2C which exemplarily show a specific potential of each wiring. Note that, as a specific example, it is assumed that data of the nonvolatile memory element can be deleted by setting the voltage of the source terminal and the drain terminal at a sufficiently higher value (15 V) than the voltage of the gate terminal. In addition, regardless of whether or not charges have been accumulated in the charge accumulating layer of the nonvolatile memory element, it is assumed that the source and drain terminals can be electrically connected if the voltage of the gate terminal is higher than the source terminal by at least 3 V. Similarly, as for the selection transistor, the source and drain terminals can be electrically connected if the voltage of the gate terminal is higher than the source terminal by at least 3 V. Note that the potential of each wiring is only exemplary, and therefore, it may be a potential which turns on or off each transistor or each nonvolatile memory element.

First, referring to FIG. 2A, an example is described where data of the nonvolatile memory element 9101 connected to the word line W1 is deleted by releasing charges in the charge accumulating layer of the nonvolatile memory element 9101. In FIG. 2A, the bit line BL and the source line SL are set at V1 (15 V); only the word line W1 is set at V2 (0 V); and the word lines W2 to W8 and the selection gate line SG1 are set at V3 (18 V). Accordingly, the nonvolatile memory elements 9102 to 9108 and the selection transistor 9100 are turned on, and the source-drain voltage of the nonvolatile memory element 9101 becomes V1 (15 V). Note that in FIG. 2A, an example of a potential flow when a potential of each wiring is input is schematically shown by using arrows. In FIG. 2A, the source voltage relative to the control gate and the drain voltage relative to the control gate of the nonvolatile memory element 9101 are V1-V2 (15 V). Thus, charges in the charge accumulating layer of the nonvolatile memory element 9101 can be released and data can be deleted.

Next, referring to FIG. 2B, an example is described where data of the nonvolatile memory element 9102 which is connected to the word line W2 is deleted by releasing charges in the charge accumulating layer of the nonvolatile memory element 9102. In FIG. 2B, the bit line BL and the source line SL are set at V1 (15 V); only the word line W2 is set at V2 (0 V); and the selection gate line SG1, the word line W1, and the word lines W3 to W8 are set at V3 (18 V). Accordingly, the nonvolatile memory element 9101, the nonvolatile memory elements 9103 to 9108, and the selection transistor 9100 are turned on, and the source-drain voltage of the nonvolatile memory element 9102 becomes V1 (15 V). Note that in FIG. 2B, an example of a potential flow when a potential of each wiring is input is schematically shown by using arrows. In FIG. 2B, the source voltage relative to the control gate and the drain voltage relative to the control gate of the nonvolatile memory element 9102 are V1-V2 (15 V). Thus, charges in the charge accumulating layer of the nonvolatile memory element 9102 can be released and data can be deleted.

When deleting data from the nonvolatile memory elements 9103 to 9107 which are connected to the word lines W3 to W7, respectively, data is sequentially deleted one by one in the same way as for the nonvolatile memory elements 9101 and 9102. That is, when deleting data from one of the nonvolatile memory elements, the other nonvolatile memory elements included in the same NAND-type cell and the selection transistor are turned on, so that appropriate potentials are applied to the gate, source, and drain terminals of the nonvolatile memory element whose data is to be deleted.

Next, referring to FIG. 2C, an example is described where data of the nonvolatile memory element 9108 which is connected to the word line W8 is deleted by releasing charges in the charge accumulating layer of the nonvolatile memory element 9108. In FIG. 2C, the bit line BL and the source line SL are set at V1 (15 V); only the word line W8 is set at V2 (0 V); and the selection gate line SG1 and the word lines W1 to W7 are set at V3 (18 V). Accordingly, the nonvolatile memory elements 9101 and 9107 and the selection transistor 9100 are turned on, and the source-drain voltage of the nonvolatile memory elements 9108 becomes V1 (15 V). Note that in FIG. 2C, an example of a potential flow when a potential of each wiring is input is schematically shown by using arrows. In FIG. 2C, the source voltage relative to the control gate and the drain voltage relative to the control gate of the nonvolatile memory element 9108 are V1-V2 (15 V). Thus, charges in the charge accumulating layer of the nonvolatile memory element 9108 can be released and data can be deleted. As a result, charges in the charge accumulating layers of the nonvolatile memory elements 9101 to 9108 are released, and all data in the NAND-type cell can be deleted.

Figure 3:
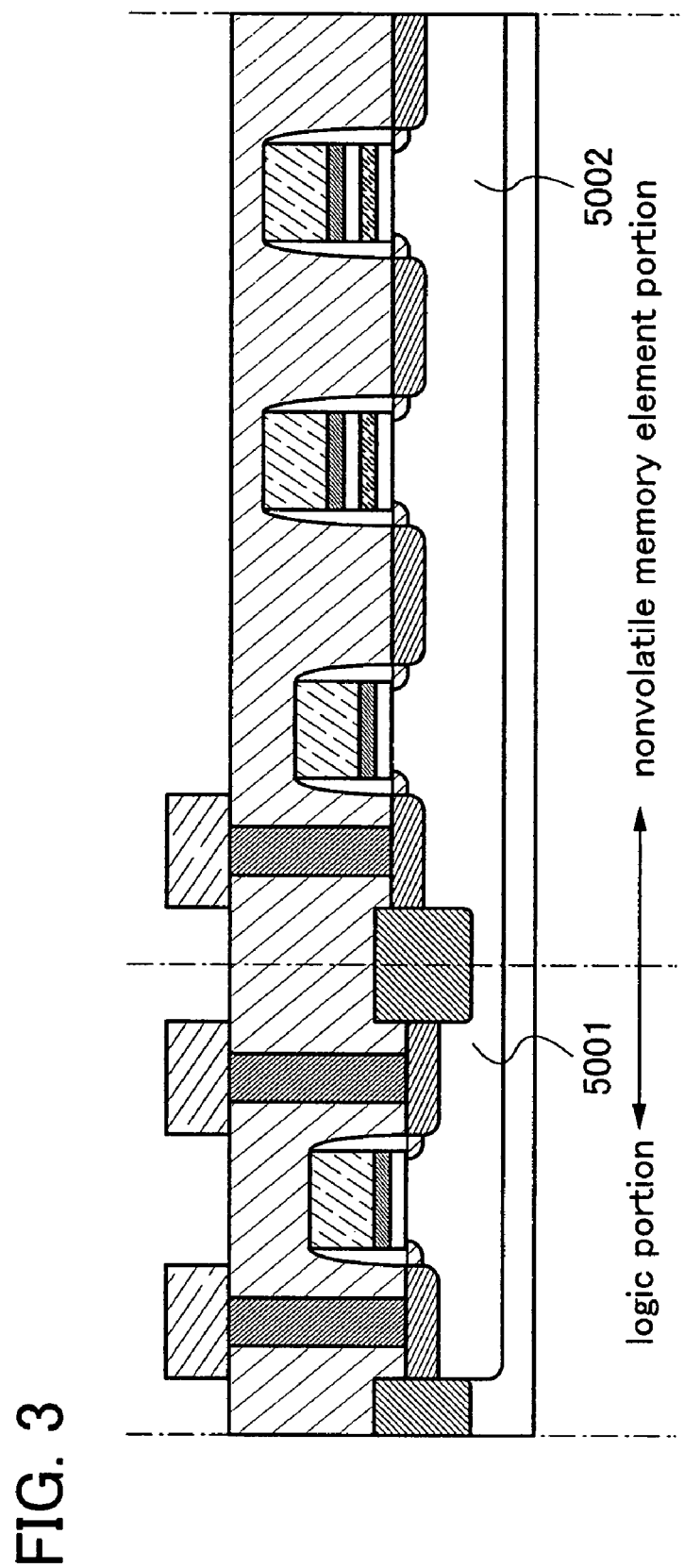
FIG. 3 illustrates the advantage of the method for deleting data of the present invention.

By using the above method for deleting data from the NAND-type nonvolatile memory, the data of the nonvolatile memory elements included in the NAND-type cell can be sequentially deleted one by one. Therefore, it is possible as shown in FIG. 3 to concurrently form a p well 5001 of a logic portion which drives the nonvolatile memory cell, and a p well 5002 of the nonvolatile memory cell. That is, there is no need to isolate the substrate in separately forming the p well of the logic portion and the p well of the memory cell. Furthermore, cost reduction of the nonvolatile semiconductor memory device having the nonvolatile memory elements can be achieved.

Note that this embodiment mode can be freely implemented in combination with any of the other embodiment modes or embodiments in this specification.

Embodiment Mode 2

Embodiment Mode 2 will describe a method for deleting data from a nonvolatile memory, in the case where data of nonvolatile memory elements included in a plurality of NAND-type cells which do not share word lines can be deleted by releasing charges in the charge accumulating layers of the nonvolatile memory elements. In this embodiment mode, description is made of an exemplary method for deleting data from a nonvolatile memory, where data of 8-bit NAND-type cells can be deleted by conducting the sequential deletion method described in Embodiment Mode 1 eight times, and releasing charges in the charge accumulating layers of the nonvolatile memory elements which are included in the plurality of NAND-type cells.

Figure 4:
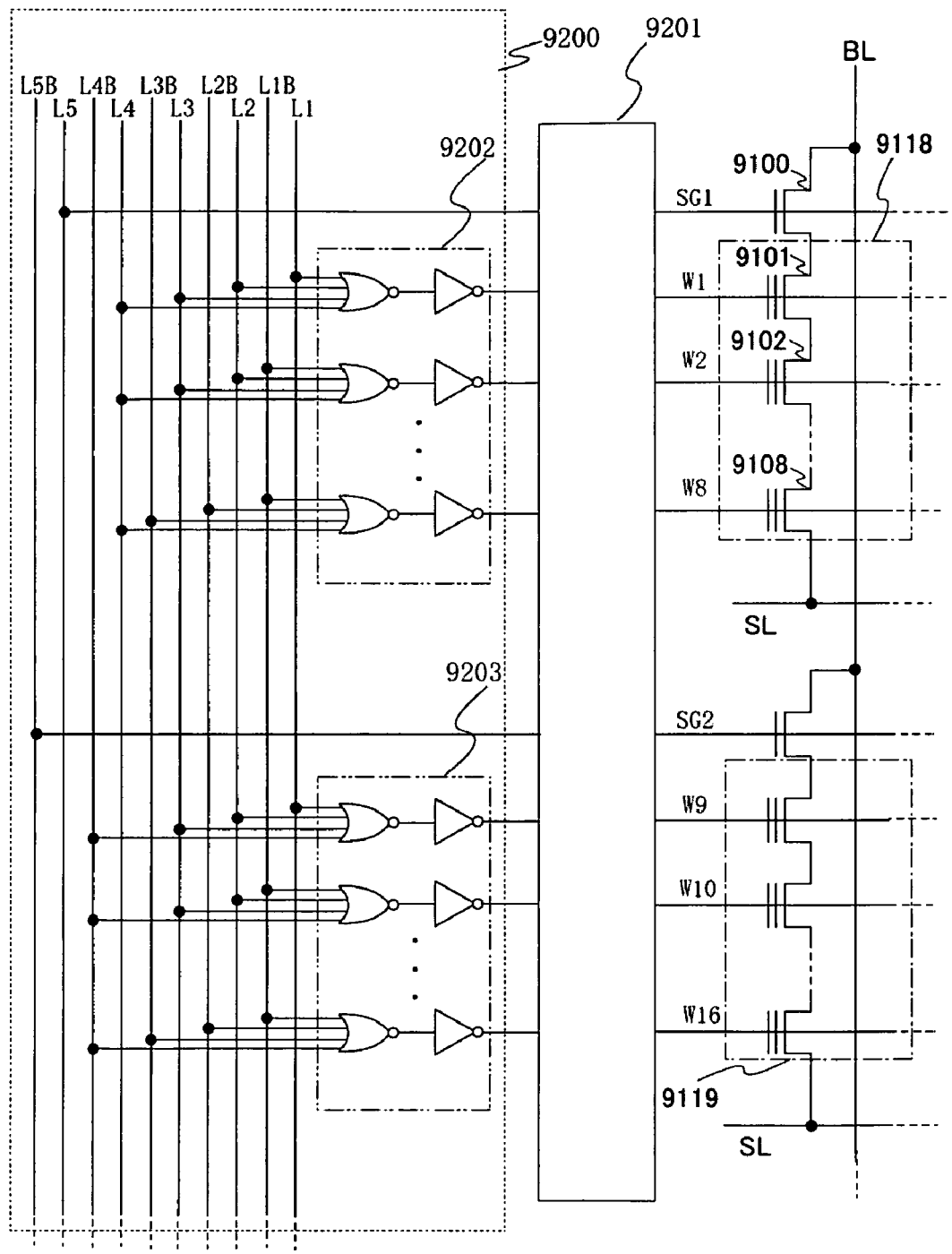
FIG. 4 illustrates the structure of a decoder in accordance with the method for deleting data of the present invention.

FIG. 4 shows an example of a row driver which controls word lines and selection gate lines. The row driver in FIG. 4 includes a decoder 9200 and a voltage converter circuit 9201. In FIG. 4, signals input to the word lines are signals L1 to L4 and their inverted signals L1B to L4B. In addition, signals input to the selection gate lines are signals L5 and its inverted signal L5B.

Figure 5:
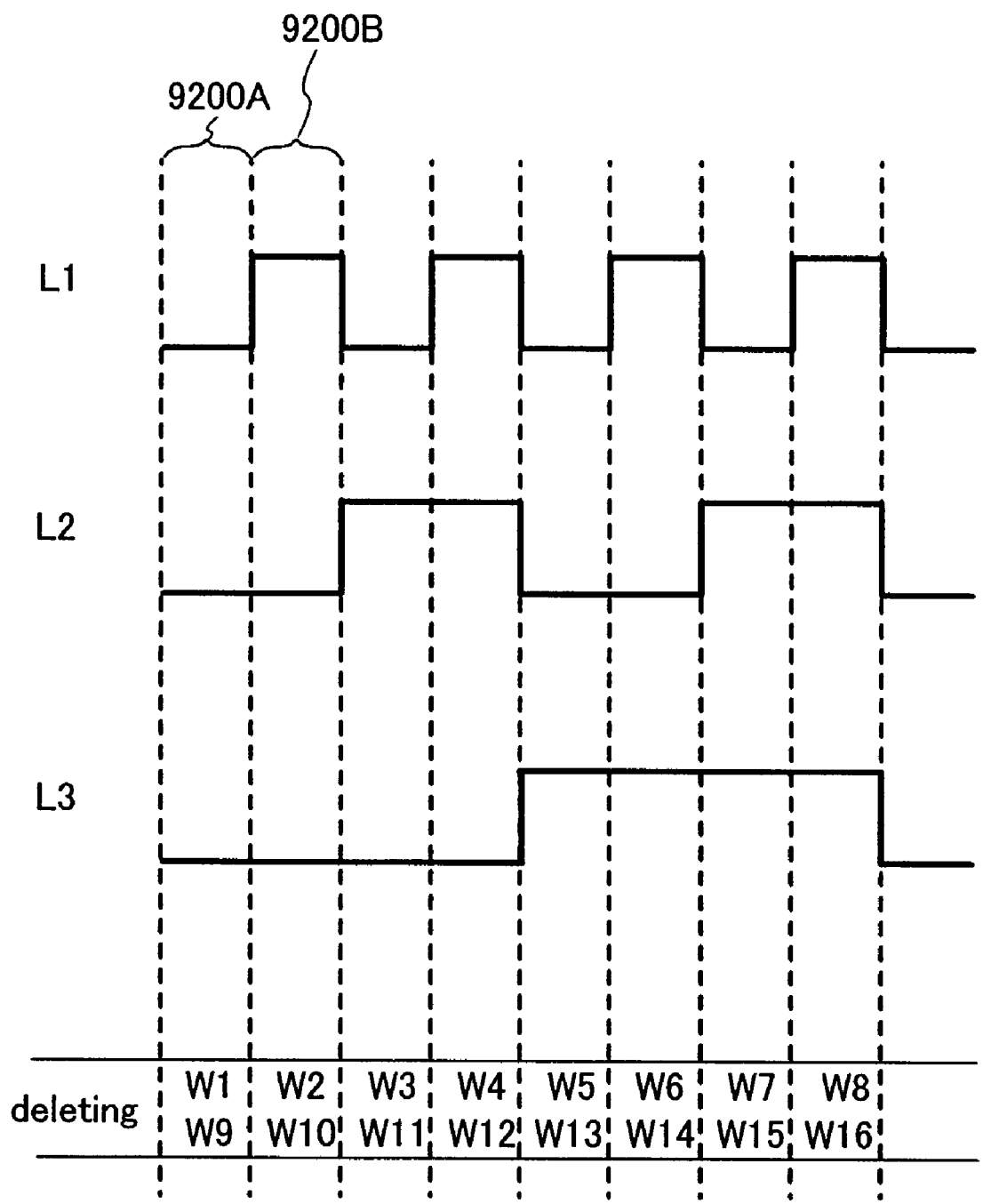
FIG. 5 illustrates scan signals of a decoder in accordance with the method for deleting data of the present invention.

FIG. 5 illustrates the signal timing of the signals L1 to L3 as examples of the signals used for deleting data from the nonvolatile memory elements. As shown in FIG. 5, the signals L1 to L3 have waveforms with the timing corresponding to the number of bits of the NAND-type nonvolatile memory. That is, in FIG. 4, a signal which selects any of the word lines W1 to W8 and a signal which selects any of the word lines W9 to W16 are supplied from NOR circuits in a logic circuit 9202 and a logic circuit 9203 within the decoder 9200, to which the signals L1 to L3 are input. Specifically, as shown in FIG. 5, the word line W1 and the word line W9 are selected in a first period 9200A in which the signals L1 to L3 are input. In a second period 9200B in which the signals L1 to 13 are input, the word line W2 and the word line 10 are selected.

The decoder 9200 generates signals for the word lines and the selection gate lines, and the voltage converter circuit 9201 converts a voltage. The logic of the input signal and the logic of the output signal of the voltage converter circuit are the same. That is, when the logic of the input is 1, the logic of the output is also 1. Similarly, when the logic of the input is 0, the logic of the output is also 0. The voltage converter circuit 9201 is a circuit having a function of converting a voltage in accordance with an input signal, and applying a potential to each word line and the gates of the selection transistors.

In FIG. 4, the logic circuit 9202 which generates signals for the word lines W1 to W8 and the logic circuit 9203 which generates signals for the word lines W9 to W16 have the same input signals L1 to L3 and the same input signals L1B to L3B, and also have the same circuit configurations. Meanwhile, the logic circuit 9202 and the logic circuit 9203 are different in that they are connected to different wires to which the signal L4 and the signal L4B are input. The wires to which the signal L4 and the signal L4B are input are provided separately in order to write or read data. When deleting data from the nonvolatile memory elements, the signal L4 and the signal L4B are both set at low potentials. In addition, in FIG. 4, the selection gate lines SG1 and SG2 are different in that they are connected to different wires to which the signal L5 and the signal L5B are input. The wires to which the signal L5 and the signal L5B are input are provided separately in order to write or read data. When conducting a data deletion operation by releasing charges in the charge accumulating layers of the nonvolatile memory elements, the signal L5 and the signal L5B are both set at high potentials.

By the operations shown in FIGS. 4 and 5, the same signals can be input to the selection gate line SG1 and the word lines W1 to W8 of the NAND-type cell 9118 as to the selection gate line SG2 and the word lines W9 to W16 of the NAND-type cell 9119. That is, the data of the nonvolatile memory element connected to the word line W1 and the data of the nonvolatile memory element connected to the word line W9 can be deleted at the same time. Similarly, the data of the nonvolatile memory element connected to the word line W2 and the data of the nonvolatile memory element connected to the word line W10 can be deleted at the same time. Also, the data of the nonvolatile memory element connected to the word line W8 and the data of the nonvolatile memory element connected to the word line W16 can be deleted at the same time. That is, since the configuration in this embodiment mode allows charges in the charge accumulating layers of the nonvolatile memory elements which are included in the plurality of NAND-type cells to be released at the same time, not only can the advantageous effects described in Embodiment Mode 1 be obtained, but also the data of the NAND-type cells can be deleted at faster speed.

Although this embodiment mode has described the method for deleting data from the nonvolatile memory elements included in two NAND-type cells which are arranged in the row direction, even when there are a large number of NAND-type cells arranged in the row direction, the same signals as the signals L1 to L3 and the signals L1B to L3B which are used for the NAND-type cells 9118 and 9119 may be generated, and input to the other NAND-type cells. In addition, as for a nonvolatile memory having a different number of bits from the NAND-type cells described in this embodiment mode, the number of signals input to the decoder 9200 or the logic circuits may be changed as appropriate. Also, the decoder and the input signals described in this embodiment mode may be designed so that the memory elements can be selected individually in data writing or reading.

By using the above method for deleting data from the NAND-type nonvolatile memory, the data of the nonvolatile memory elements included in the NAND-type cells can be sequentially deleted one by one, in the same way as in Embodiment Mode 1. Therefore, it is possible as shown in FIG. 3 to concurrently form the p well 5001 of the logic portion which drives the nonvolatile memory cell, and the p well 5002 of the nonvolatile memory cell. That is, there is no need to isolate the substrate in separately forming the p well of the logic portion and the p well of the memory cell. Furthermore, cost reduction of the nonvolatile semiconductor memory device having the nonvolatile memory elements can be achieved.

Note that this embodiment mode can be freely implemented in combination with any of the other embodiment modes or embodiments in this specification.

Embodiment 1

Figure 6:
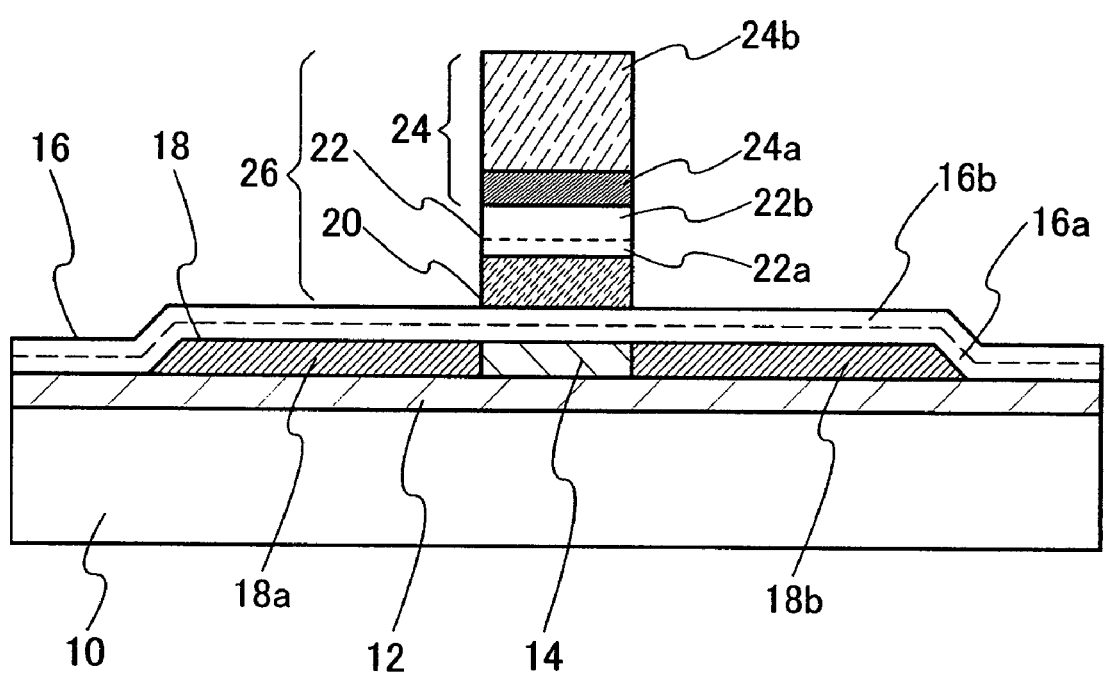
FIG. 6 is a cross-sectional view of a nonvolatile memory cell used in the present invention.

In this embodiment, a cross section of a nonvolatile memory element is described with reference to the drawings. FIG. 6 is a cross-sectional view of a nonvolatile memory element in this embodiment mode. This nonvolatile memory element is formed using a substrate 10 having an insulating surface. As the substrate 10 having the insulating surface, a glass substrate, a quartz substrate, a sapphire substrate, a ceramic substrate, a metal substrate having an insulating surface formed on its surface, and the like can be used.

A semiconductor film 14 is formed over the substrate 10 having the insulating surface. A base insulating film 12 may be provided between the substrate 10 and the substrate 14. This base insulating film 12 can prevent contamination of the semiconductor film 14 with impurities such as alkali metal which would otherwise be diffused from the substrate 10 into the semiconductor film 14. Also, the base insulating film 12 may be provided to function as a blocking layer.

The base insulating film 12 is formed by a CVD method, a sputtering method, or the like, using an insulating material such as silicon oxide, silicon nitride, silicon oxynitride ($SiO_xN_y$), (x>y>0), or silicon nitride oxide ($SiN_xO_y$) (x>y>0). For example, when the base insulating film 12 is formed to have a two-layer structure, it is preferable to form a silicon nitride oxide film as a first-layer insulating film, and form a silicon oxynitride film as a second-layer insulating film. Alternatively, it is also possible to form a silicon nitride film as a first-layer insulating film and form a silicon oxide film as a second-layer insulating film.

The semiconductor film 14 is preferably formed using a single crystalline semiconductor or a polycrystalline semiconductor. For example, the semiconductor film 14 can be formed by crystallizing a semiconductor film which is formed over the entire surface of the substrate 10 by a sputtering method, a plasma CVD method or a low-pressure CVD method, and then selectively etching the crystallized semiconductor film. That is, it is preferable, for the purpose of element isolation, to form island-shape semiconductor films over the insulating surface, and form one or more nonvolatile memory elements using each semiconductor film. Although silicon is preferably used as a semiconductor material, a silicon germanium semiconductor can also be used. As a crystallization method of the semiconductor film, it is possible to use a laser crystallization method, a thermal crystallization method using rapid thermal annealing (RTA) or an annealing furnace, a crystallization method using a metal element which promotes the crystallization, or a method combining them. Instead of such a thin film process, it is also possible to use a so-called SOI (Silicon on Insulator) substrate which is obtained by forming a single crystalline semiconductor film over an insulating surface.

In this manner, by using the island-shape semiconductor films which are obtained by isolating the semiconductor film formed over the insulating surface, element isolation can be effectively conducted even when a nonvolatile memory element array and a peripheral circuit are formed over the same substrate. That is, even when a nonvolatile memory element array which requires a voltage of about 10 to 20 V for writing or deleting data, and a peripheral circuit which mainly controls the data input/output or instructions with a voltage of about 3 to 7 V are formed over the same substrate, mutual interference resulting from the difference in the voltage applied to each element can be prevented.

The semiconductor film 14 may be doped with a p-type impurity. As the p-type impurity, for example, boron is used, and it may be introduced at a concentration of about $5\times10^{15}$ to $1\times10^{16}$ atoms/cm$^3$. The impurity is introduced in order to control the threshold voltage of the transistor, and the impurity can act effectively by being introduced into a channel formation region. The channel formation region is formed in a region between a pair of impurity regions 18a and 18b in the semiconductor film 14, which is positioned roughly below a gate 26 which is described later.

The pair of impurity regions 18a and 18b are regions functioning as a source region and a drain region of the nonvolatile memory element. The pair of impurity regions 18a and 18b are formed by doping the semiconductor film 14 with phosphorus or arsenic that is an n-type impurity at a peak concentration of about $10^{21}$ atoms/cm$^3$.

A first insulating film 16, a floating gate 20, a second insulating film 22, and a control gate 24 are formed over the semiconductor film 14. In this specification, a stacked structure having the floating gate 20 at the bottom and the control gate 24 at the top may be called the gate 26.

The first insulating film 16 is formed with silicon oxide or with a stacked structure of silicon oxide and silicon nitride. The first insulating film 16 may be formed by depositing an insulating film by a plasma CVD method or a low-pressure CVD method; however, it is preferably formed by solid-phase oxidation or solid-phase nitridation by plasma treatment. This is because an insulating film formed by oxidizing or nitriding a semiconductor film (typically, a silicon layer) by plasma treatment has a dense film quality, high withstand voltage, and high reliability. The first insulating film 16 is used as a tunnel insulating film for injecting charges into the floating gate 20; therefore, it is preferably formed to be strong as described above. The first insulating film 16 is formed to have a thickness of 1 to 20 nm, preferably 3 to 6 nm. For example, given that the gate length is 600 nm, the first insulating film 16 can be formed to have a thickness of 3 to 6 nm.

As the solid-phase oxidation treatment or solid-phase nitridation treatment by plasma treatment, it is preferable to use plasma which is excited by microwaves (typically, 2.45 GHz) and which has an electron density of $1\times10^{11}$ to $1\times10^{13}$ cm$^{-3}$, and an electron temperature of 0.5 to 1.5 eV. This is in order to form a dense insulating film as well as obtaining a practical reaction speed by the solid-phase oxidation treatment or solid-phase nitridation treatment at a temperature of 500° C. or less.

In the case of oxidizing the surface of the semiconductor film 14 by such plasma treatment, the oxidation is conducted under an oxygen atmosphere (e.g., an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). In the case of conducting nitridation by plasma treatment, the plasma treatment is conducted under a nitrogen atmosphere (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a mixed gas of Ar and Kr may also be used.

Figure 7:
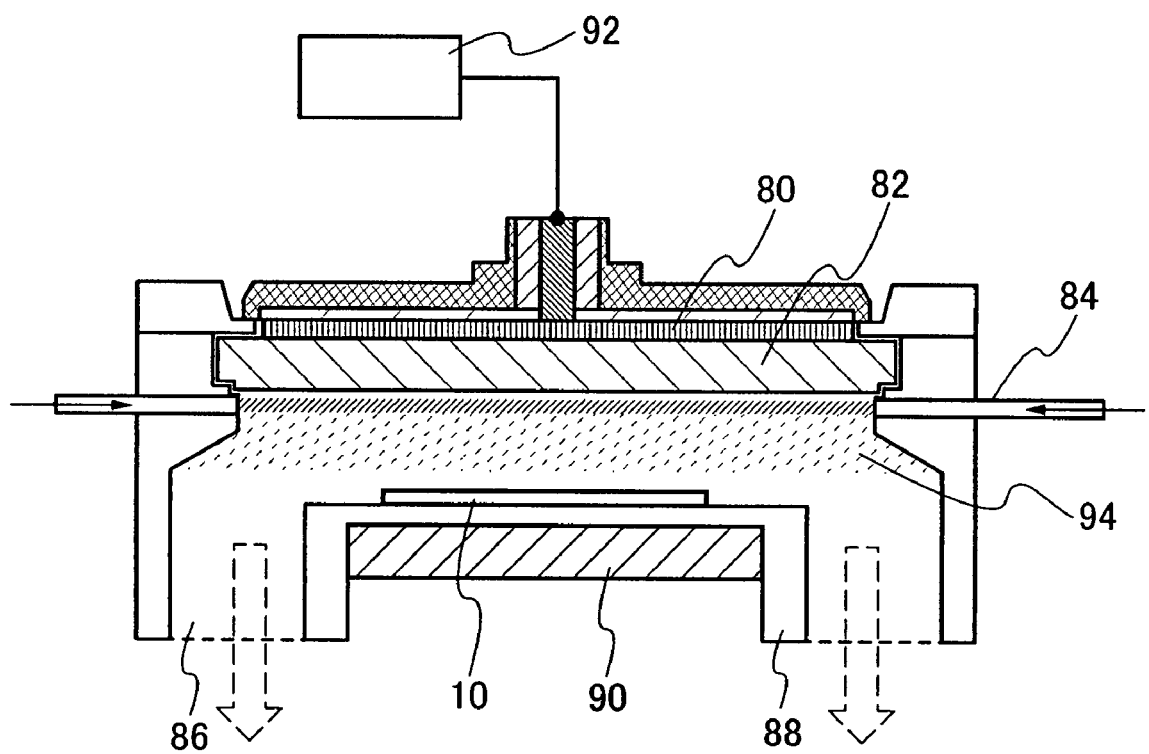
FIG. 7 illustrates an apparatus concerning a nonvolatile memory used in the present invention.

FIG. 7 shows an exemplary structure of an apparatus for plasma treatment. This plasma treatment apparatus includes a support base 88 for positioning a substrate 10, a gas supply portion 84 for introducing gas, an exhaust port 86 which connects to a vacuum pump for exhausting gas, an antenna 80, a dielectric plate 82, and a microwave supply portion 92 which supplies microwaves for generating plasma. In addition, the temperature of the substrate 10 can be controlled by providing the support base 88 with a temperature control portion 90.

The plasma treatment is described below. Note that the plasma treatment includes oxidation treatment, nitridation treatment, oxynitridation treatment, hydrogenation treatment, and surface modification treatment for a semiconductor film, an insulating film, or a conductive film. Such treatment may be conducted by selecting gas to be supplied from the gas supply portion 84 according to the intended purpose.

Oxidation treatment or nitridation treatment may be conducted as follows. First, a treatment chamber is evacuated, and a plasma treatment gas which contains oxygen or nitrogen is introduced into the treatment chamber from the gas supply portion 84. The substrate 10 is set at the room temperature or heated to 100 to 550° C. by the temperature control portion 90. Note that the distance between the substrate 10 and the dielectric plate 82 is about 20 nm to 80 mm (preferably, 20 nm to 60 mm). Next, microwaves are supplied to the antenna 80 from the microwave supply portion 92. Then, by delivering the microwaves to the treatment chamber from the antenna 80 through the dielectric plate 82, plasma 94 is generated. When plasma is excited by the introduction of the microwaves, plasma with a low electron temperature (3 eV or lower, preferably 1.5 eV or lower) and a high electron density ($1\times10^{11}$ cm$^{-3}$ or higher) can be generated. With oxygen radicals (which may include OH radicals) and/or nitrogen radicals (which may include NH radicals) which are produced by the high-density plasma, the surface of the semiconductor film can be oxidized or nitrided. When the plasma treatment gas is mixed with a rare gas such as argon, oxygen radicals or nitrogen radicals can be efficiently generated by excited species of the rare gas. In this method, oxidation, nitridation, or oxynitridation by a solid-phase reaction can be conducted at a temperature as low as 500° C. or less by efficiently utilizing active radicals which are excited by plasma.

Referring again to FIG. 6, as a preferable example of the first insulating film 16 formed by plasma treatment, the following steps are conducted: forming a silicon oxide layer 16a to a thickness of 3 to 6 nm on the surface of the semiconductor film 14 by plasma treatment under an oxygen atmosphere, and forming a nitrogen-plasma-treated layer 16b on the silicon oxide layer 16a by plasma treatment under a nitrogen atmosphere. Specifically, the silicon oxide layer 16a is formed to a thickness of 3 to 6 nm on the semiconductor film 14 by plasma treatment under an oxygen atmosphere. Then, by continuously conducting the plasma treatment under a nitrogen atmosphere, the nitrogen-plasma-treated layer with a high concentration of nitrogen is provided on the surface of the silicon oxide layer or in the vicinity of the surface. Note that the vicinity of the surface means a region from the surface of the silicon oxide layer to a depth of about 0.5 to 1.5 nm. For example, by conducting plasma treatment under a nitrogen atmosphere, a structure is obtained in which the silicon oxide layer 16a contains 20 to 50 atomic % nitrogen in a region from the surface to a depth of about 1 nm.

By oxidizing the surface of the silicon layer by plasma treatment as a typical example of the first insulating film 16, a dense oxide film without a distorted interface can be formed. Furthermore, by forming a nitride layer by further nitriding the surface of the oxide film by plasma treatment so as to substitute nitrogen for oxygen of the outmost surface, an even denser film can be obtained. By such plasma treatment, an insulating layer with high withstand voltage can be formed.

In either case, by using the above-described solid-phase oxidation treatment or solid-phase nitridation treatment by the plasma treatment, an insulating film which is substantially the same as a thermally oxidized film that is formed at a temperature of 950 to 1050° C. can be obtained even when a glass substrate with an allowable temperature limit of 700° C. or less is used. That is, a tunnel insulating film which has high reliability as the tunnel insulating film of the nonvolatile memory element can be formed.

The floating gate 20 is formed over the first insulating film 16. The floating gate 20 is preferably formed from a semiconductor material, and a material which satisfies one or more of the following conditions can be used.

The bandgap of the semiconductor material for forming the floating gate 20 is preferably smaller than that of the semiconductor film 14. For example, it is preferable that there be a bandgap difference of 0.1 eV or more between the semiconductor material for forming the floating gate 20 and the semiconductor film 14, and the former be smaller than the latter. This is because the charge (electron) injection properties and the charge holding properties can be improved by setting the bottom energy level of the conduction band of the floating gate 20 to be lower than that of the semiconductor film 14.

The semiconductor material for forming the floating gate 20 is preferably a material with lower resistivity than the material of the semiconductor film 14. By forming the floating gate 20 using a semiconductor material with low resistivity, an electric field can be prevented from being divided at the floating gate when a voltage is applied between the control gate and the semiconductor film. Thus, the electric field can effectively act on the semiconductor film. For example, it is preferable to use germanium which has a resistivity of 40 to 70 Ω·cm. Furthermore, the floating gate 20 may be doped with an n-type impurity in order to lower the resistivity. In this manner, by forming the floating gate 20 with a material which has a smaller bandgap and lower resistivity than the material for forming the semiconductor film 14, the writing properties can be improved.

The semiconductor material for forming the floating gate 20 is preferably a material that allows an energy barrier against electrons of the floating gate 20, which is formed by the first insulating film 16, to be higher than an energy barrier against electrons of the semiconductor film 14, which is formed by the first insulating film 16. This is in order to facilitate the injection of charges (electrons) into the floating gate 20 from the semiconductor film 14 and prevent charges in the floating gate 20 from disappearing.

Figure 8:
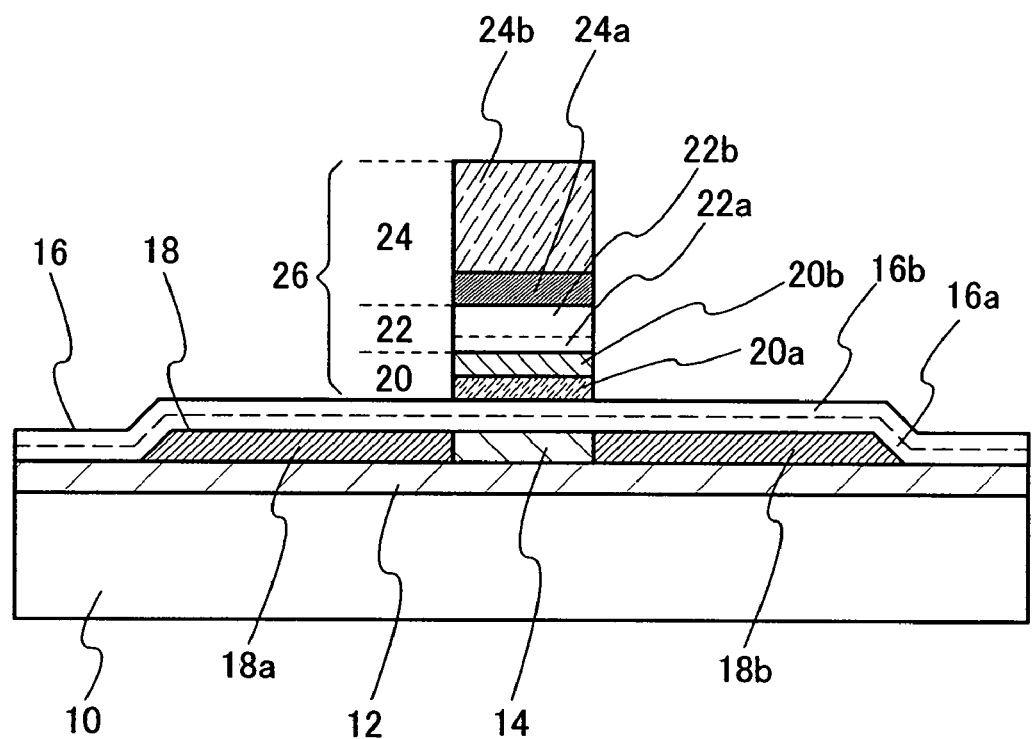
FIG. 8 is a cross-sectional view of a nonvolatile memory cell used in the present invention.

In addition, as shown in FIG. 8, the floating gate 20 may be formed to have a first floating gate electrode layer 20*a* and a second floating gate electrode layer 20*b*. Needless to say, the structure of the floating gate 20 is not limited to the two-layer structure, and more than two layers may be stacked. Note that the first floating gate electrode layer 20*a* which is formed in contact with the first insulating film 16 is preferably formed from a semiconductor material, and a material which satisfies one or more of the following conditions can be used.

The bandgap of the semiconductor material for forming the first floating gate electrode layer 20*a* is preferably smaller than that of the semiconductor film 14. For example, it is preferable that there be a bandgap difference of 0.1 eV or more between the semiconductor material for forming the first floating gate electrode layer 20*a* and the semiconductor film 14, and the former be smaller than the latter. This is because the charge (electron) injection properties and the charge holding properties can be improved by setting the bottom energy level of the conduction band of the first floating gate electrode layer 20*a* to be lower than that of the semiconductor film 14.

The semiconductor material for forming the first floating gate electrode layer 20*a* is preferably a material with lower resistivity than the material of the semiconductor film 14. By forming the first floating gate electrode layer 20*a* using a semiconductor material with low resistivity, an electric field can be prevented from being divided at the floating gate when a voltage is applied between the control gate and the semiconductor film. Thus, the electric field can effectively act on the semiconductor film. For example, it is preferable to use germanium which has a resistivity of 40 to 70 Ω·cm. Furthermore, the first floating gate electrode layer 20*a* may be doped with an n-type impurity in order to lower the resistivity. In this manner, by forming the first floating gate electrode layer 20*a* with a material which has a smaller bandgap and lower resistivity than the material for forming the semiconductor film 14, the writing properties can be improved.

The semiconductor material for forming the first floating gate electrode layer 20*a* is preferably a material that allows an energy barrier against electrons of the first floating gate electrode layer 20*a*, which is formed by the first insulating film 16, to be higher than an energy barrier against electrons of the semiconductor film 14, which is formed by the first insulating film 16. This is in order to facilitate the injection of charges (electrons) into the first floating gate electrode layer 20*a* from the semiconductor film 14 and prevent charges in the first floating gate electrode layer 20*a* from disappearing.

As a material which can satisfy the conditions of the semiconductor material for forming the floating gate 20 in FIG. 6 or the first floating gate electrode layer 20*a* in FIG. 8, germanium or a germanium compound can typically be used. As a typical example of a germanium compound, silicon germanium can be given, which preferably contains 10 atomic % or more of germanium with respect to silicon. This is because, if the concentration of germanium is less than 10 atomic %, the effect of the germanium as the constituent element would be small, and the bandgap of the floating gate 20 or the first floating gate electrode layer 20*a* would not become effectively small.

Although the floating gate (hereinafter also called a charge accumulating layer) is applied to the nonvolatile semiconductor memory device in accordance with the present invention for the purpose of accumulating charges, other semiconductor materials which have similar functions can also be used. For example, a ternary semiconductor containing germanium may be used, or the semiconductor material may be hydrogenated. Alternatively, as a material having a function of the charge accumulating layer of the nonvolatile memory element, oxide or nitride of the germanium or the germanium compound can be used.

Note that the second floating gate electrode layer 20*b* shown in FIG. 8, which is provided on the side of the second insulating film 22 while being in contact with the first floating gate electrode layer 20*a*, is preferably a layer formed from silicon or a silicon compound. As a silicon compound, silicon nitride, silicon nitride oxide, silicon carbide, silicon germanium which contains less than 10 atomic % of germanium, or the like can be used. In this manner, by forming the second floating gate electrode layer 20*b* using a material having a larger bandgap than the first floating gate electrode layer 20*a*, charges accumulated in the floating gate can be prevented from leaking to the side of the second insulating film 22. In addition, as a material for forming the second floating gate electrode layer 20*b*, metal nitride or metal oxide can be used. As the metal nitride, tantalum nitride, tungsten nitride, molybdenum nitride, titanium nitride, or the like can be used.

In either case, by providing the second floating gate electrode layer 20*b* made of silicon, a silicon compound, metal nitride, or metal oxide in FIG. 8 above the first floating gate electrode layer 20*a* which is formed from germanium or a germanium compound, the second floating gate electrode layer 20*b* can be used as a barrier layer having a water-resistant property or a chemical-resistant property in the manufacturing process. Accordingly, handling of the substrate in the photolithography, etching, and washing processes can be made easier, and thus the productivity can be improved. That is, the processing of the floating gate can be facilitated.

The second insulating film 22 is formed to have either a single layer or a plurality of layers by a low-pressure CVD method or a plasma CVD method, using silicon oxide, silicon oxynitride ($SiO_xN_y$) (x>y), silicon nitride ($SiN_x$), silicon nitride oxide ($SiN_xO_y$) (x>y), aluminum oxide ($Al_xO_y$), and/ or the like. The second insulating film 22 is formed to have a thickness of 1 to 20 nm, preferably 5 to 10 nm. For example, the second insulating film 22 can be formed by depositing a silicon nitride layer 22a to a thickness of 3 nm and depositing a silicon oxide layer 22b thereover to a thickness of 5 nm. Alternatively, the second insulating film 22 can be formed by subjecting the surface of the floating gate 20 to plasma nitridation treatment and thus forming a nitride film (e.g., germanium nitride in the case where germanium is used for the floating gate 20). In either case, by using a nitride film for one or both of the first insulating film 16 (the nitrogen-plasma-treated layer 16b) and the second insulating film 22 (the silicon nitride layer 22a) which have a contact with the floating gate 20, the floating gate 20 can be prevented from being oxidized. As a further alternative, the second insulating film 22 can be a film containing aluminum oxide ($AlO_x$), hafnium oxide ($HfO_x$), or tantalum oxide ($TaO_x$), which has a higher dielectric constant than the first insulating film 16.

The control gate 24 is preferably formed from a metal selected from among tantalum (Ta), tungsten (W), titanium (Ti), molybdenum (Mo), chromium (Cr), niobium (Nb), and the like, or an alloy material or a compound material containing such a metal as a main component. Furthermore, polysilicon doped with an impurity element such as phosphorus can also be used. In addition, the control gate 24 may be formed to have either a single layer or a plurality of layers, e.g., a stacked structure of a metal nitride layer 24a and the above-described metal layer 24b. As the metal nitride, tungsten nitride, molybdenum nitride, or titanium nitride can be used. By providing the metal nitride layer 24a, adhesion to the second insulating film 22 can be improved, thereby the control gate 24 can be prevented from being peeled off the second insulating film 22. When metal nitride such as tantalum nitride having a high work function is used for the control gate 24, the first insulating film 16 can be formed to be thick by the synergistic effect with the second insulating film 22.

The operation mechanism of the nonvolatile memory element shown in FIG. 6 is described with reference to a band diagram shown in FIG. 9. In addition, the operation mechanism of the nonvolatile memory element shown in FIG. 8 is described with reference to a band diagram shown in FIG. 10. In the band diagrams described below, same reference numerals are used to designate portions which are identical in FIGS. 6 and 8.

Figure 9:
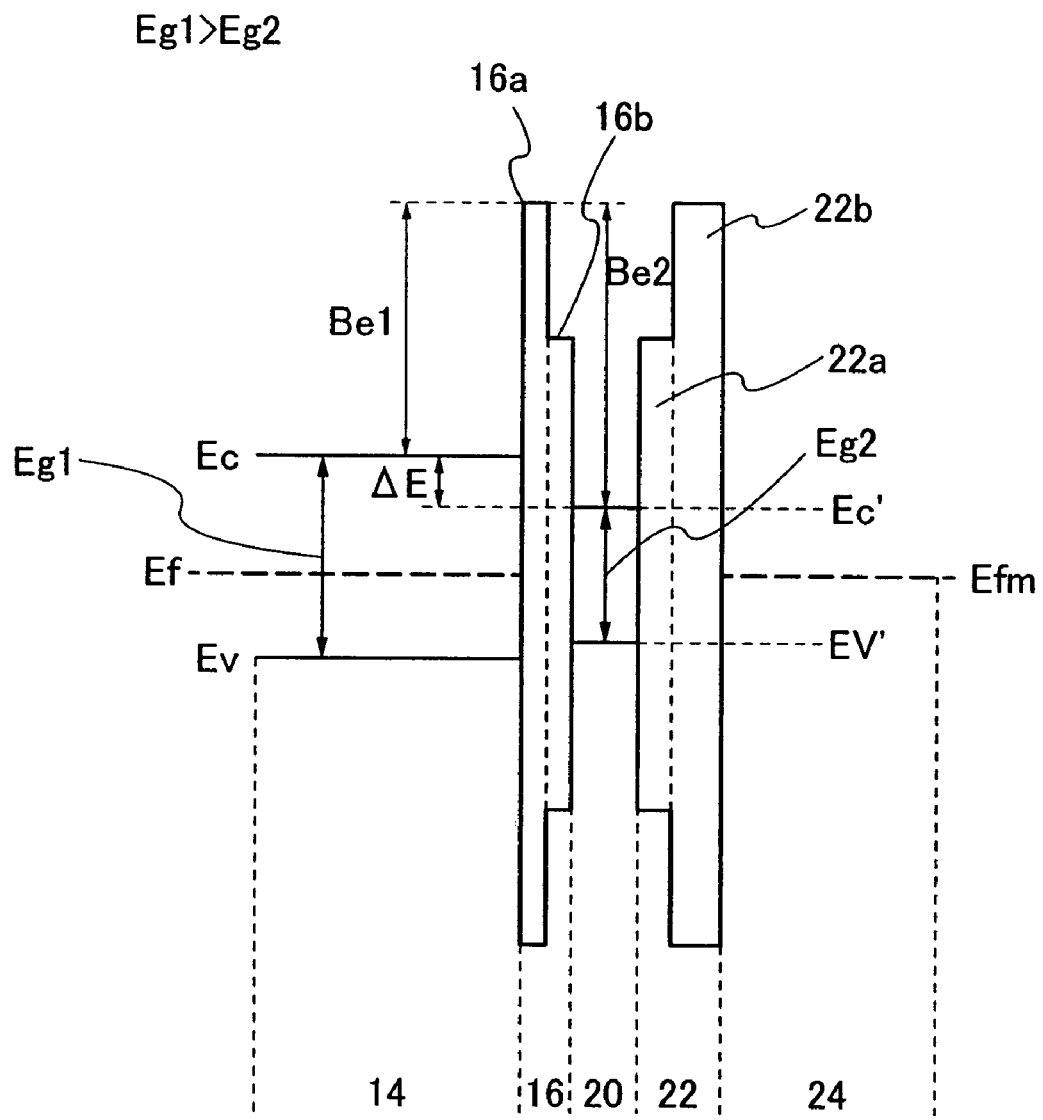
FIG. 9 illustrates a nonvolatile memory used in the present invention.

FIG. 9 shows the state that the semiconductor film 14, the first insulating film 16, the floating gate 20, the second insulating film 22, and the control gate 24 are stacked. FIG. 9 shows the case where no voltage is applied to the control gate 24 and the Fermi level Ef of the semiconductor film 14 is equal to the Fermi level Efm of the control gate 24.

The semiconductor film 14 and the floating gate 20 are formed from different materials, interposing the first insulating film 16 therebetween. The bandgap Eg1 (the energy difference between the bottom level Ec of the conduction band and the top level Ev of the valence band) of the semiconductor film 14 is made different from the bandgap Eg2 of the floating gate 20, and the bandgap Eg2 is made smaller than the bandgap Eg1. For example, silicon (1.12 eV) may be used for the semiconductor film 14 and germanium (0.72 eV) or silicon germanium (0.73 to 1.0 eV) may be used for the floating gate 20. Note that the first insulating film 16 is shown in the state that the silicon oxide layer 16a (about 8 eV) and the nitrogen-plasma-treated layer 16b (about 5 eV) which is obtained by nitriding the surface of the silicon oxide layer by plasma treatment are stacked. Also, the second insulating film 22 is shown in the state that the silicon nitride layer 22a and the silicon oxide layer 22b are sequentially stacked over the floating gate 20.

The semiconductor film 14 and the floating gate 20 are formed from different materials, interposing the first insulating film 16 therebetween. The bandgap of the semiconductor film 14 is different from the bandgap of the floating gate 20, and the bandgap of the floating gate electrode 20 is smaller than the bandgap of the semiconductor film 14. For example, silicon (1.12 eV) may be used for the semiconductor film 14 and germanium (0.72 eV) or silicon germanium (0.73 to 1.0 eV) may be used for the floating gate 20. That is, the bandgap Eg1 of silicon of the semiconductor film 14 and the bandgap Eg2 of germanium of the floating gate 20 satisfy the relationship of Eg1>Eg2. When the semiconductor film 14 and the floating gate 20 are formed using the above materials, an energy barrier against electrons of the semiconductor film 14, which is formed by the first insulating film 16, i.e., the first barrier Be1, and an energy barrier against electrons of the floating gate 20, which is formed by the first insulating film 16, i.e., the second barrier Be2, have different values and can satisfy the relationship of Be2>Be1. In such conditions, there arises an energy difference of ΔE between the bottom energy levels of the conduction bands of the semiconductor film 14 and the floating gate 20. This energy difference ΔE acts in the direction in which electrons which have been injected from the semiconductor film 14 into the floating gate 20 are accelerated, which will be described later. Therefore, the energy difference ΔE can contribute to lowering the writing voltage.

Figure 10:
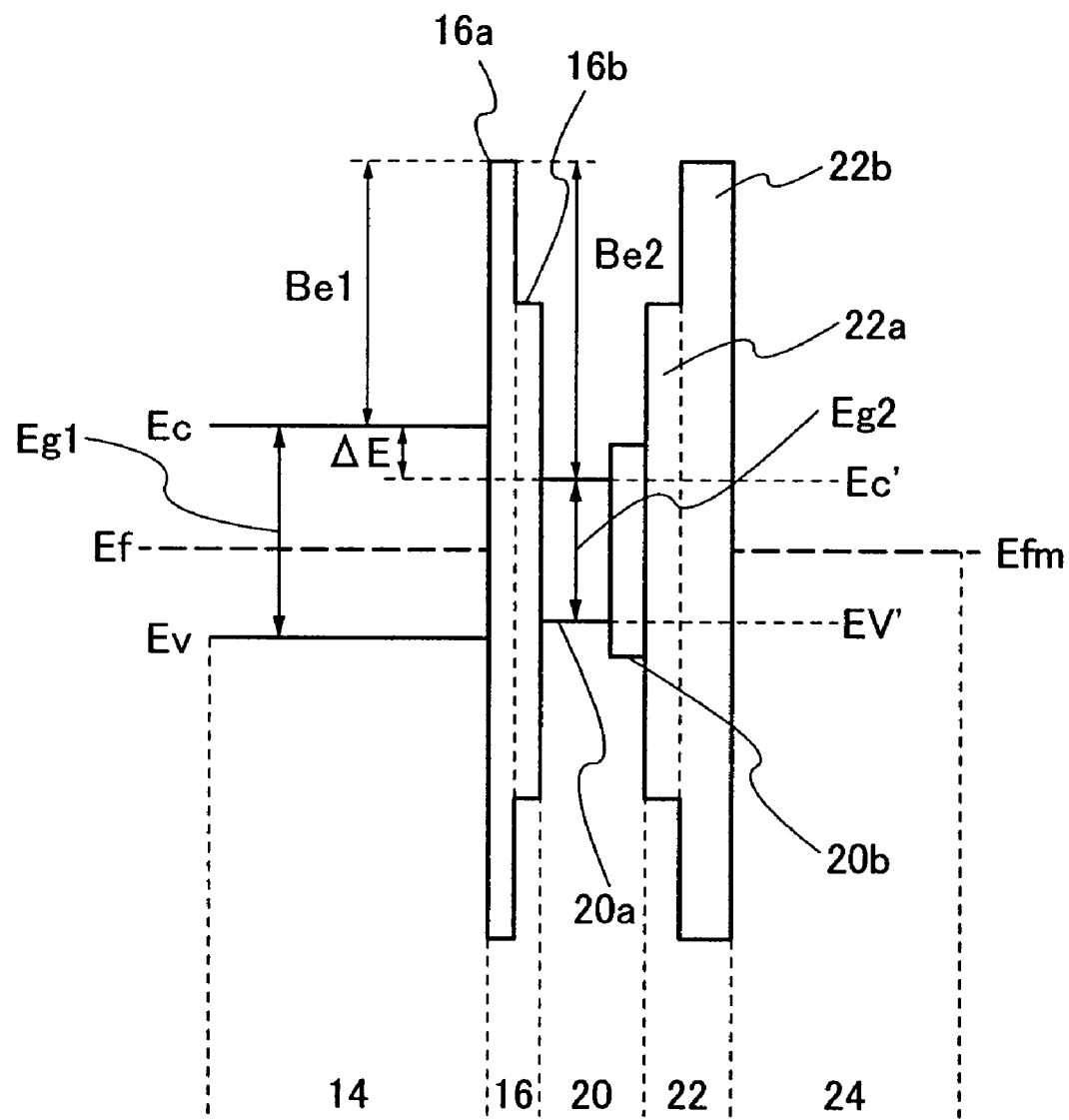
FIG. 10 illustrates a nonvolatile memory used in the present invention.

FIG. 10 shows the state that the semiconductor film 14, the first insulating film 16, the floating gate 20, the second insulating film 22, and the control gate 24 are stacked. FIG. 10 shows the case where no voltage is applied to the control gate 24 and the Fermi level Ef of the semiconductor film 14 is equal to the Fermi level Efm of the control gate 24.

The semiconductor film 14 and at least the first floating gate electrode layer 20a of the floating gate 20 are formed from different materials, interposing the first insulating film 16 therebetween. The bandgap Eg1 (the energy difference between the bottom level Ec of the conduction band and the top level Ev of the valence band) of the semiconductor film 14 is made different from the bandgap Eg2 of the first floating gate electrode layer 20a, and the bandgap Eg2 is made smaller the bandgap Eg1. For example, silicon (1.12 eV) may be used for the semiconductor film 14 and germanium (0.72 eV) or silicon germanium (0.73 to 1.0 eV) may be used for the first floating gate electrode layer 20a. In the case where polysilicon is used for the second floating gate electrode layer 20b, the bandgap of the second floating gate electrode layer 20b is larger than that of the first floating gate electrode layer 20a. This difference in bandgap functions as a barrier against carriers which are injected into the first floating gate electrode layer 20a through the first insulating film 16. Accordingly, the injected carriers can be prevented from leaking to the side of the second insulating film 22 and also prevented from being trapped at the interface between the second floating gate electrode layer 20b and the second insulating film 22.

Note that the first insulating film 16 is shown in the state that the silicon oxide layer 16a (about 8 eV) and the nitrogen-plasma-treated layer 16b (about 5 eV) which is obtained by nitriding the surface of the silicon oxide layer by plasma treatment are stacked. In addition, the second insulating film 22 is also shown in the state that the silicon nitride layer 22a and the silicon oxide layer 22b are sequentially stacked over the floating gate 20.

The semiconductor film 14 and the first floating gate electrode layer 20a are formed from different materials, interposing the first insulating film 16 therebetween. In this case, the bandgap of the semiconductor film 14 is different from the bandgap of the first floating gate electrode layer 20a, and the bandgap of the first floating gate electrode layer 20a is smaller than the bandgap of the semiconductor film 14. For example, silicon (1.12 eV) may be used for the semiconductor film 14 and germanium (0.72 eV) or silicon germanium (0.73 to 1.0 eV) may be used for the first floating gate electrode layer 20a. That is, the bandgap Eg1 of silicon of the semiconductor film 14 and the bandgap Eg2 of germanium of the first floating gate electrode layer 20a satisfy the relationship of Eg1>Eg2. When the semiconductor film 14 and the first floating gate electrode layer 20a are formed using the above materials, energy barriers against electrons which are formed by the first insulating film 16, i.e., the first barrier Be1 and the second barrier Be2, have different values, and can satisfy the relationship of Be2>Be1. In such conditions, there arises an energy difference of ΔE between the bottom energy levels of the conduction bands of the semiconductor film 14 and the first floating gate electrode layer 20a. This energy difference ΔE acts in the direction in which electrons which have been injected from the semiconductor film 14 into the first floating gate electrode layer 20a are accelerated, which will be described later. Therefore, the energy difference ΔE can contribute to lowering the writing voltage.

Figure 11:
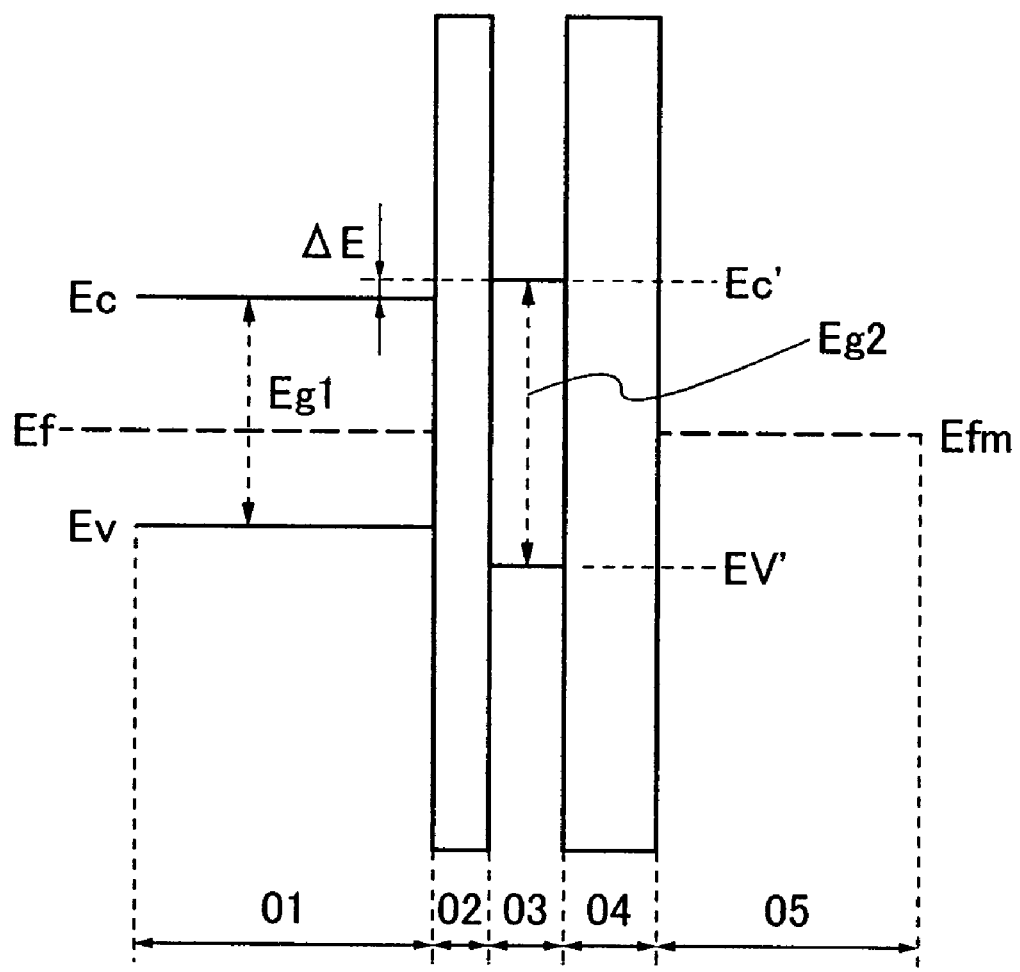
FIG. 11 illustrates a nonvolatile memory used in the present invention.

For comparison, FIG. 11 shows a band diagram in the case where the semiconductor film and the floating gate are formed from the same semiconductor material. This band diagram shows the state that a semiconductor film 01, a first insulating film 02, a floating gate 03, a second insulating film 04, and a control gate 05 are sequentially stacked. Even when the semiconductor film 01 and the floating gate 03 are formed from the same silicon material, the bandgaps thereof are different if the floating gate 03 is formed to be thin. In FIG. 11, the bandgap of the semiconductor film 01 is shown by Eg1 and the bandgap of the floating gate electrode 03 is shown by Eg2. It is said that when a silicon film is formed to be thin, for example, the bandgap of the film increases from 1.12 eV (of a single crystalline silicon wafer) to about 1.4 eV. Therefore, an energy difference of −ΔE is produced between the semiconductor film 01 and the floating gate 03 in the direction in which injection of electrons is blocked. In such conditions, a high voltage is required to inject electrons from the semiconductor film 01 into the floating gate 03. That is, in order to lower the writing voltage, it is necessary to form the floating gate 03 to be as thick as bulk silicon or dope the floating gate 03 with phosphorus or arsenic which is an n-type impurity at a high concentration. This is a drawback of the conventional nonvolatile memory.

As a method for injecting electrons into the floating gate 20, there is a method using thermoelectrons or a method using F-N tunnel current. In this embodiment, electrons are injected into the floating gate 20 by using F-N tunnel current. In the case of using F-N tunnel current, a positive voltage is applied to the control gate 24 so that electrons are injected from the semiconductor film 14 into the floating gate 20 by F-N tunnel current.

Figure 13:
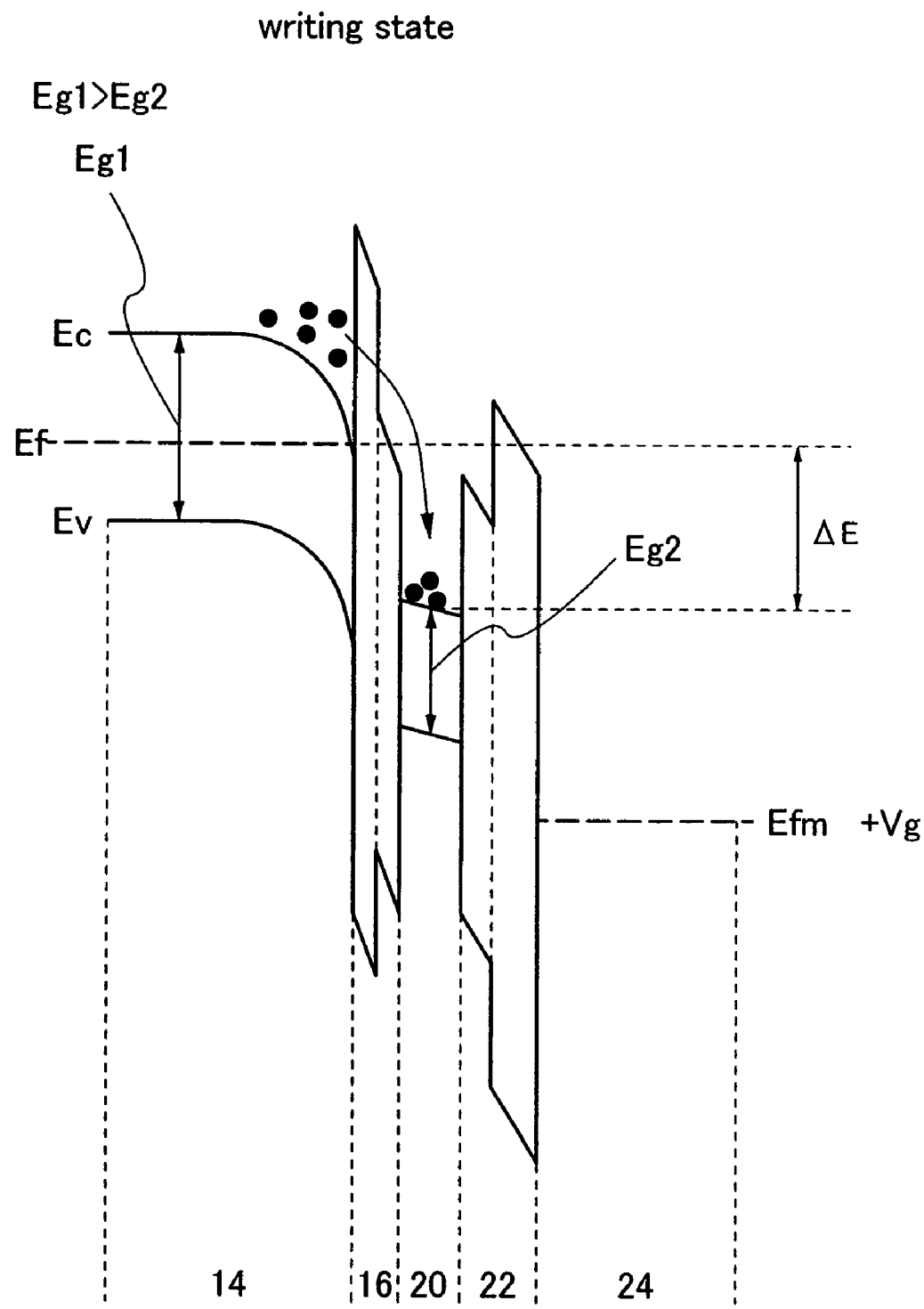
FIG. 13 illustrates a nonvolatile memory used in the present invention.

FIG. 12A shows a voltage applied when electrons are injected into the floating gate 20 by F-N tunnel current. A high positive voltage (10 to 20 V) is applied to the control gate 24, and the source region 18a and the drain region 18b are set at 0 V. A band diagram at this moment is shown in FIG. 13. When electrons of the semiconductor film 14 are injected into the first insulating film 16 by a high electric field, F-N tunnel current flows through the first insulating film 16. The bandgap Eg1 of the semiconductor film 14 and the bandgap Eg2 of the floating gate 20 satisfy the relationship of Eg1>Eg2, as described with reference to FIGS. 9 and 10. With this difference as a self-bias, electrons which have been injected from the channel formation region of the semiconductor film 14 are accelerated toward the floating gate. Accordingly, the electron injection properties can be improved.

The bottom energy level of the conduction band of the floating gate 20 is lower than that of the semiconductor film 14 by an energy of ΔE. Therefore, an internal electric field resulting from the energy difference is generated when electrons are injected into the floating gate 20. This can be achieved by combining the above-described semiconductor film 14 and floating gate 20. That is, injection of electrons from the semiconductor film 14 into the floating gate 20 can be facilitated, and the writing properties of the nonvolatile memory element can be improved. This effect can also be obtained in the case of injecting electrons into the floating gate 20 by using thermoelectrons.

Figure 14:
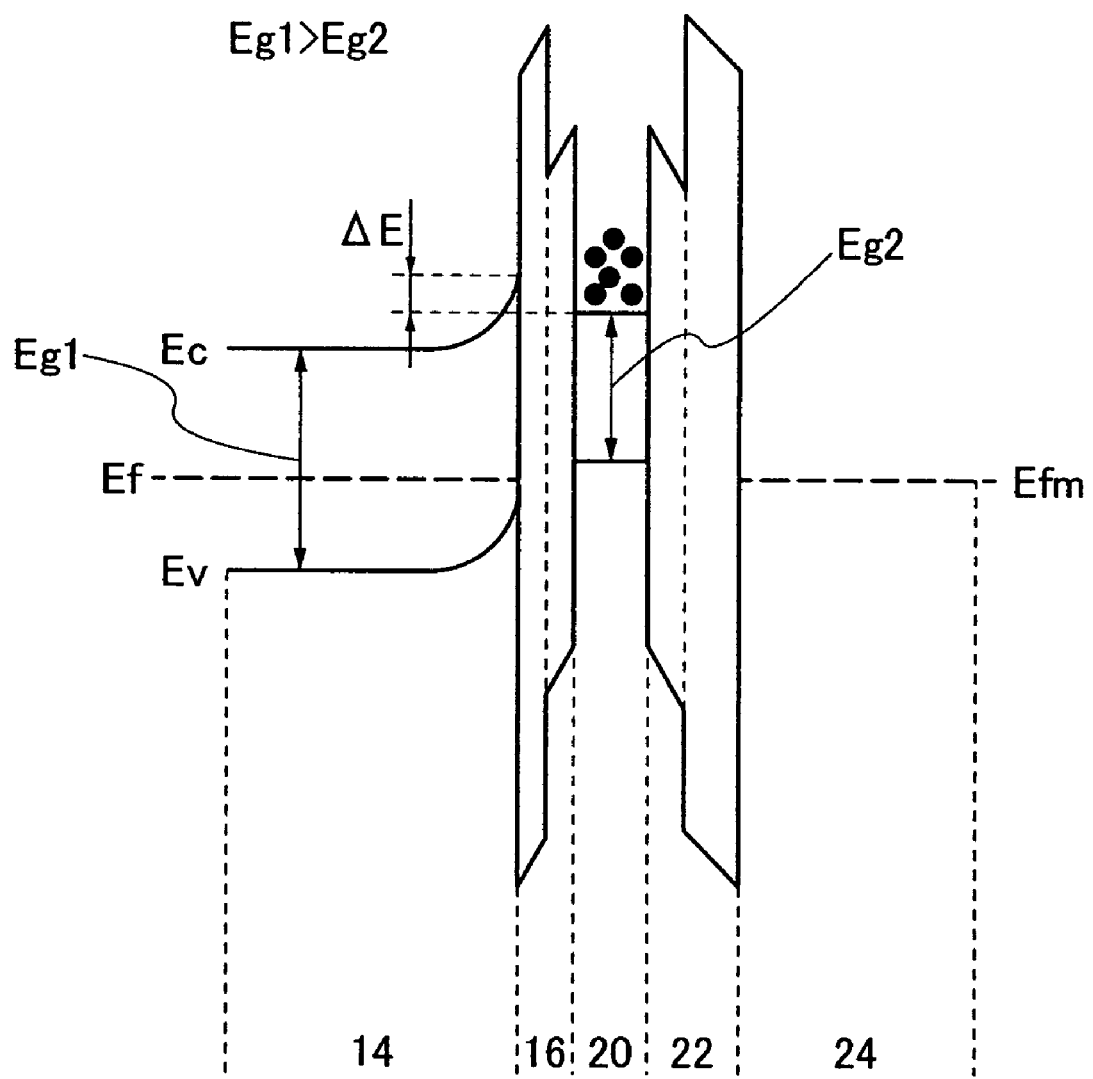
FIG. 14 illustrates a nonvolatile memory used in the present invention.

While electrons are held in the floating gate 20, the threshold voltage of the nonvolatile memory element shifts in the positive direction. This state can be expressed as the state in which data of "0" is written. FIG. 14 shows a band diagram in the state that charges are being held. Electrons in the floating gate 20 are confined in terms of energy by being sandwiched between the first insulating film 16 and the second insulating film 22. Although the potential energy of the floating gate 20 is increased by the carriers (electrons) which have been accumulated in the floating gate 20, electrons will not be released from the floating gate 20 unless energy higher than the barrier energy is given to the electrons. In addition, since the bottom energy level of the conduction band of the floating gate 20 is lower than that of the semiconductor film 14 by an electron energy of ΔE, an energy barrier against electrons is formed by the floating gate 20. With this barrier, electrons can be prevented from flowing out to the semiconductor film 14 due to tunnel current. That is, even when the device is kept at a constant temperature of 150° C., high reliability is ensured, and thus the improved charge holding properties can be obtained.

The data of "0" can be detected by detecting that the nonvolatile memory element is not turned on, using a sense circuit, when a gate voltage which would turn on the nonvolatile memory element is applied under the condition that charges are not held in the floating gate 20. Alternatively, as shown in FIG. 12B, the data of "0" can be detected by judging whether the nonvolatile memory element is turned on or not when a bias is applied between the source region 18a and the drain region 18b and the control gate 24 is set at 0 V.

Figure 15:
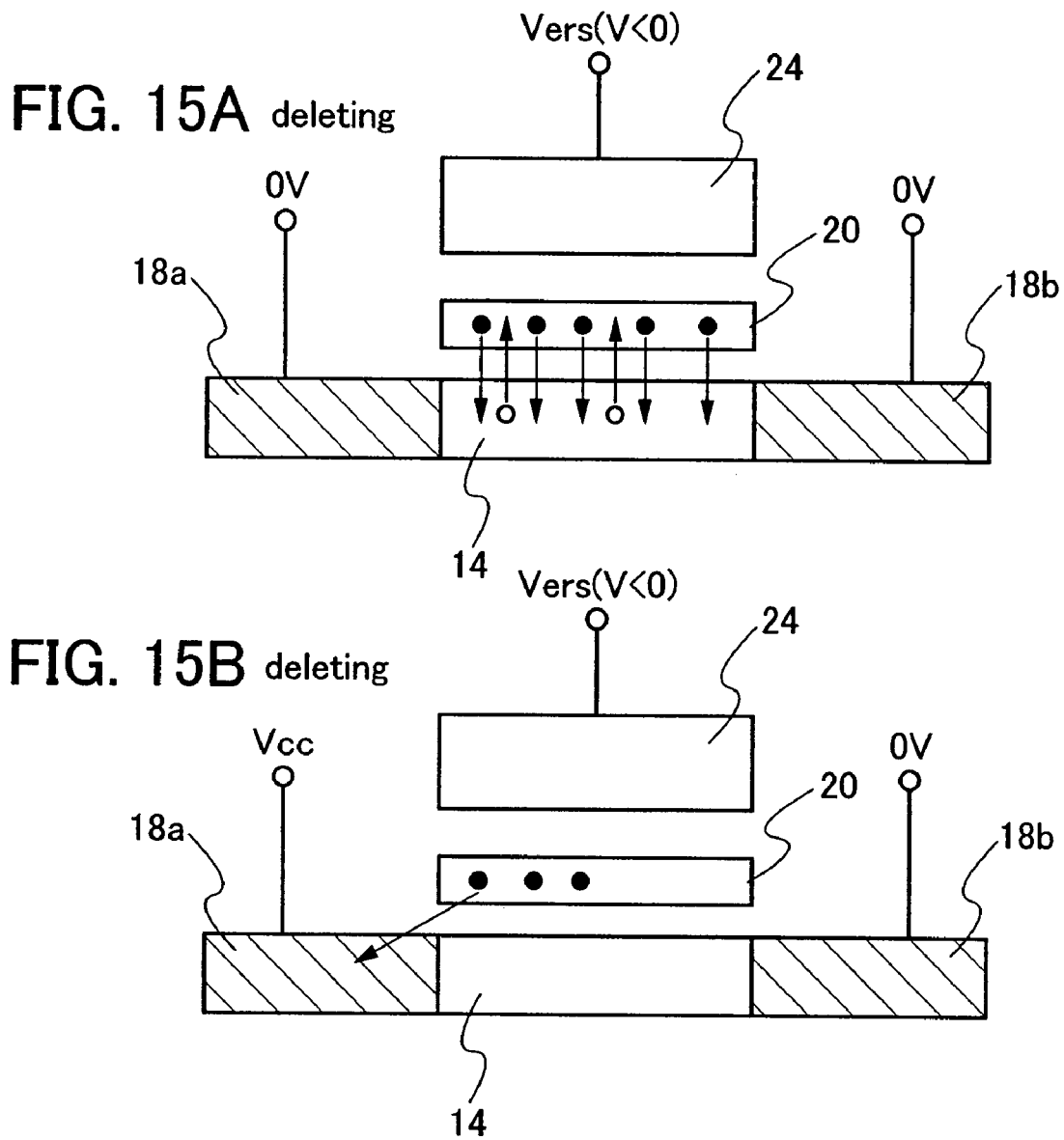
FIGS. 15A and 15B illustrate a nonvolatile memory used in the present invention.

FIG. 15A shows the state that charges are released from the floating gate 20 so that data is deleted from the nonvolatile memory element. In this case, data can be deleted by flowing F-N tunnel current between the semiconductor film 14 and the floating gate 20 by applying a negative bias to the control gate 24. Alternatively, as shown in FIG. 15B, data can be deleted by generating F-N tunnel current and drawing electrons to the source region 18a side by applying a negative bias to the control gate 24 and applying a high positive voltage to the source region 18a.

Figure 16:
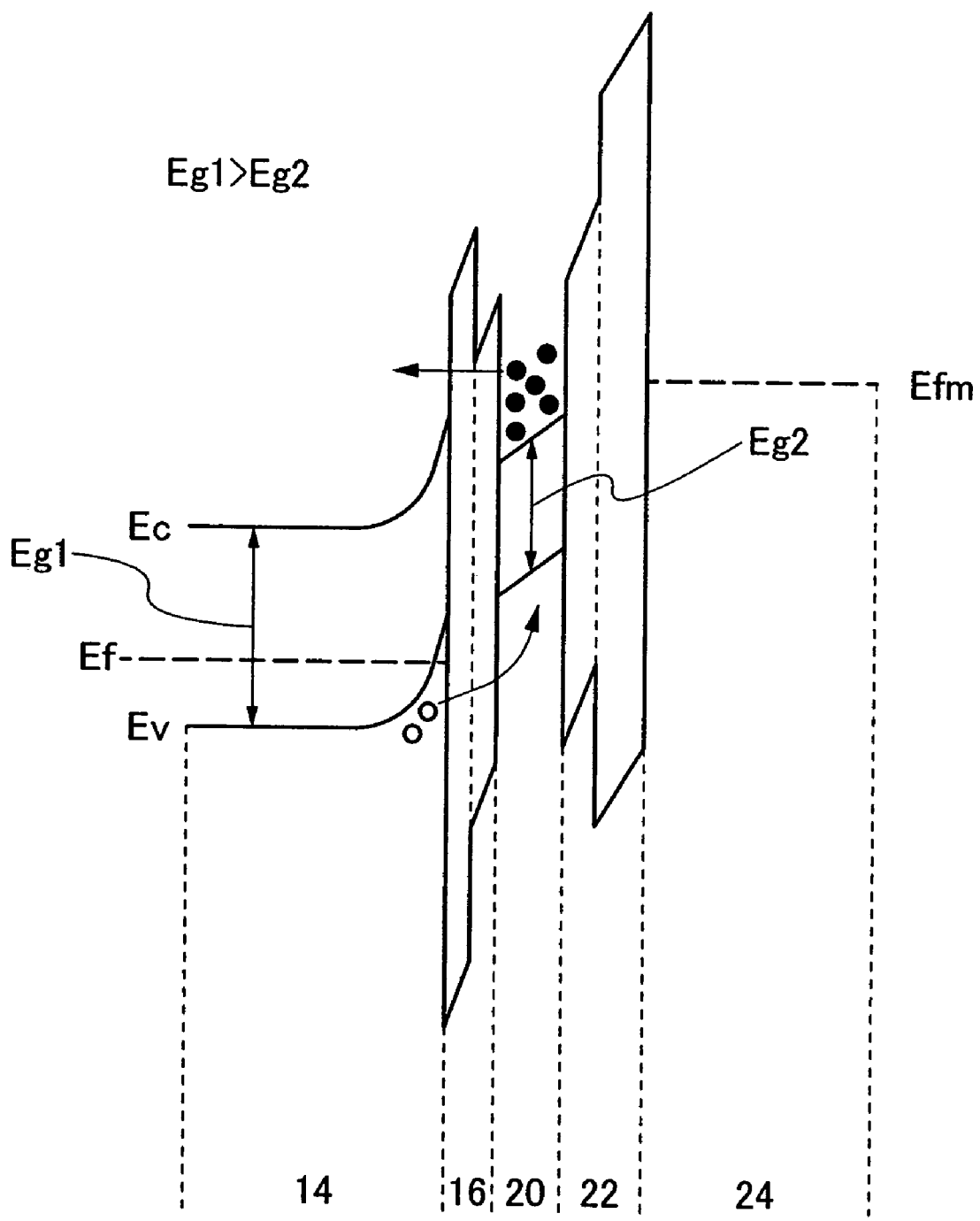
FIG. 16 illustrates a nonvolatile memory used in the present invention.

FIG. 16 is a band diagram showing the deletion state. In the deletion operation, electrons of the floating gate 20 can be released to the semiconductor film 14 side by F-N tunnel current because the first insulating film 16 can be formed to be thin. In addition, since holes can be easily injected from the channel formation region of the semiconductor film 14, a substantial deletion operation can be conducted by injecting holes into the floating gate 20.

When the floating gate 20 is formed with germanium or a germanium compound, the first insulating film 16 can be formed to be thin. Accordingly, injection of charges into the floating gate 20 through the first insulating film 16 by tunnel current can be facilitated, and thus a low voltage drive becomes possible. Furthermore, charges can be held with a low energy level and an advantageous effect that charges can be held stably can be provided.

The nonvolatile memory in accordance with the present invention is formed so that Eg1>Eg2 is satisfied between the semiconductor film 14 and the floating gate 20 and thus a self-bias is generated, as shown in FIGS. 9, 10 and 13. This relationship is quite important because it can facilitate the injection of carriers from the channel formation region of the semiconductor film into the floating gate. That is, the writing voltage can be lowered. Meanwhile, the above relationship makes it difficult for carriers to be released from the floating gate, which is advantageous in that the memory holding properties of the nonvolatile memory element can be improved. Furthermore, by doping the floating gate made of a germanium layer with an n-type impurity, the bottom energy level of the conduction band of the floating gate can be further lowered, and a self-bias can act so that carriers can be easily injected into the floating gate. That is, the writing voltage can be lowered and the memory holding properties of the nonvolatile memory element can be improved.

As described above, the nonvolatile memory element in accordance with the present invention can facilitate the injection of charges from the semiconductor film into the floating gate, and can prevent charges from disappearing from the floating gate. That is, when the nonvolatile memory element in accordance with the present invention operates as a memory, writing can be conducted efficiently with a low voltage, and the charge holding properties can be improved.

This embodiment can be freely implemented in combination with any of the other embodiment modes or embodiments in this specification.

Embodiment 2

In this embodiment, an equivalent circuit diagram of a memory portion in a nonvolatile semiconductor memory device is described with reference to the drawings.

Figure 17:
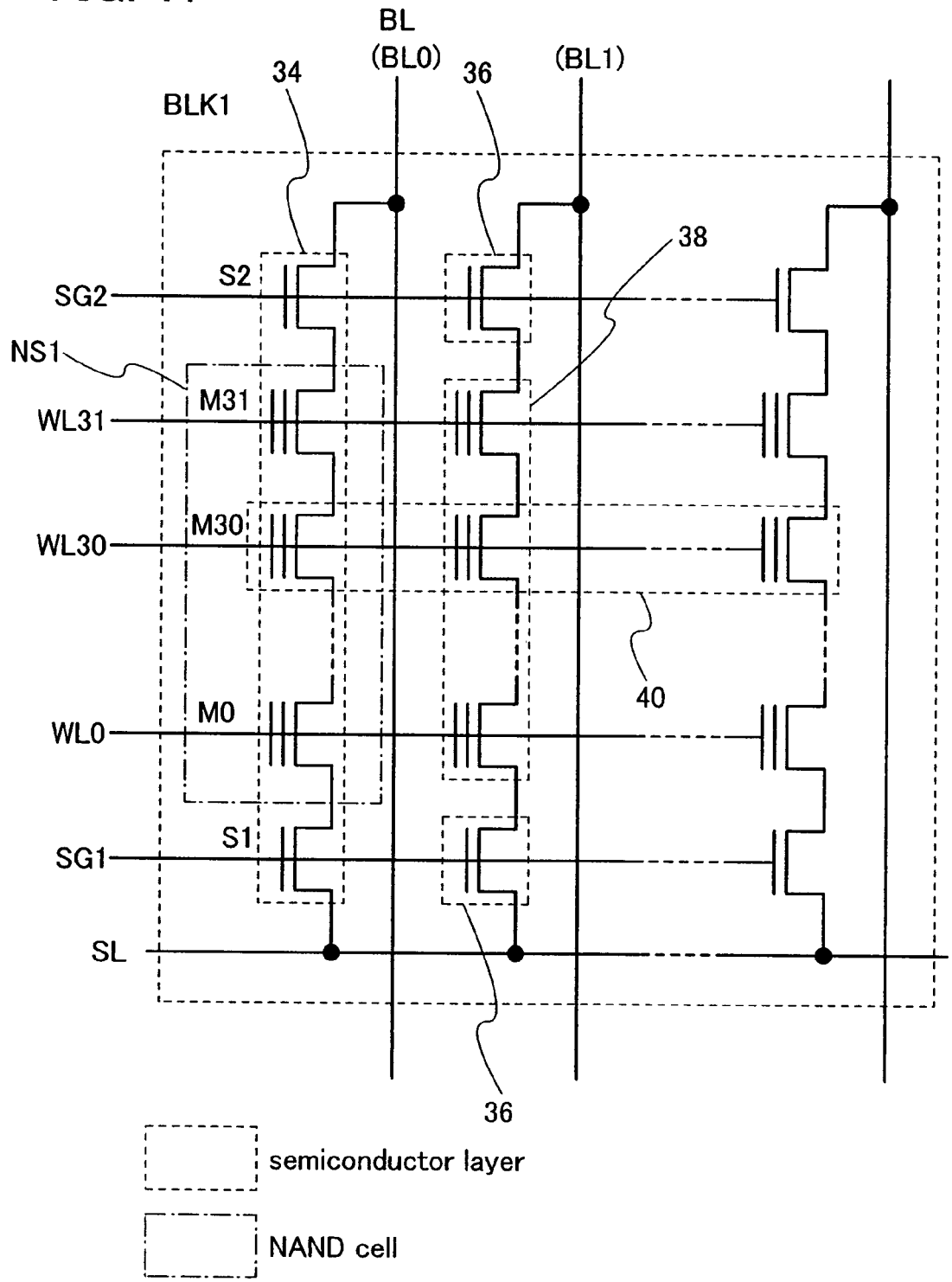
FIG. 17 is a circuit diagram of a nonvolatile memory used in the present invention.

Referring to the equivalent circuit diagram of a memory portion shown in FIG. 17, a NAND-type cell NS1, which includes a plurality of nonvolatile memory elements connected in series, is connected to a bit line BL. A plurality of NAND-type cells form a block BLK. A block BLK1 shown in FIG. 17 has 32 word lines (word lines WL0 to WL31). Nonvolatile memory elements positioned in the same row of the block BLK1 are commonly connected to the word lines of the corresponding row.

In this case, since selection transistors S1 and S2 and nonvolatile memory elements M0 to M31 are connected in series, these elements may be formed together by using one semiconductor film 34. Accordingly, a wire for connecting the nonvolatile memory elements can be omitted, and thus the degree of integration can be increased. Furthermore, isolation of the adjacent NAND-type cells can be conducted easily. It is also possible to separately form a semiconductor film 36 of the selection transistors S1 and S2 and a semiconductor film 38 of the NAND-type cell.

The writing operation is conducted after setting the NAND-type cell NS1 to a deletion state, i.e., the state in which the threshold voltage of each nonvolatile memory element in the NAND-type cell NS1 is set at a negative value. Writing is conducted sequentially starting from the nonvolatile memory element M0 on the source line SL side. Data writing into the nonvolatile memory element M0 is exemplarily described below.

FIG. 18A shows the case of writing "0". The selection transistor S2 is turned on by applying, for example, Vcc (the power supply voltage) to the selection gate line SG2, and the bit line BL is set at 0 V (the ground voltage). The selection transistor S1 is turned off by setting the selection gate line SG1 at 0 V. Next, a word line WL0 connected to the nonvolatile memory element M0 is set at a high voltage of Vpgm (about 20 V), and the other word lines are set at an intermediate voltage of Vpass (about 10 V). Since the voltage of the bit line BL is 0 V, the potential of the channel formation region of the selected nonvolatile memory element M0 is also 0 V. Thus, there is a big potential difference between the word line WL0 and the channel formation region of the nonvolatile memory element M0, and therefore, electrons are injected into the floating gate of the nonvolatile memory element M0 as described above, due to F-N tunnel current. Accordingly, the threshold voltage of the nonvolatile memory element M0 has a positive value (the state in which "0" is written).

On the other hand, in the case of writing "1", the bit line BL is set at, for example, Vcc (the power supply voltage) as shown in FIG. 18B. Since the selection gate line SG2 has a voltage of Vcc, the selection transistor S2 is turned off when the gate voltage thereof is at Vth (a threshold voltage of the selection transistor S2)>Vcc. Therefore, the channel formation region of the nonvolatile memory element M0 is brought into a floating state. Next, when a high voltage of Vpgm (20 V) is applied to the word line WL0 and an intermediate voltage of Vpass (10 V) is applied to the other word lines, the voltage of the channel formation region of the nonvolatile memory element M0 increases from Vcc-Vth to, for example, about 8 V by the capacitive coupling of each word line and the channel formation region. Although the voltage of the channel formation region is increased, there is a small potential difference between the word line WL0 and the channel formation region of the nonvolatile memory element M0 unlike the case of writing "0". Therefore, electron injection into the floating gate of the nonvolatile memory element M0 due to F-N tunnel current is not caused. Therefore, the threshold voltage of the nonvolatile memory element M01 is held at a negative value (the state in which "1" is written).

Figure 19A:
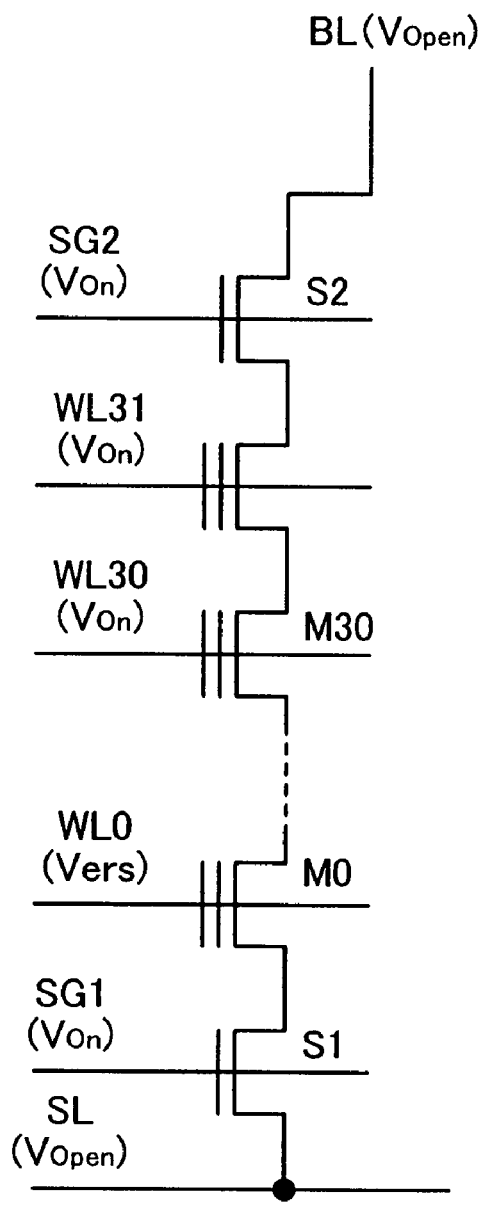
FIGS. 19A and 19B are circuit diagrams of a nonvolatile memory used in the present invention.

In the case of conducting a deletion operation, as shown in FIG. 19A, a high voltage of negative polarity (Vers) is applied to a selected word line (WL0), a voltage Von (for example, 3 V) is applied to the word lines WL of non-selected nonvolatile memory elements, the selection gate line SG1, and the selection gate line SG2, and an open-voltage Vopen (0 V) is applied to the bit line BL and the source line SL. Then, electrons in the floating gate of the selected nonvolatile memory element can be released as described in the above embodiment modes. As a result, the threshold voltage of the selected nonvolatile memory element shifts in the negative direction.

Figure 19B:
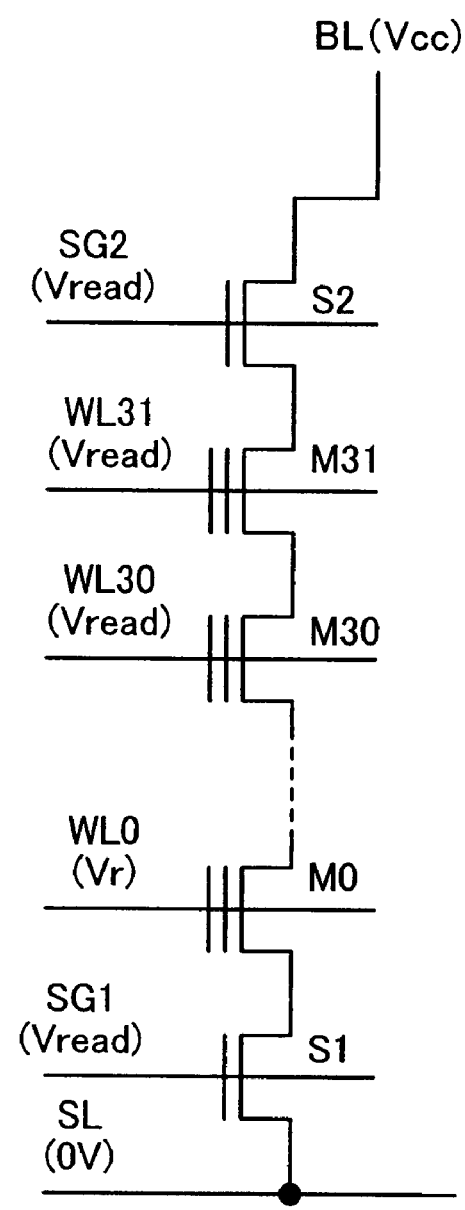
Figure 20:
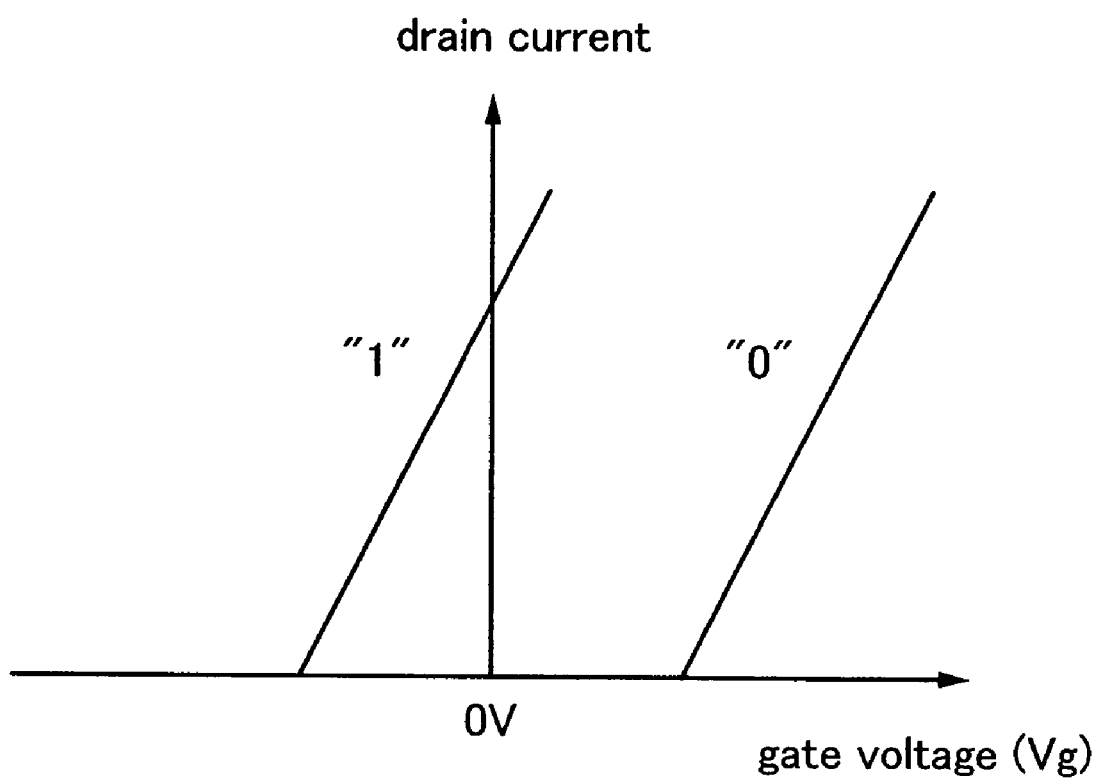
FIG. 20 illustrates a nonvolatile memory used in the present invention.

In the reading operation shown in FIG. 19B, the word line WL0 connected to the nonvolatile memory element M0 which is selected to read out data is set at a voltage Vr (e.g., 0 V), while the word lines WL1 to WL31 connected to the non-selected nonvolatile memory elements and the selection gate lines SG1 and SG2 are set at an intermediate voltage of Vread which is a little higher than the power supply voltage. That is, as shown in FIG. 20, the nonvolatile memory elements other than the selected nonvolatile memory clement function as transfer transistors. Accordingly, it is detected whether a current is flowing into the nonvolatile memory element M0 which is selected to read out data. That is, when data stored in the nonvolatile memory element M0 is "0", the nonvolatile memory element M0 is off; therefore, the bit line BL is not discharged. On the other hand, when data stored in the nonvolatile memory element M0 is "1", the nonvolatile memory element M0 is on; therefore, the bit line BL is discharged.

Figure 31:
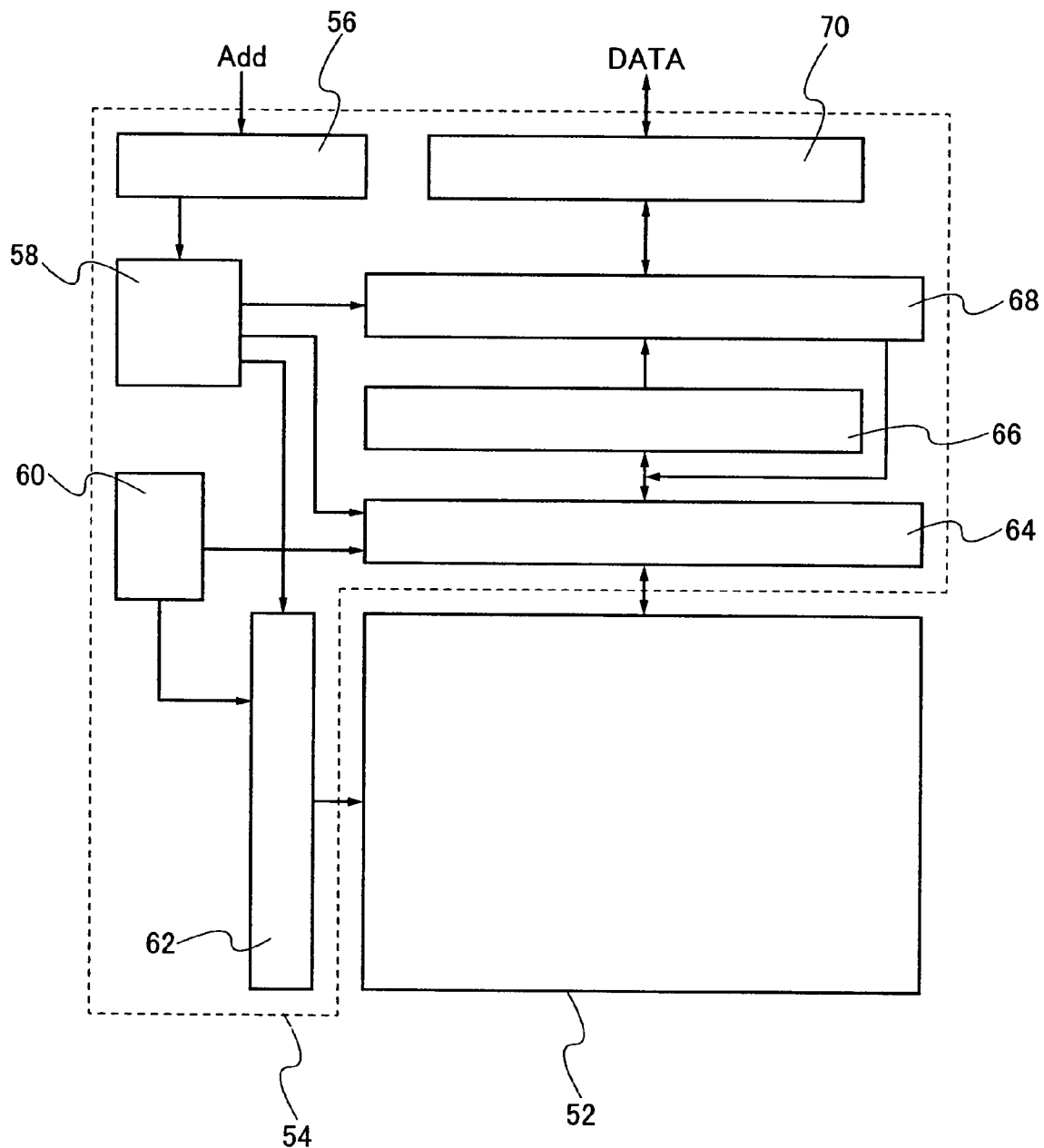
FIG. 31 is a block diagram for illustrating a nonvolatile memory of the present invention.

FIG. 31 shows an example of a circuit block diagram of a nonvolatile semiconductor memory device. In the nonvolatile semiconductor memory device, a memory cell array 52 and a peripheral circuit 54 are formed over the same substrate. The memory cell array 52 has the configuration shown in FIG. 17. The peripheral circuit 54 has the following configuration.

A row decoder 62 for selecting word lines and a column decoder 64 for selecting bit lines are provided around the memory cell array 52. An address is transmitted to a control circuit 58 through an address buffer 56, and an internal row address signal and an internal column address signal are transmitted to the row decoder 62 and the column decoder 64, respectively.

In order to write or delete data, a potential which is obtained by boosting the power supply potential is used. Therefore, a boosting circuit 60 which is controlled by the control circuit 58 according to the operation mode is provided. The output of the boosting circuit 60 is supplied to word lines W and bit lines BL through the row decoder 62 and the column decoder 64, respectively. Data output from the column decoder 64 is input to a sense amplifier 66. Data read out by the sense amplifier 66 is held in a data buffer 68, and the data is randomly accessed by the control of the control circuit 58. Then, the accessed data is output through a data input/output buffer 70. Meanwhile, data to be written is, after being input through the data input/output buffer 70, once held in the data buffer 68, and then transferred to the column decoder 64 by the control of the control circuit 58.

This embodiment can be freely implemented in combination with any of the other embodiment modes or embodiments in this specification.

Embodiment 3

In this embodiment, an example of a nonvolatile semiconductor memory device is described with reference to the drawings. Note that this embodiment shows a nonvolatile semiconductor memory device in which nonvolatile memory elements included in a memory portion and elements such as transistors included in a logic portion, which are formed over the same substrate as the memory portion and control the memory portion, are formed at the same time.

In the equivalent circuit diagram of the memory portion shown in this embodiment, as shown in FIG. 17 described in the preceding embodiment, the NAND-type cell NS1 having the plurality of nonvolatile memory elements M0 to M31 is provided between the selection transistors S1 and S2. In FIG. 17, the selection transistors S1 and S2 and the NAND-type cell NS1 constitute one memory cell.

The gate electrode of the selection transistor S1 is connected to the first selection gate line SG1, and one of the source and drain electrodes of the selection transistor S1 is connected to the source line SL, while the other is connected to the source or drain electrode of the nonvolatile memory element M0. In addition, the gate electrodes of the nonvolatile memory elements M0 to M31 are connected to the word lines WL0 to WL31, respectively. In addition, the gate electrode of the selection transistor S2 is connected to the second selection gate line SG2, and one of the source and drain electrodes of the selection transistor S2 is connected to the bit line BL, while the other is connected to the source or drain electrode of the nonvolatile memory element M31.

Note that the first selection gate line SG1 is a wire for selecting the connection of each memory cell in the memory portion to the source line. In addition, the second gate selection line SG2 is a wire for selecting the column direction of each memory cell in the memory portion.

Note also that the selection transistors provided in the memory portion require a higher driving voltage than the transistors provided in the logic portion; therefore, it is preferable to vary, for example, the thickness of the gate insulating film of the transistors provided in the memory portion and the thickness of the gate insulating film of the transistors provided in the logic portion. For example, in order to obtain transistors with low driving voltage and small variations in threshold voltage, it is preferable to form thin film transistors having a thin gate insulating film. On the other hand, in order to obtain transistors with high driving voltage and a gate insulating film with high dielectric strength, it is preferable to form thin film transistors having a thick gate insulating film.

Accordingly, this embodiment will describe the case of forming a thin insulating film for the transistors in the logic portion, which require a low driving voltage and small variations in threshold voltage, and forming a thick insulating film for the transistors in the memory portion, which require a high driving voltage and high dielectric strength of a gate insulating film, referring to the drawings. Note that FIGS. 25 to 27 are top views and FIGS. 21A to 21C, 22A and 22B, 23A to 23C, and 24A to 24C are cross-sectional views taken along lines A-B, C-D, E-F, and G-H in FIGS. 25 to 27. In addition, a region between A and B and a region between C and D show the transistors provided in the logic portion, a region between E and F shows the nonvolatile memory elements and the transistor provided in the memory portion in the direction in which the bit line extends, and a region between G and H shows the nonvolatile memory element provided in the memory portion in the direction in which the word line extends. Although this embodiment will describe the case where the thin film transistor provided in the region between A and B is a p-channel transistor and the transistors provided in the region between C and D and the region between E and F are n-channel transistors, the nonvolatile semiconductor memory device of the present invention is not limited to these.

First, island-shape semiconductor films 104, 106, and 108, and 110 are formed over a substrate 100 with an insulating film 102 interposed therebetween, and first insulating films 112, 114, 116, and 118 are formed to cover the island-shape semiconductor films 104, 106, 108, and 110, respectively. Then, a charge accumulating layer 120 functioning as the floating gates of the nonvolatile memory elements is formed to cover the first insulating films 112, 114, 116, and 118 (see FIG. 21A). The island-shape semiconductor films 104, 106, 108, and 110 can be provided through the steps of forming an amorphous semiconductor film over the insulating film 102, which has been formed over the substrate 100 in advance, by a sputtering method, a LPCVD method, a plasma CVD method, or the like, using a material containing silicon (Si) as a main component (e.g., $Si_xGe_{1-x}$) or the like; crystallizing the amorphous semiconductor film; and then selectively etching the crystallized semiconductor film. Note that crystallization of the amorphous semiconductor film can be conducted by a laser crystallization method, a thermal crystallization method using rapid thermal annealing (RTA) or an annealing furnace, a thermal crystallization method using a metal element which promotes the crystallization, or a method combining them.

In the case of conducting crystallization or recrystallization of the semiconductor film by laser irradiation, an LD-pumped continuous wave (CW) laser (e.g., YVO$_4$, a second harmonic (wavelength of 532 nm)) can be used as a laser light source. Although the frequency is not specifically limited to the second harmonic, the second harmonic is superior to harmonics higher than that in terms of energy efficiency. When a semiconductor film is irradiated with CW laser, the semiconductor film can be continuously given energy. Therefore, once the semiconductor film is made into a molten state, the molten state can be retained. Furthermore, by scanning the semiconductor film with CW laser, a solid-liquid interface of the semiconductor film can be moved, and crystal grains which are long in one direction can be formed along the moving direction. The reason for using a solid-state laser is to obtain more stable output than by using a gas laser or the like, and thus more stable treatment can be expected. Note that the laser light source is not limited to a CW laser and a pulsed laser with a repetition rate of 10 MHz or higher can also be used. When a pulsed laser with a high repetition rate is used, a semiconductor film can be constantly retained in the molten state on the condition that a pulse interval of laser is shorter than a time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a CO$_2$ laser can be used, or solid-state lasers such as a YAG laser, a YLF laser, a YAlO$_3$ laser, a GdVO$_4$ laser, a KGW laser, a KYW laser, an alexandrite laser, a Ti:sapphire laser, a Y$_2$O$_3$ laser, and a YVO$_4$ laser can be used. In addition, ceramic lasers such as a YAG laser, a Y$_2$O$_3$ laser, a GdVO$_4$ laser, and a YVO$_4$ laser can also be used. As a metal vapor laser, a helium-cadmium laser and the like can be given as examples. Laser beams are preferably emitted from a laser oscillator with TEM$_{00}$ (single transverse mode), which can increase the energy uniformity of a linear beam spot that is obtained on the irradiation surface. Besides, a pulsed excimer laser can also be used.

The substrate 100 can be selected from among a glass substrate, a quartz substrate, a metal substrate (e.g., a stainless steel substrate), a ceramic substrate, and a semiconductor substrate such as a Si substrate. Alternatively, a plastic substrate made of polyethylene terephthalate (PET), polyethylene naphthalate (PEN), polyethersulfone (PES), acrylic, or the like can be used.

The insulating film 102 is formed by a CVD method, a sputtering method, or the like, using an insulating material such as silicon oxide, silicon nitride, silicon oxynitride (SiO$_x$N$_y$), (x>y>0), or silicon nitride oxide (SiN$_x$O$_y$) (x>y>0). For example, when the insulating layer 102 is formed to have a two-layer structure, it is preferable to form a silicon nitride oxide film as a first-layer insulating film, and form a silicon oxynitride film as a second-layer insulating film. Alternatively, it is also possible to form a silicon nitride film as a first-layer insulating film and form a silicon oxide film as a second-layer insulating film. In this manner, formation of the insulating film 102 functioning as a blocking layer can prevent adverse effects of alkali metals such as Na or alkaline earth metals contained in the substrate 100 which would otherwise be diffused into elements formed above the substrate. Note that when quartz is used for the substrate 100, the insulating film 102 may be omitted.

Note that although this embodiment exemplarily shows thin film transistors as the transistors formed using the island-shape semiconductor films over the substrate 100, the present invention is not limited to this example. For example, the substrate 100 can be a single crystalline Si substrate having n-type or p-type conductivity, a compound semiconductor substrate (a GaAs substrate, an InP substrate, a GaN substrate, a SiC substrate, a sapphire substrate, a ZnSe substrate, or the like), an SOI (Silicon on Insulator) substrate formed by a bonding method or a SIMOX (Separation by IMplanted OXygen) method, or the like. Therefore, it is possible to form island-shape semiconductor films using single crystalline silicon and form transistors with the films.

In the case of using a single crystalline Si substrate, a compound semiconductor substrate, or an SOI substrate, an element isolation region can be formed using a LOCOS (LOcal Oxidation of Silicon) method, a trench isolation method, or the like as appropriate. In addition, a p well formed in the semiconductor substrate can be formed by selectively doping the semiconductor substrate with an impurity element having p-type conductivity. As the impurity element having p-type conductivity, boron (B), aluminum (Al), gallium (Ga), or the like can be used.

The first insulating films 112, 114, 116, and 118 can be formed by applying thermal treatment, plasma treatment, or the like to the surfaces of the semiconductor films 104, 106, 108, and 110. For example, the first insulating films 112, 114, 116, and 118 to be oxide films, nitride films, or oxynitride films are formed on the semiconductor films 104, 106, 108, and 110, respectively by oxidizing, nitriding, or oxynitriding the surfaces of the semiconductor films 104, 106, 108, and 110 by high-density plasma treatment. Note that a plasma CVD method or a sputtering method can also be employed.

For example, in the case where oxidation treatment or nitridation treatment is applied to the surfaces of the semiconductor films 104, 106, 108, and 110 which contain silicon as main components by high-density plasma treatment, silicon oxide (SiO$_x$) films or silicon nitride (SiN$_x$) films are formed as the first insulating films 112, 114, 116, and 118. Alternatively, it is also possible to consecutively apply oxidation treatment and nitridation treatment to the surfaces of the semiconductor films 104, 106, 108, and 110 by high-density plasma treatment. In that case, silicon oxide films are formed in contact with the semiconductor films 104, 106, 108, and 110 and films containing oxygen and nitrogen (hereinafter referred to as "silicon oxynitride films") are formed on the silicon oxide films. That is, films each having a stack of the silicon oxide film and the silicon oxynitride film are formed as the first insulating films 112, 114, 116, and 118.

Here, the first insulating films 112, 114, 116, and 118 are formed to a thickness of 1 to 10 nm, preferably 1 to 5 nm. For example, after forming silicon oxide films to a thickness of about 5 nm on the surfaces of the semiconductor films 104, 106, 108, and 110 by applying high-density plasma oxidation treatment to the semiconductor films 104, 106, 108, and 110, high-density plasma nitridation treatment is conducted so that nitrogen-plasma-treated layers are formed on the surfaces of the silicon oxide films or in the vicinity of the surfaces. Specifically, the silicon oxide layer 16a is formed first on the semiconductor film 14 to a thickness of 3 to 6 nm by plasma treatment under an oxygen atmosphere, and then the nitrogen-plasma-treated layer 16b with a high concentration of nitrogen is formed on the surface of the silicon oxide layer 16a or in the vicinity of the surface by plasma treatment under a nitrogen atmosphere. Here, by conducting the plasma treatment under the nitrogen atmosphere, a structure is obtained in which the silicon oxide layer 16a contains 20 to 50 atomic % nitrogen in a region from the surface to a depth of about 1 nm.

In the nitrogen-plasma treated layer, silicon containing oxygen and nitrogen (silicon oxynitride) is formed. At this time, the high-density plasma oxidation treatment and the high-density plasma nitridation treatment are preferably conducted continuously without exposure to the atmosphere. By continuously conducting such high-density plasma treatment, intrusion of contaminants can be prevented and production efficiency can be improved.

Note that in the case of oxidizing the semiconductor film by high-density plasma treatment, the plasma treatment is conducted under an oxygen atmosphere (e.g., an atmosphere containing oxygen ($O_2$) or dinitrogen monoxide ($N_2O$) and a rare gas (at least one of He, Ne, Ar, Kr, and Xe); or an atmosphere containing oxygen or dinitrogen monoxide, and hydrogen ($H_2$) and a rare gas). On the other hand, in the case of conducting nitriding the semiconductor film by high-density plasma treatment, the plasma treatment is conducted under a nitrogen atmosphere (e.g., an atmosphere containing nitrogen ($N_2$) and a rare gas (at least one of He, Ne, Ar, Kr, and Xe); an atmosphere containing nitrogen, hydrogen, and a rare gas; or an atmosphere containing $NH_3$ and a rare gas).

As the rare gas, Ar can be used, for example. Alternatively, a mixed gas of Ar and Kr may also be used. In the case of conducting high-density plasma treatment in a rare gas atmosphere, the first insulating films 112, 114, 116, and 118 may contain the rare gas used for the plasma treatment (at least one of He, Ne, Ar, Kr, and Xe). When Ar is used, the first insulating films 112, 114, 116, and 118 may contain Ar.

The high-density plasma treatment is conducted in the above gas atmosphere with a plasma electron density of $1\times10^{11}$ cm$^{-3}$ or more and a plasma electron temperature of 1.5 eV or less. More specifically, the high-density plasma treatment is conducted with a plasma electron density of $1\times10^{11}$ to $1\times10^{13}$ cm$^{-3}$, and a plasma electron temperature of 0.5 to 1.5 eV. With such high plasma electron density and low plasma electron temperature in the vicinity of the processing object (which corresponds to the semiconductor films 104, 106, 108, and 110, here) formed over the substrate 100, damage on the processing object resulting from the plasma can be prevented. In addition, since the plasma electron density is set as high as $1\times10^{11}$ cm$^{-3}$ or more, an oxide film or a nitride film formed by oxidizing or nitriding the processing object by plasma treatment is superior to a film formed by a CVD method, a sputtering method, or the like in uniformity of the film thickness and the like, and thus a dense film can be formed. Furthermore, since the plasma electron temperature is set as low as 1.5 eV or less, oxidation or nitridation treatment can be conducted at a temperature lower than that of the conventional plasma treatment or thermal oxidation treatment. For example, even when the plasma treatment is conducted at a temperature lower than the strain point of a glass substrate by 100° C. or more, oxidation or nitridation treatment can be sufficiently conducted. As a frequency for generating plasma, high frequency such as microwaves (e.g., 2.45 GHz) can be used.

In this embodiment, in the case of oxidizing a processing object by high-density plasma treatment, a mixed gas of oxygen ($O_2$), hydrogen ($H_2$), and argon (Ar) is introduced. The mixed gas used here may be introduced with an oxygen flow rate of 0.1 to 100 sccm, a hydrogen flow rate of 0.1 to 100 sccm, and an argon flow rate of 100 to 5000 sccm. Note that the mixed gas is preferably introduced with a ratio of oxygen:hydrogen:argon=1:1:100. For example, the mixed gas may be introduced with an oxygen flow rate of 5 sccm, a hydrogen flow rate of 5 sccm, and an argon flow rate of 500 sccm.

In the case of conducting nitridation by high-density plasma treatment, a mixed gas of nitrogen ($N_2$) and argon (Ar) is introduced. The mixed gas used here may be introduced with a nitrogen flow rate of 20 to 2000 sccm and an argon flow rate of 100 to 10000 sccm. For example, the mixed gas may be introduced with a nitrogen flow rate of 200 sccm and an argon flow rate of 1000 sccm.

In this embodiment, the first insulating film 116 formed on the semiconductor film 108 which is provided in the memory portion functions as a tunnel insulating film of a nonvolatile memory element which is completed later. Thus, the thicker the first insulating film 116 is, the easier it will be for tunnel current to flow through the film, and thus higher-speed operation of the memory can be achieved. Meanwhile, the thinner the first insulating film 116 is, the easier it will be for charges to be accumulated in a floating gate which is formed later, with a low voltage, and thus lower power consumption of the nonvolatile semiconductor memory device can be achieved. Therefore, the first insulating films 112, 114, 116, and 118 are preferably formed to be thin.

As a general method for forming a thin insulating film over a semiconductor film, there is a thermal oxidation method. However, when a substrate which does not have a sufficiently high melting point such as a glass substrate is used as the substrate 100, it is quite difficult to form the first insulating films 112, 114, 116, and 118 by a thermal oxidation method. In addition, an insulating film formed by a CVD method or a sputtering method does not have a sufficient film quality due to its internal defects, and has a problem in that defects such as pin holes are produced when the film is formed to be thin. Furthermore, when an insulating film is formed by the CVD method or the sputtering method, the coverage of the end of the semiconductor film is not enough, and there may be a case where a conductive film or the like which is formed over the first insulating film 116 later is shorted to the semiconductor film. Thus, by forming the first insulating films 112, 114, 116, and 118 by high-density plasma treatment as shown in this embodiment, insulating films which are denser than an insulating film formed by a CVD method, a sputtering method, or the like can be formed. Furthermore, the ends of the semiconductor films 104, 106, 108, and 110 may be sufficiently covered with the first insulating films 112, 114, 116, and 118, respectively. As a result, high-speed operation of the memory can be achieved and the charge holding properties can be improved. Note that in the case of forming the first insulating films 112, 114, 116, and 118 by a CVD method or a sputtering method, it is preferable to apply oxidation, nitridation, or oxynitridation treatment to the surfaces of the insulating films by high-density plasma treatment after forming the insulating films.

The charge accumulating layer 120 can be formed using a film of silicon (Si), germanium (Ge), a silicon-germanium alloy, or the like. Note that in this embodiment, it is particularly preferable to form the charge accumulating layer 120 using a film containing germanium such as germanium (Ge) or a silicon-germanium alloy. Here, a film containing germanium as a main component is formed as the charge accumulating layer 120 to a thickness of 1 to 20 nm, preferably 5 to 10 nm by conducting a plasma CVD method under an atmosphere containing a germanium element (e.g., $GeH_4$). As shown in the preceding embodiment, a semiconductor film is formed using a material containing Si as a main component, and a film containing germanium which has a lower energy gap than Si is provided as a charge accumulating layer over the semiconductor film with a first insulating film functioning as the tunnel insulating film interposed therebetween. In this case, a second barrier against charges of the charge accumulating layer, which is formed by the insulating film has higher energy than a first barrier against charges of the semiconductor film, which is formed by the insulating film. As a result, injection of charges into the charge accumulating layer from the semiconductor film can be facilitated, and charges in the charge accumulating layer can be prevented from disappearing. That is, when the nonvolatile memory element of the present invention operates as a memory, highly efficient writing can be conducted with a low voltage, and the charge holding properties can be improved. Furthermore, the charge accumulating layer 120 formed over the semiconductor film 108 which is provided in the memory portion functions as the floating gate of the nonvolatile memory element which is completed later.

Note that the charge accumulating layer 120 may be formed to have either a single layer or a plurality of layers made from silicon nitride, germanium nitride, and/or silicon germanium nitride. When the charge accumulating layer 120 is formed using silicon nitride, germanium nitride, and/or silicon germanium nitride, a plurality of trap levels in the nitride film can be utilized to trap (capture) charges which are injected from the semiconductor film through the tunnel insulating film, even though the nitride film is an insulating film. That is, by forming the charge accumulating layer 120 using silicon nitride, germanium nitride, and/or silicon germanium nitride, charges can be trapped by using the plurality of trap levels. Thus, even when there is a defect in a part of the tunnel insulating film, only a part of the accumulated charges disappears, and thus charges can be continuously trapped. Therefore, the thickness of the tunnel insulating film can be further reduced, and a highly reliable nonvolatile memory element can be obtained in terms of the charge holding properties, which is preferable. Furthermore, by forming the charge accumulating layer 120 using silicon nitride, germanium nitride, and/or silicon germanium nitride, the thickness of the tunnel insulating film can be reduced, which is preferable because the nonvolatile memory element itself can be miniaturized.

Next, the first insulating films 112 and 114 and the charge accumulating layer 120 which are formed over the semiconductor films 104 and 106 are selectively removed, so that the first insulating film 116 and the charge accumulating layer 120 formed over the semiconductor film 108, and the first insulating film 118 and the charge accumulating layer 120 formed over the semiconductor film 110 remain. Here, the semiconductor films 108, and 110, the first insulating film 116, and 118, and the charge accumulating layer 120 provided in the memory portion are selectively covered with a resist, and then the first insulating films 112 and 114 and the charge accumulating layer 120 which are formed over the semiconductor films 104 and 106 are selectively removed by etching (see FIG. 21B).

Next, the semiconductor films 104 and 106 and a part of the charge accumulating layer 120 formed over the semiconductor films 108 and 110 are covered with a resist 122, and a part of the charge accumulating layer 120 that is not covered with the resist 122 is selectively removed by etching, so that the part of the charge accumulating layer 120 remains and charge accumulating layers 121 are formed (see FIG. 21C and FIG. 25).

Figure 22A:
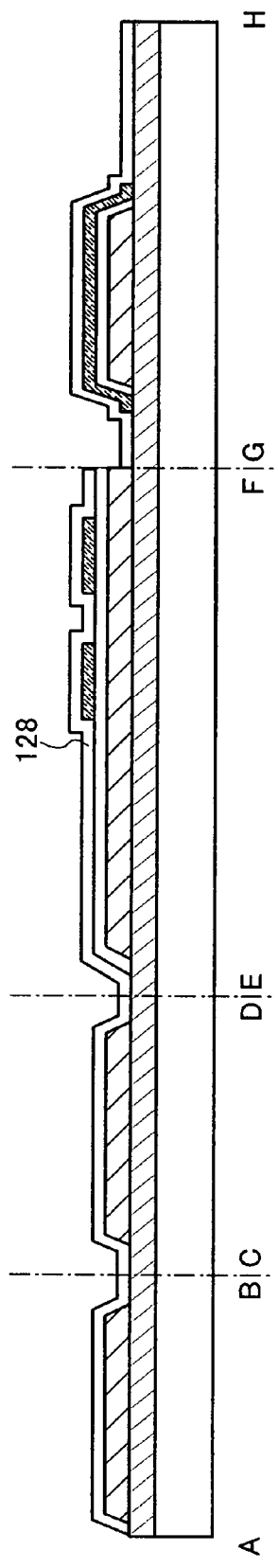
FIGS. 22A and 22B are cross-sectional views of a nonvolatile memory cell used in the present invention.

Next, a second insulating film 128 is formed to cover the semiconductor films 104 and 106 as well as the first insulating films 116 and 118 and the charge accumulating layers 121 which are formed over the semiconductor films 108 and 110 (see FIG. 22A).

The second insulating film 128 is formed to have either a single layer or stacked layers by a CVD method, a sputtering method, or the like, using an insulating material such as silicon oxide, silicon nitride, silicon oxynitride ($SiO_xN_y$) (x>y>0), or silicon nitride oxide ($SiN_xO_y$) (x>y>0). For example, in the case of providing the second insulating film 128 as a single layer, a silicon oxynitride film or a silicon nitride oxide film is formed to a thickness of 5 to 50 nm by a CVD method. Meanwhile, in the case of providing the second insulating film 128 with a three-layer structure, a silicon oxynitride film is formed as a first-layer insulating film, a silicon nitride film is formed as a second-layer insulating film, and a silicon oxynitride film is formed as a third-layer insulating film. Alternatively, the second insulating film 128 can be formed using oxide or nitride of germanium. As a further alternative, the second insulating film 128 can be formed using a material with a higher dielectric constant than that of the first insulating film, such as a film containing aluminum oxide ($AlO_x$), hafnium oxide ($HfO_x$), or tantalum oxide ($TaO_x$).

Note that the second insulating film 128 formed over the semiconductor film 108 functions as a control insulating film of the nonvolatile memory element which is completed later, and the second insulating film 128 formed over the semiconductor film 110 functions as the gate insulating film of the nonvolatile memory element which is completed later.

Figure 22B:
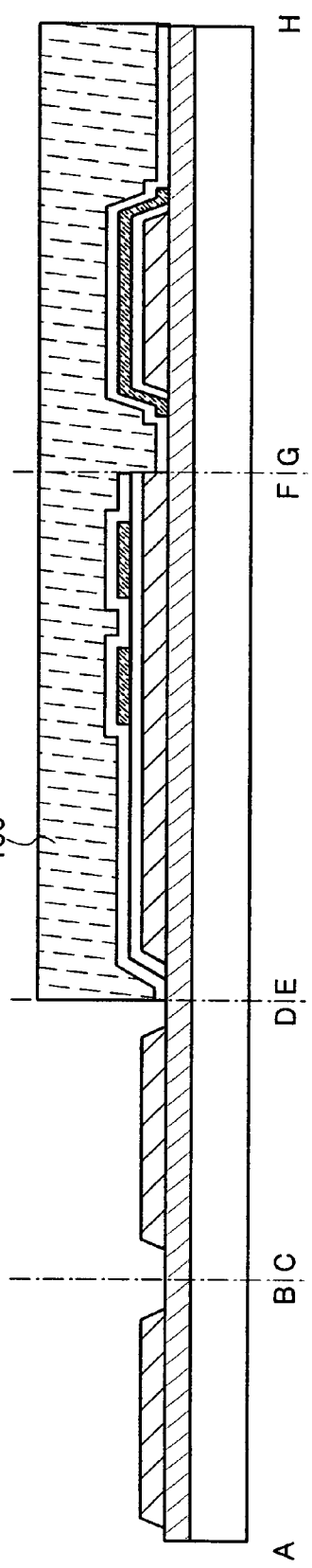

Next, a resist 130 is selectively formed to cover the second insulating film 128 which is formed over the semiconductor films 108 and 110, and then the second insulating film 128 formed over the semiconductor films 104 and 106 are selectively removed by etching (see FIG. 22B).

Next, third insulating films 132 and 134 are formed to cover the semiconductor films 104 and 106, respectively (see FIG. 23A).

The third insulating films 132 and 134 are formed by using any of the above-described methods for forming the first insulating films 112, 114, 116, and 118. For example, by applying oxidation, nitridation, or oxynitridation treatment to the surfaces of the semiconductor films 104 and 106 by high-density plasma treatment, the third insulating films 132 and 134, each of which is made of a silicon oxide film, a silicon nitride film, or a silicon oxynitride film, are formed on the semiconductor films 104 and 106, respectively.

Here, the third insulating films 132 and 134 are formed to a thickness of 1 to 20 nm, preferably 1 to 10 nm. For example, after forming silicon oxide films on the surfaces of the semiconductor films 104 and 106 by high-density plasma oxidation treatment, high-density plasma nitridation treatment is conducted so that nitrogen-plasma-processed layers are formed on the surfaces of the silicon oxide films or in the vicinity of the surfaces. In this case, the surface of the second insulating film 128 formed over the semiconductor film 108 is also oxidized or nitrided, so that an oxide film or an oxynitride film is formed. The third insulating films 132 and 134 formed over the semiconductor films 104 and 106 function as the gate insulating films of the transistors which are completed later.

Next, a conductive film is formed so as to cover the third insulating films 132 and 134 formed over the semiconductor films 104 and 106 as well as the second insulating film 128 formed over the semiconductor film 108 (see FIG. 23B). Here, an example is shown where a conductive film 136 and a conductive film 138 are sequentially stacked as the conductive film. Needless to say, the conductive film may be formed to have a single layer or a stacked structure with more than two layers.

The conductive films 136 and 138 can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. It is also possible to use a metal nitride film which is formed by nitriding the above element. Furthermore, it is also possible to use a semiconductor material typified by polysilicon which is doped with an impurity element such as phosphorus.

Here, a stacked structure is employed such that the conductive film 136 is formed using tantalum nitride, and the conductive film 138 is formed thereover using tungsten. Alternatively, it is also possible to form the conductive film 136 as a single layer or a stacked film, using tungsten nitride, molybdenum nitride, and/or titanium nitride, and form the conductive film 138 as a single layer or a stacked film, using tantalum, molybdenum, and/or titanium.

Next, the stacked conductive films 136 and 138 are selectively removed by etching, so that the conductive films 136 and 138 partially remain over the semiconductor films 104, 106, 108, and 110. As a result, conductive films 140, 142, 144, and 146 functioning as gate electrodes are formed (see FIG. 23C and FIG. 26). Note that the conductive films 144 formed over the semiconductor film 108 which is provided in the memory portion function as the control gates of the nonvolatile memory elements which are completed later. Meanwhile, the conductive films 140, 142, and 146 function as the gate electrodes of the transistors which are completed later.

Next, a resist 148 is selectively formed to cover the semiconductor film 104, and the semiconductor films 106 and 108 are doped with an impurity element by using the resist 148 and the conductive films 142, 144, and 146 as masks, thereby forming impurity regions (see FIG. 24A). As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

In FIG. 24A, by doping the semiconductor film 106 and the semiconductor film 108 with an impurity element, an impurity region 152 for forming a source region or a drain region, and a channel formation region 150 are formed in the semiconductor film 106, while a high concentration impurity region 156 for forming a source region or a drain region, a low concentration impurity region 158 for forming an LDD (Lightly Doped Drain) region, and a channel formation region 154 are formed in the semiconductor film 108. In addition, an impurity region 162 for forming a source region or a drain region and a channel formation region 160 are also formed in the semiconductor film 108.

The low concentration impurity region 158 formed in the semiconductor film 108 is made from the impurity element which has been introduced in FIG. 24A and has passed through the charge accumulating region 121 functioning as the floating gate. Thus, the channel formation region 154 is formed in a part of the semiconductor film 108 which overlaps with both the conductive film 144 and the charge accumulating layer 121; the low concentration impurity region 158 is formed in a part of the semiconductor film 108 which overlaps with the charge accumulating layer 121 but does not overlap with the conductive film 144; and the high concentration impurity region 156 is formed in a part of the semiconductor film 108 which overlaps with neither the charge accumulating layer 121 nor the conductive film 144.

Note that it is also possible to vary the size or the position of the charge accumulating layer 121 and the conductive film 144. This is preferable in that the doping process of the semiconductor film of the nonvolatile memory element with an n-type impurity element or a p-type impurity element can be selectively conduced and also the concentration of the impurity element can be selectively varied.

Next, a resist 166 is selectively formed to cover the semiconductor films 106, 108, and 110, and the semiconductor film 104 is doped with an impurity element using the resist 166 and the conductive film 140 as masks, so that an impurity region is formed (see FIG. 24B). As the impurity element, either an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, an impurity element (e.g., boron (B)), which has a different conductivity type from the impurity element introduced into the semiconductor films 106 and 108 in FIG. 24A, is used. As a result, an impurity region 170 for forming a source region or a drain region and a channel formation region 168 are formed in the semiconductor film 104.

Next, insulating films 172 are formed to cover the second insulating film 128, the third insulating films 132 and 134, and the conductive films 140, 142, 144, and 146. Then, conductive films 174 are formed over the insulating films 172, which are electrically connected to the impurity regions 152, 162, and 170 formed in the semiconductor films 104, 106, and 108 (see FIG. 24C and FIG. 27).

The insulating film 172 can be formed to have either a single-layer structure or a stacked structure by a CVD method, a sputtering method, or the like, using an insulating film containing oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as DLC (diamond-like carbon); organic material such as epoxy, polyimide, polyamide, polyvinyl phenol, benzocyclobutene, or acrylic; or a siloxane material such as a siloxane resin. Note that a siloxane material corresponds to a material having a Si—O—Si bond. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

The conductive film 174 is formed to have either a single-layer structure or a stacked structure by a CVD method, a sputtering method, or the like, using an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material containing aluminum as a main component and also containing nickel, or an alloy material containing aluminum as a main component and also containing nickel and one or both of carbon and silicon. The conductive film 174 is preferably formed to have a stacked structure of a barrier film, an aluminum silicon (Al—Si) film, and a barrier film, or a stacked structure of a barrier film, an aluminum silicon (Al—Si) film, a titanium nitride (TiN) film, and a barrier film. Note that the barrier film corresponds to a thin film made of titanium, titanium nitride, molybdenum, or molybdenum nitride. Aluminum and aluminum silicon, which have a low resistance value and are inexpensive, are most suitable for the material of the conductive film 174. In addition, by providing the barrier layers in the top layer and the bottom later, generation of hillocks of aluminum or aluminum silicon can be prevented. Furthermore, when a barrier film made of titanium which is an element having an excellent reducing property is used, even if a thin natural oxide film is formed on the crystalline semiconductor film, the natural oxide film can be chemically reduced and an excellent contact between the barrier film and the crystalline semiconductor film can be obtained.

This embodiment can be freely implemented in combination with any of the other embodiment modes or embodiments in this specification.

Embodiment 4

This embodiment will describe examples of the application of a semiconductor device which is provided with the nonvolatile semiconductor memory device of the present invention and is capable of wireless data communication, with reference to the drawings. A semiconductor device capable of wireless data communication is also called an RFID tag, an ID tag, an IC tag, an IC chip, an RF tag, a wireless tag, an electronic tag, or a wireless chip depending on the use application.

Figure 28A:
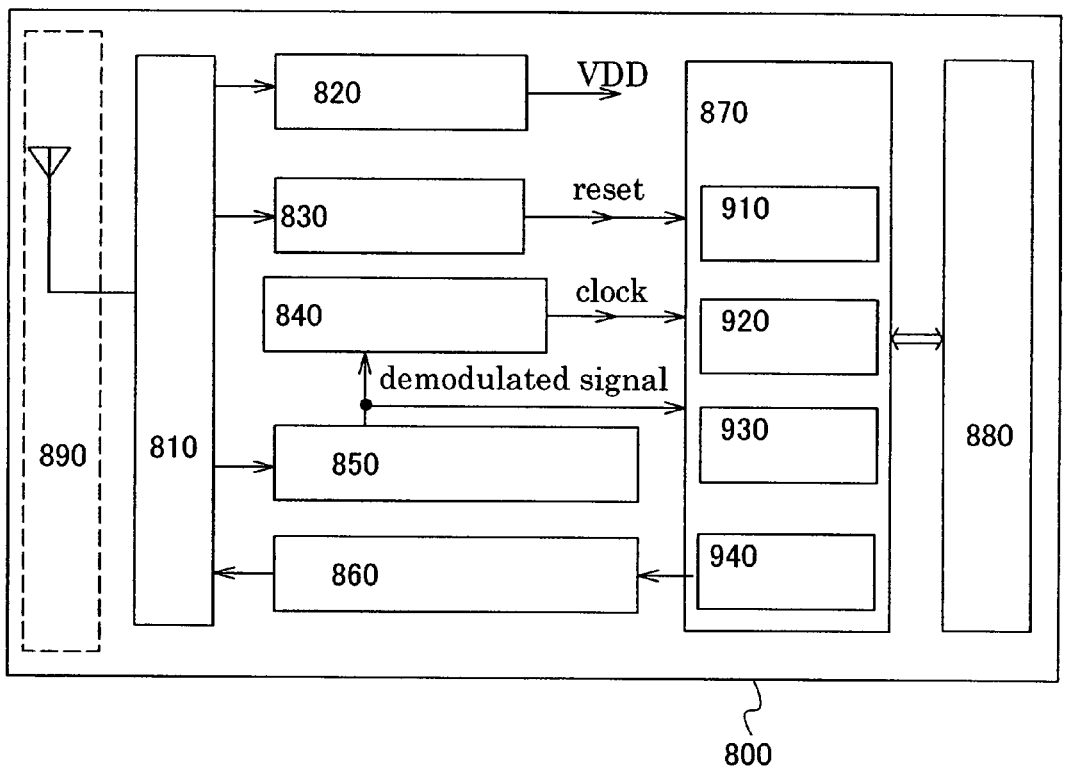
FIGS. 28A to 28C illustrate semiconductor devices each having a nonvolatile memory used in the present invention.

A semiconductor device 800 has a function of wireless data communication, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 28A). The high-frequency circuit 810 is a circuit which receives signals from the antenna 890, and outputs signals which have been received from the data modulation circuit 860 to the antenna 890; the power supply circuit 820 is a circuit which generates power supply potentials from signals received; the reset circuit 830 is a circuit which generates reset signals; the clock generation circuit 840 is a circuit which generates various clock signals based on the signals input from the antenna 890; the data demodulation circuit 850 is a circuit which demodulates the signals received and outputs them to the control circuit 870; and the data modulation circuit 860 is a circuit which modulates the signals received from the control circuit 870. In addition, the control circuit 870 includes a code extraction circuit 910, a code judging circuit 920, a CRC judging circuit 930, and an output unit circuit 940. Note that the code extraction circuit 910 is a circuit which extracts a plurality of codes included in the instructions transmitted to the control circuit 870; the code judging circuit 920 is a circuit which judges the content of the instructions by comparing the extracted code with a reference code; and the CRC judging circuit 930 is a circuit which detects the presence of transmission errors or the like based on the judged code.

Next, an example of the operation of the above semiconductor device is described. First, the antenna 890 receives a radio signal. When the radio signal is transmitted to the power supply circuit 820 through the high-frequency circuit 810, the power supply circuit 820 generates a high power supply potential (hereinafter referred to as VDD). VDD is supplied to each circuit included in the semiconductor device 800. In addition, a signal transmitted to the data demodulation circuit 850 through the high-frequency circuit 810 is demodulated (hereinafter the signal is referred to as a demodulated signal). Furthermore, a signal transmitted to the reset circuit 830 through the high-frequency circuit 810 and the demodulated signal which have passed through the clock generation circuit 840 are transmitted to the control circuit 870. The signals transmitted to the control circuit 870 are analyzed by the code extraction circuit 910, the code judging circuit 920, the CRC judging circuit 930, and the like. Then, data on the semiconductor device which is stored in the memory circuit 880 is output in response to the analyzed signal. The output data of the semiconductor device is encoded in the output unit circuit 940. Furthermore, the encoded data of the semiconductor device 800 is modulated in the data modulation circuit 860, and transmitted as a radio signal through the antenna 890. Note that the low power supply potential (hereinafter referred to as VSS) is common to the plurality of circuits included in the semiconductor device 800; therefore, GND can be used as the VSS. In addition, the nonvolatile semiconductor memory device of the present invention can be applied to the memory circuit 880. The nonvolatile semiconductor memory device of the present invention can reduce the driving voltage; therefore, the wireless communication distance of data can be increased.

In this manner, by communicating signals between the semiconductor device 800 and a reader/writer, data on the semiconductor device can be read out.

The semiconductor device 800 may be either of a type where power supply to each circuit is conducted by rectifying and smoothing electromagnetic waves, or of a built-in battery type where the battery is charged with electromagnetic waves so as to supply power to each circuit.

Figure 28B:
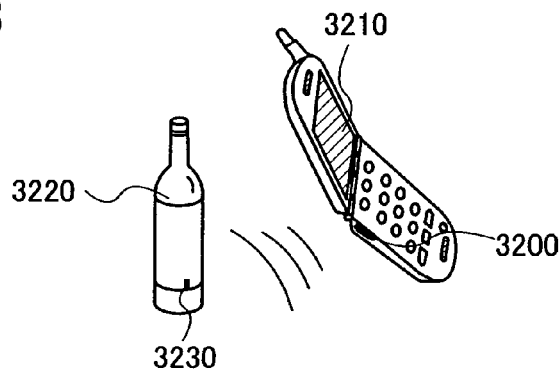
Figure 28C:
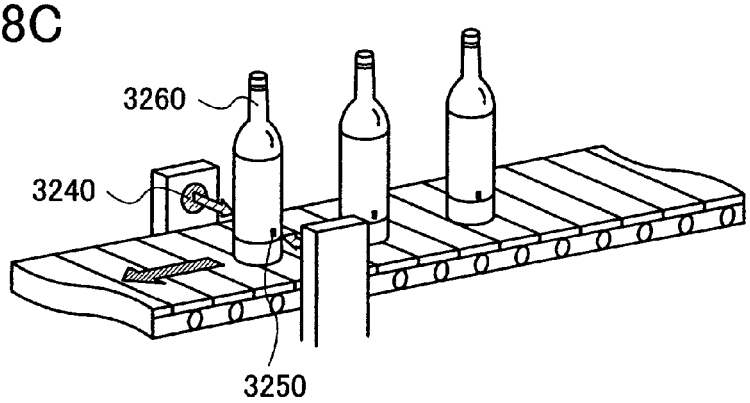

Next, examples of the application of the semiconductor device which can perform wireless data communication are described. A side surface of a portable terminal which includes a display portion 3210 is provided with a reader/writer 3200, and a side surface of a product 3220 is provided with a semiconductor device 3230 (FIG. 28B). When the reader/writer 3200 is put close to the semiconductor device 3230 attached to the product 3220, data on the raw material or source of the product, inspection result in each production step, history of the distribution process, product description, and the like is displayed on the display portion 3210. In addition, when carrying a product 3260 on a belt conveyor, inspection of the product 3260 can be conducted by using a reader/writer 3240 and a semiconductor device 3250 which is attached to the product 3260 (FIG. 28C). In this manner, by using the semiconductor device for a system, data acquisition can be easily conducted, and thus a higher function and higher added value can be realized.

The nonvolatile semiconductor memory device of the present invention can be applied to various fields of electronic devices having memories. For example, the nonvolatile semiconductor memory device of the present invention can be applied to electronic devices such as cameras (e.g., video cameras or digital cameras), goggle displays (e.g., head mounted displays), navigation systems, audio reproducing apparatuses (e.g., car audio or audio component sets), computers, game machines, portable information terminals (e.g., mobile computers, mobile phones, portable game machines, or electronic books), image reproducing devices provided with storage media (specifically, a device for reproducing the content of a storage medium such as a DVD (Digital Versatile Disc) and having a display for displaying the reproduced image), and the like. FIGS. 29A to 29E show specific examples of such electronic devices.

Figure 29A:
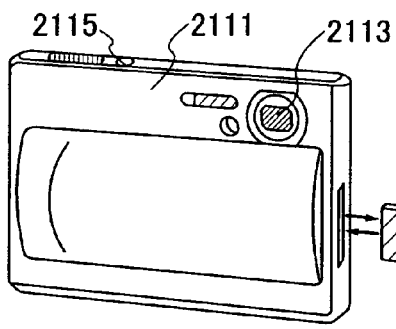
FIGS. 29A to 29E illustrate electronic devices each having a nonvolatile memory used in the present invention.
Figure 29B:
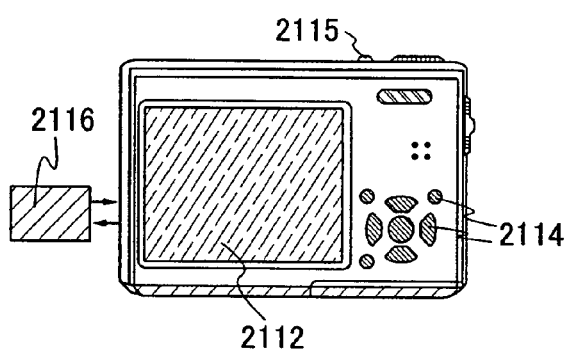

FIGS. 29A and 29B show digital cameras. FIG. 29B shows a rear side of FIG. 29A. This digital camera includes a housing 2111, a display portion 2112, a lens 2113, operating keys 2114, a shutter 2115, and the like. In addition, the digital camera also includes a removable nonvolatile memory 2116, and data picked up by the digital camera is stored in the memory 2116. When a nonvolatile semiconductor memory device is used for the memory 2116, the method for deleting data from a NAND-type nonvolatile memory of the present invention can be applied.

Figure 29C:
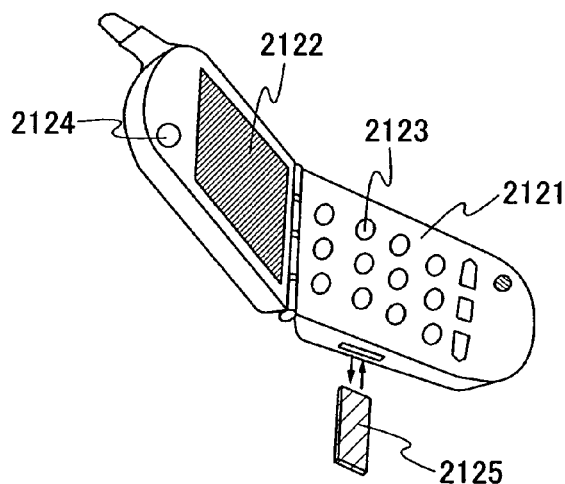

FIG. 29C shows a mobile phone which is one typical example of a portable terminal. This mobile phone includes a housing 2121, a display portion 2122, operating keys 2123, and the like. In addition, the mobile phone also includes a removable nonvolatile memory 2125, and data such as the phone number of the mobile phone, image data, audio data, and the like can be stored in the memory 2125 and reproduced. When a nonvolatile semiconductor memory device is used for the memory 2125, the method for deleting data from a NAND-type nonvolatile memory of the present invention can be applied.

Figure 29D:
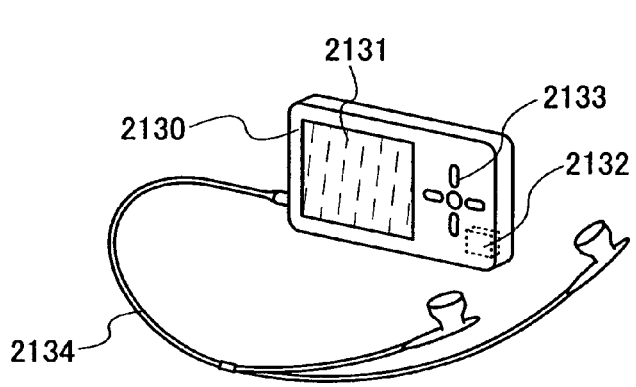

FIG. 29D shows a digital player which is one typical example of an audio device. The digital player shown in FIG. 29D includes a main body 2130, a display portion 2131, a memory portion 2132, operating portions 2133, a pair of earphones 2134, and the like. Note that instead of the pair of earphones 2134, headphones or wireless earphones can be used. When a nonvolatile semiconductor memory device is used for the memory portion 2132, the method for deleting data from a NAND-type nonvolatile memory of the present invention can applied. In addition, by using a NAND-type nonvolatile memory with a storage capacity of 20 to 200 gigabytes (GB), and operating the operating portions 2133, images or audio (music) can be recorded and reproduced. Note that by displaying white text on a black background of the display portion 2131, power consumption can be suppressed. This is particularly effective for the portable audio device. Note also that the nonvolatile semiconductor memory device provided in the memory portion 2132 may be removable.

Figure 29E:
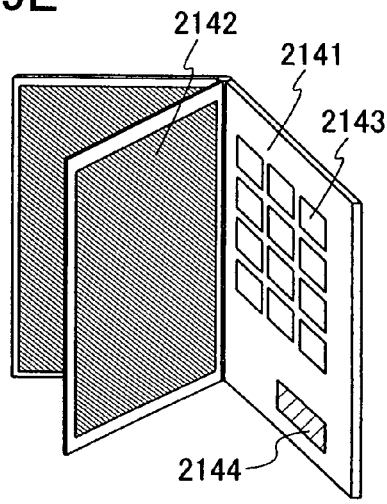
Figure 30:
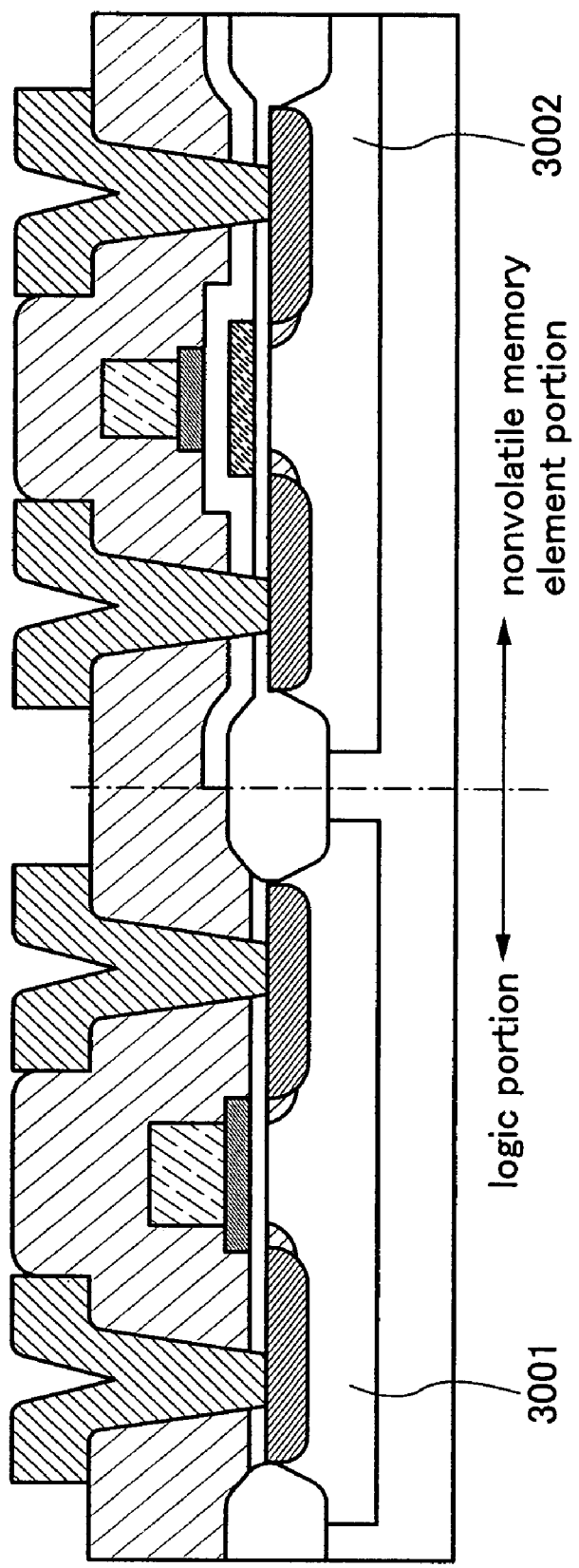
FIG. 30 is a cross-sectional view of a conventional nonvolatile memory.

FIG. 29E shows an electronic book (also called electronic paper). This electronic book includes a main body 2141, a display portion 2142, operating keys 2143, and a memory portion 2144. In addition, a modem may be incorporated in the main body 2141, or a structure capable of wireless data transmission/reception may be employed. When a nonvolatile semiconductor memory device is used for the memory 2144, the method for deleting data from a NAND-type nonvolatile memory of the present invention can be applied. In addition, by using a NAND-type nonvolatile memory with a storage capacity of 20 to 200 gigabytes (GB), and controlling the operating keys 2143, images or audio (music) can be recorded and reproduced. Note that the nonvolatile semiconductor memory device provided in the memory portion 2144 may be removable.

As described above, the applicable range of the method for deleting data from a NAND-type nonvolatile memory of the present invention is so wide that the method can be applied to various fields of electronic devices having memories.

Note that this embodiment can be freely implemented in combination with any of the other embodiment modes or embodiments in this specification.

The present application is based on Japanese Priority application No. 2006-101219 filed on Mar. 31, 2006 with the Japanese Patent Office, the entire contents of which are hereby incorporated by reference.

What is claimed is:

1. A method for deleting data from a NAND-type nonvolatile memory which includes a bit line, a source line, a NAND-type cell including first and second nonvolatile memory elements connected in series, and a selection transistor,
   wherein each of the first and second nonvolatile memory elements includes a semiconductor film, a charge accumulating layer formed over the semiconductor film with a tunnel insulating film interposed therebetween, and a control gate formed over the charge accumulating layer with an insulating film interposed therebetween;
   wherein one of terminals of the NAND-type cell is connected to the bit line through the selection transistor; and
   wherein the other terminal of the NAND-type cell is connected to the source line,
   the method comprising the step of:
   releasing a charge stored in the charge accumulating layer of the first nonvolatile memory element, by applying a first potential to the bit line and the source line, a second potential to the control gate of the first nonvolatile memory element, and a third potential which is different from the second potential to the control gate of the second nonvolatile memory element.

2. The method for deleting data from a NAND-type nonvolatile memory according to claim 1, wherein the charge accumulating layer is formed from a material containing germanium.

3. The method for deleting data from a NAND-type nonvolatile memory according to claim 1, wherein the charge accumulating layer is formed from a material containing a nitride including silicon and germanium.

4. The method for deleting data from a NAND-type nonvolatile memory according to claim 1, wherein the semiconductor film comprises a semiconductor substrate.

5. The method for deleting data from a NAND-type nonvolatile memory according to claim 1, wherein the semiconductor film comprises an SOI substrate.

6. A method for deleting data from a NAND-type nonvolatile memory which includes a bit line, a source line, a NAND-type cell including first and second nonvolatile memory elements connected in series, and a selection transistor,
   wherein each of the first and second nonvolatile memory elements includes a semiconductor film, a charge accumulating layer formed over the semiconductor film with a tunnel insulating film interposed therebetween, and a control gate formed over the charge accumulating layer with an insulating film interposed therebetween;
   wherein one of terminals of the NAND-type cell is connected to the bit line through the selection transistor; and
   wherein the other terminal of the NAND-type cell is connected to the source line,
   the method comprising the step of:
   releasing a charge stored in the charge accumulating layer of the first nonvolatile memory element, by applying a first potential to a source terminal and a drain terminal of the first nonvolatile memory element, a second potential to the control gate of the first nonvolatile memory element, and a third potential which is different from the second potential to the control gate of the second nonvolatile memory element.

7. The method for deleting data from a NAND-type nonvolatile memory according to claim 6, wherein the charge accumulating layer is formed from a material containing germanium.

8. The method for deleting data from a NAND-type nonvolatile memory according to claim 6, wherein the charge accumulating layer is formed from a material containing a nitride including silicon and germanium.

9. The method for deleting data from a NAND-type nonvolatile memory according to claim 6, wherein the semiconductor film comprises a semiconductor substrate.

10. The method for deleting data from a NAND-type nonvolatile memory according to claim 6, wherein the semiconductor film comprises an SOI substrate.

11. A method for deleting data from a NAND-type nonvolatile memory which includes a bit line, a source line, a first NAND-type cell including first and second nonvolatile memory elements connected in series, a second NAND-type cell including third and fourth nonvolatile memory elements connected in series, a first selection transistor, and a second selection transistor, wherein each of the first, second, third, and fourth nonvolatile memory elements includes a semiconductor film, a charge accumulating layer formed over the semiconductor film with a tunnel insulating film interposed therebetween, and a control gate formed over the charge accumulating layer with an insulating film interposed therebetween;

wherein one of terminals of the first NAND-type cell is connected to the bit line through the first selection transistor;

wherein the other terminal of the first NAND-type cell is connected to the source line;

wherein one of terminals of the second NAND-type cell is connected to the bit line through the second selection transistor; and wherein the other terminal of the second NAND-type cell is connected to the source line, the method comprising the step of:

releasing charges stored in the charge accumulating layers of the first and third nonvolatile memory elements, by applying a first potential to the bit line and the source line, a second potential to the control gates of the first and third nonvolatile memory elements, and a third potential which is different from the second potential to the control gates of the second and fourth nonvolatile memory elements.

12. The method for deleting data from a NAND-type nonvolatile memory according to claim 11, wherein the step of releasing the charges stored in the charge accumulating layers is conducted by releasing charges stored in the charge accumulating layers of the first and third nonvolatile memory elements corresponding to a word line of the same bit.

13. The method for deleting data from a NAND-type nonvolatile memory according to claim 11, wherein the charge accumulating layer is formed from a material containg germanium.

14. The method for deleting data from a NAND-type nonvolatile memory according to claim 11, wherein the charge accumulating layer is formed from a material containing a nitride including silicon and germanium.material containing germanium.

15. The method for deleting data from a NAND-type nonvolatile memory according to claim 11, wherein the semiconductor film comprises a semiconductor substrate.

16. The method for deleting data from a NAN D-type nonvolatile memory according to claim 11, wherein the semiconductor film comprises an SOI substrate.

17. A method for deleting data from a NAND-type nonvolatile memory which includes a bit line, a source line, a first NAND-type cell including first and second nonvolatile memory elements connected in series, a second NAND-type cell including third and fourth nonvolatile memory elements connected in series, a first selection transistor, and a second selection transistor, wherein each of the first, second, third, and fourth nonvolatile memory elements includes a semiconductor film, a charge accumulating layer formed over the semiconductor film with a tunnel insulating film interposed therebetween, and a control gate formed over the charge accumulating layer with an insulating film interposed therebetween;

wherein one of terminals of the first NAND-type cell is connected to the bit line through the first selection transistor;

wherein the other terminal of the first NAND-type cell is connected to the source line;

wherein one of terminals of the second NAND-type cell is connected to the bit line through the second selection transistor; and wherein the other terminal of the second NAND-type cell is connected to the source line, the method comprising the step of:

releasing charges stored in the charge accumulating layers of the first and third nonvolatile memory elements, by applying a first potential to source terminals and drain terminals of the first and third nonvolatile memory elements, a second potential to the control gates of the first and third nonvolatile memory elements, and a third potential which is different from the second potential to the control gates of the second and fourth nonvolatile memory elements.

18. The method for deleting data from a NAND-type nonvolatile memory according to claim 17, wherein the step of releasing the charges stored in the charge accumulating layers is conducted by releasing charges stored in the charge accumulating layers of the first and third nonvolatile memory elements corresponding to a word line of the same bit.

19. The method for deleting data from a NAND-type nonvolatile memory according to claim 17, wherein the charge accumulating layer is formed from a material containing germanium.

20. The method for deleting data from a NAND-type nonvolatile memory according to claim 17, wherein the charge accumulating layer is formed from a material containing a nitride including silicon and germanium.

21. The method for deleting data from a NAND-type nonvolatile memory according to claim 17, wherein the semiconductor film comprises a semiconductor substrate.

22. The method for deleting data from a NAND-type nonvolatile memory according to claim 17, wherein the semiconductor film comprises an SOI substrate.

* * * * *